（12）United States Patent
Surti et al.

(10) Patent No.: US 12,086,120 B2
(45) Date of Patent: Sep. 10, 2024

(54) COMPRESSION FOR SPARSE DATA STRUCTURES UTILIZING MODE SEARCH APPROXIMATION

(71) Applicant: Intel Corporation, Santa Clara, CA (US)

(72) Inventors: Prasoonkumar Surti, Folsom, CA (US); Abhishek R. Appu, El Dorado Hills, CA (US); Karol Szerszen, Hillsboro, OR (US); Eric Liskay, Folsom, CA (US); Karthik Vaidyanathan, San Francisco, CA (US)

(73) Assignee: INTEL CORPORATION, Santa Clara, CA (US)

( * ) Notice: Subject to any disclaimer, the term of this patent is extended or adjusted under 35 U.S.C. 154(b) by 16 days.

(21) Appl. No.: 18/066,436

(22) Filed: Dec. 15, 2022

(65) Prior Publication Data

US 2023/0252010 A1 Aug. 10, 2023

Related U.S. Application Data

(63) Continuation of application No. 16/371,342, filed on Apr. 1, 2019, now Pat. No. 11,556,511.

(51) Int. Cl.
  *G06F 16/22* (2019.01)
  *G06N 20/00* (2019.01)
  *G06T 1/20* (2006.01)

(52) U.S. Cl.
  CPC ......... *G06F 16/2237* (2019.01); *G06N 20/00* (2019.01); *G06T 1/20* (2013.01)

(58) Field of Classification Search
  CPC ...... H03M 7/30; H03M 7/607; H03M 7/3091; G06T 1/20; G06F 16/2237; G06N 20/00
  See application file for complete search history.

(56) References Cited

U.S. PATENT DOCUMENTS

| 10,394,453 | B1* | 8/2019 | Bigman | H03M 7/6094 |
| 2012/0265737 | A1* | 10/2012 | Potkonjak | H03M 7/30 |
| | | | | 707/693 |

(Continued)

FOREIGN PATENT DOCUMENTS

| CN | 111800142 A | 10/2020 |
| DE | 102020107828 A1 | 10/2020 |
| EP | 3719669 A1 | 10/2020 |

OTHER PUBLICATIONS

Communication pursuant to Article 94(3) EPC for European Patent Application No. 20 150 448.7 mailed Apr. 14, 2022, 13 pages.

(Continued)

*Primary Examiner* — Hau H Hoang
(74) *Attorney, Agent, or Firm* — JAFFERY WATSON MENDONSA & HAMILTON LLP

(57) ABSTRACT

Embodiments are generally directed to compression for compression for sparse data structures utilizing mode search approximation. An embodiment of an apparatus includes one or more processors including a graphics processor to process data; and a memory for storage of data, including compressed data. The one or more processors are to provide for compression of a data structure, including identification of a mode in the data structure, the data structure including a plurality of values and the mode being a most repeated value in a data structure, wherein identification of the mode includes application of a mode approximation operation, and encoding of an output vector to include the identified mode, a significance map to indicate locations at which the mode is present in the data structure, and remaining uncompressed data from the data structure.

20 Claims, 31 Drawing Sheets

(56) References Cited

U.S. PATENT DOCUMENTS

2012/0265738 A1* 10/2012 Beckmann ............. G16H 50/20
707/693
2018/0196839 A1 7/2018 Clapham et al.
2018/0314712 A1* 11/2018 Stefani ................ H03M 7/6076

OTHER PUBLICATIONS

Communication of Extended Search Report for European Patent Application No. 20150448.7 mailed Apr. 8, 2020, 8 pages.
Ateet Mehta, "DNA Compression Using Hash Based Data Structure", vol. 2, No. 2, Jul. 1, 2010, pp. 383-386, XP055450698.
Baeza-Yates, et al., "Fast approximate string matching in a dictionary", String Processing and Information Retrieval: A South American Symposium, 1998. Proceedings Santa Cruz De La Sierra, Boliva Sep. 9-11, 1998, Los Alamitos, CA USA, IEEE Comut. SOC, US, Sep. 9, 1998, pp. 14-22, XP010300879.
Summons to attend Oral Proceedings pursuant to Rule 115(1) EPC, issued in EP Application No. 20150448.7, mailed Jul. 10, 2024, 18 pages.

\* cited by examiner

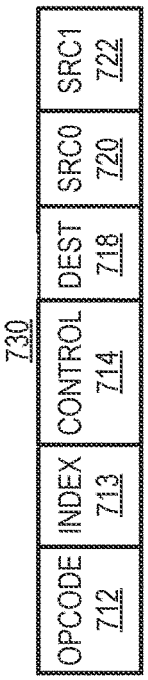
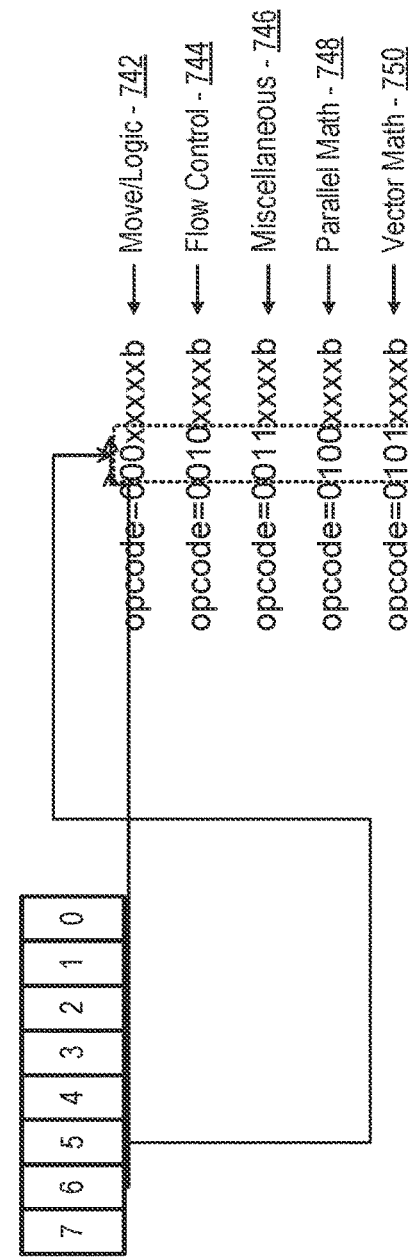
FIG. 7

COMPRESSION FOR SPARSE DATA STRUCTURES UTILIZING MODE SEARCH APPROXIMATION

CLAIM TO PRIORITY

This application is a continuation of and claims the benefit of and priority to U.S. application Ser. No. 16/371,342, entitled COMPRESSION FOR SPARSE DATA STRUCTURES UTILIZING MODE SEARCH APPROXIMATION, by Prasoonkumar Surti, et al., filed Apr. 1, 2019, the entire contents of which are incorporated herein by reference.

TECHNICAL FIELD

Embodiments described herein generally relate to the field of electronic devices and, more particularly, compression for sparse data structures utilizing mode search approximation.

BACKGROUND

In computer operations, the compression of data, in which a certain set of data is reduced in size, is commonly performed in order to minimize the amount of data to be transmitted or stored in memory. The resulting reduction can provide significant savings in required storage capacity, transmission time, and data handling.

Delta compression refers to a manner of storing or communicating data utilizing data encoding in the form of differences (or deltas) between sequential data, as opposed to complete files. The differences may be in the form of archival histories of changes in a set of data, wherein the discrete files expressing the differences are commonly referred to as deltas or similar terms. Delta compression including data encoding of the delta values, which may have many zero values if a particular data set includes many values that do not change significantly between data sets.

However, conventional delta compression does not provide satisfactory compression in all circumstances. For examples, certain sparse data structures such as the sparse matrices used in machine learning contain very large differences between neighboring numerical values. There are generally very few smooth gradients such as those that as are seen in image data. Such data structures can effectively defeat a conventional delta compression based scheme when applied in machine learning or other processing.

BRIEF DESCRIPTION OF THE DRAWINGS

Embodiments described here are illustrated by way of example, and not by way of limitation, in the figures of the accompanying drawings in which like reference numerals refer to similar elements.

FIG. 7 is a block diagram illustrating graphics processor instruction formats according to some embodiments;

DETAILED DESCRIPTION

Embodiments described herein are generally directed to compression for sparse data structures utilizing mode search approximation.

In some embodiments, an apparatus, system, or process provides a data compression (which may be referred to herein as machine learning (ML) compression) in which a most repeated value (referred to as the mode) is extracted from data, and is encoded with a significance map that indicates locations of the mode in the data. In some embodiments, the mode extraction is performed utilizing an approximation algorithm, the approximation algorithm including ternary tree processing to rapidly generate a mode approximation with parallel machine processing.

In some embodiments, machine learning compression (a first compression algorithm) may be complementary to a second compression algorithm, such as delta compression, and the machine learning compression may operate together with (in parallel with) the second compression algorithm. A compressed vector may be taken from whichever of the compression algorithms is successful in the compression operation. In some embodiments, there may be a preference for use of the machine learning algorithm if both compression algorithms are successful.

System Overview

Figure 1:
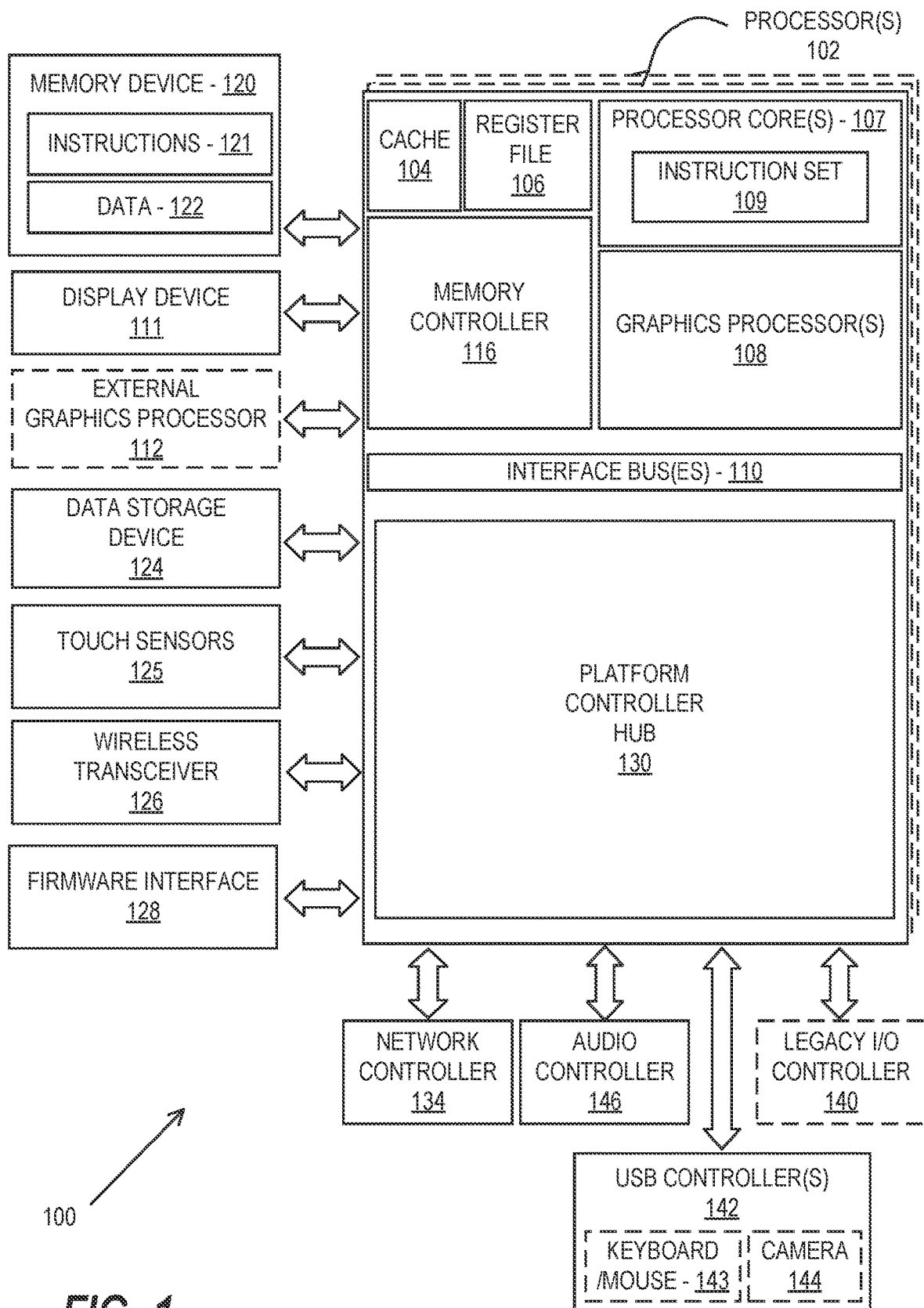
FIG. 1 is a block diagram of a processing system, according to some embodiments.

FIG. 1 is a block diagram of a processing system 100, according to an embodiment. In various embodiments the system 100 includes one or more processors 102 and one or more graphics processors 108, and may be a single processor desktop system, a multiprocessor workstation system, or a server system having a large number of processors 102 or processor cores 107. In one embodiment, the system 100 is a processing platform incorporated within a system-on-a-chip (SoC) integrated circuit for use in mobile, handheld, or embedded devices.

In one embodiment the system 100 can include, or be incorporated within a server-based gaming platform, a game console, including a game and media console, a mobile gaming console, a handheld game console, or an online game console. In some embodiments the system 100 is a mobile phone, smart phone, tablet computing device or mobile Internet device. The processing system 100 can also include, couple with, or be integrated within a wearable device, such as a smart watch wearable device, smart eyewear device, augmented reality device, or virtual reality device. In some embodiments, the processing system 100 is a television or set top box device having one or more processors 102 and a graphical interface generated by one or more graphics processors 108.

In some embodiments, the one or more processors 102 each include one or more processor cores 107 to process instructions which, when executed, perform operations for system and user software. In some embodiments, each of the one or more processor cores 107 is configured to process a specific instruction set 109. In some embodiments, instruction set 109 may facilitate Complex Instruction Set Computing (CISC), Reduced Instruction Set Computing (RISC), or computing via a Very Long Instruction Word (VLIW). Multiple processor cores 107 may each process a different instruction set 109, which may include instructions to facilitate the emulation of other instruction sets. Processor core 107 may also include other processing devices, such a Digital Signal Processor (DSP).

In some embodiments, the processor 102 includes cache memory 104. Depending on the architecture, the processor 102 can have a single internal cache or multiple levels of internal cache. In some embodiments, the cache memory is shared among various components of the processor 102. In some embodiments, the processor 102 also uses an external cache (e.g., a Level-3 (L3) cache or Last Level Cache (LLC)) (not shown), which may be shared among processor cores 107 using known cache coherency techniques. A register file 106 is additionally included in processor 102 which may include different types of registers for storing different types of data (e.g., integer registers, floating point registers, status registers, and an instruction pointer register). Some registers may be general-purpose registers, while other registers may be specific to the design of the processor 102.

In some embodiments, one or more processor(s) 102 are coupled with one or more interface bus(es) 110 to transmit communication signals such as address, data, or control signals between processor 102 and other components in the system 100. The interface bus 110, in one embodiment, can be a processor bus, such as a version of the Direct Media Interface (DMI) bus. However, processor busses are not limited to the DMI bus, and may include one or more Peripheral Component Interconnect buses (e.g., PCI, PCI Express), memory busses, or other types of interface busses. In one embodiment the processor(s) 102 include an integrated memory controller 116 and a platform controller hub 130. The memory controller 116 facilitates communication between a memory device and other components of the system 100, while the platform controller hub (PCH) 130 provides connections to I/O devices via a local I/O bus.

The memory device 120 can be a dynamic random-access memory (DRAM) device, a static random-access memory (SRAM) device, flash memory device, phase-change memory device, or some other memory device having suitable performance to serve as process memory. In one embodiment the memory device 120 can operate as system memory for the system 100, to store data 122 and instructions 121 for use when the one or more processors 102 executes an application or process. Memory controller 116 also couples with an optional external graphics processor 112, which may communicate with the one or more graphics processors 108 in processors 102 to perform graphics and media operations. In some embodiments a display device 111 can connect to the processor(s) 102. The display device 111 can be one or more of an internal display device, as in a mobile electronic device or a laptop device or an external display device attached via a display interface (e.g., DisplayPort, etc.). In one embodiment the display device 111 can be a head mounted display (HMD) such as a stereoscopic display device for use in virtual reality (VR) applications or augmented reality (AR) applications.

In some embodiments the platform controller hub 130 enables peripherals to connect to memory device 120 and processor 102 via a high-speed I/O bus. The I/O peripherals include, but are not limited to, an audio controller 146, a network controller 134, a firmware interface 128, a wireless transceiver 126, touch sensors 125, a data storage device 124 (e.g., hard disk drive, flash memory, etc.). The data storage device 124 can connect via a storage interface (e.g., SATA) or via a peripheral bus, such as a Peripheral Component Interconnect bus (e.g., PCI, PCI Express). The touch sensors 125 can include touch screen sensors, pressure sensors, or fingerprint sensors. The wireless transceiver 126 can be a Wi-Fi transceiver, a Bluetooth transceiver, or a mobile network transceiver such as a 3G, 4G, or Long-Term Evolution (LTE) transceiver. The firmware interface 128 enables communication with system firmware, and can be, for example, a unified extensible firmware interface (UEFI). The network controller 134 can enable a network connection to a wired network. In some embodiments, a high-performance network controller (not shown) couples with the interface bus 110. The audio controller 146, in one embodiment, is a multi-channel high definition audio controller. In one embodiment the system 100 includes an optional legacy I/O controller 140 for coupling legacy (e.g., Personal System 2 (PS/2)) devices to the system. The platform controller hub 130 can also connect to one or more Universal Serial Bus (USB) controllers 142 connect input devices, such as keyboard and mouse 143 combinations, a camera 144, or other USB input devices.

It will be appreciated that the system 100 shown is exemplary and not limiting, as other types of data processing systems that are differently configured may also be used. For example, an instance of the memory controller 116 and platform controller hub 130 may be integrated into a discreet external graphics processor, such as the external graphics processor 112. In one embodiment the platform controller hub 130 and/or memory controller 116 may be external to the one or more processor(s) 102. For example, the system 100 can include an external memory controller 116 and platform controller hub 130, which may be configured as a memory controller hub and peripheral controller hub within a system chipset that is in communication with the processor(s) 102.

Figure 2:
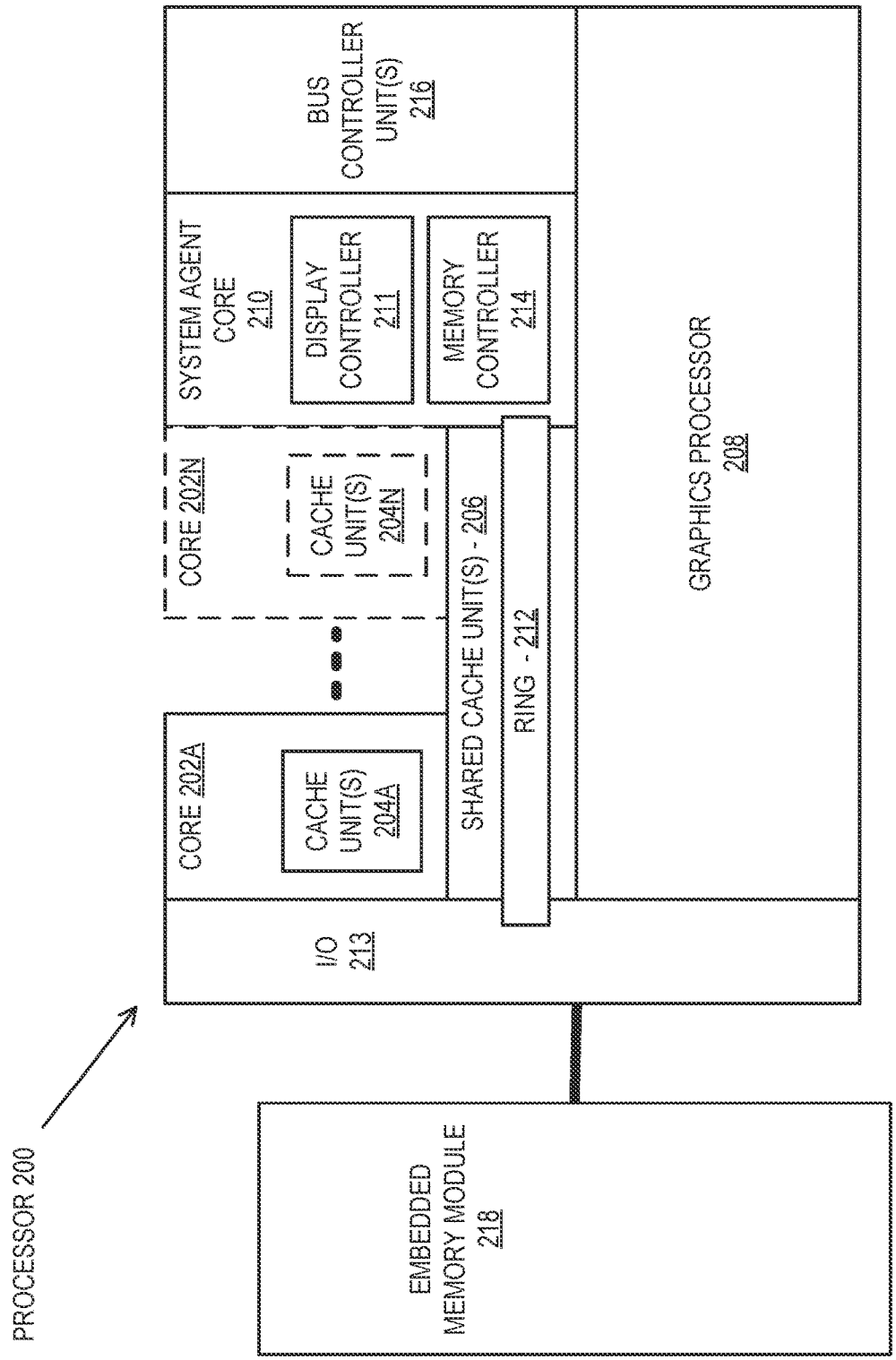
FIG. 2 is a block diagram of an embodiment of a processor having one or more processor cores, an integrated memory controller, and an integrated graphics processor.

FIG. 2 is a block diagram of an embodiment of a processor 200 having one or more processor cores 202A-202N, an integrated memory controller 214, and an integrated graphics processor 208. Those elements of FIG. 2 having the same reference numbers (or names) as the elements of any other figure herein can operate or function in any manner similar to that described elsewhere herein, but are not limited to such. Processor 200 can include additional cores up to and including additional core 202N represented by the dashed lined boxes. Each of processor cores 202A-202N includes one or more internal cache units 204A-204N. In some embodiments each processor core also has access to one or more shared cached units 206.

The internal cache units 204A-204N and shared cache units 206 represent a cache memory hierarchy within the processor 200. The cache memory hierarchy may include at least one level of instruction and data cache within each processor core and one or more levels of shared mid-level cache, such as a Level 2 (L2), Level 3 (L3), Level 4 (L4), or other levels of cache, where the highest level of cache before external memory is classified as the LLC. In some embodiments, cache coherency logic maintains coherency between the various cache units 206 and 204A-204N.

In some embodiments, processor 200 may also include a set of one or more bus controller units 216 and a system agent core 210. The one or more bus controller units 216 manage a set of peripheral buses, such as one or more PCI or PCI express busses. System agent core 210 provides management functionality for the various processor components. In some embodiments, system agent core 210 includes one or more integrated memory controllers 214 to manage access to various external memory devices (not shown).

In some embodiments, one or more of the processor cores 202A-202N include support for simultaneous multi-threading. In such embodiment, the system agent core 210 includes components for coordinating and operating cores 202A-202N during multi-threaded processing. System agent core 210 may additionally include a power control unit (PCU), which includes logic and components to regulate the power state of processor cores 202A-202N and graphics processor 208.

In some embodiments, processor 200 additionally includes graphics processor 208 to execute graphics processing operations. In some embodiments, the graphics processor 208 couples with the set of shared cache units 206, and the system agent core 210, including the one or more integrated memory controllers 214. In some embodiments, the system agent core 210 also includes a display controller 211 to drive graphics processor output to one or more coupled displays. In some embodiments, display controller 211 may also be a separate module coupled with the graphics processor via at least one interconnect, or may be integrated within the graphics processor 208.

In some embodiments, a ring based interconnect unit 212 is used to couple the internal components of the processor 200. However, an alternative interconnect unit may be used, such as a point-to-point interconnect, a switched interconnect, or other techniques, including techniques well known in the art. In some embodiments, graphics processor 208 couples with the ring interconnect 212 via an I/O link 213.

The exemplary I/O link 213 represents at least one of multiple varieties of I/O interconnects, including an on package I/O interconnect which facilitates communication between various processor components and a high-performance embedded memory module 218, such as an eDRAM module. In some embodiments, each of the processor cores 202A-202N and graphics processor 208 use embedded memory modules 218 as a shared Last Level Cache.

In some embodiments, processor cores 202A-202N are homogenous cores executing the same instruction set architecture. In another embodiment, processor cores 202A-202N are heterogeneous in terms of instruction set architecture (ISA), where one or more of processor cores 202A-202N execute a first instruction set, while at least one of the other cores executes a subset of the first instruction set or a different instruction set. In one embodiment processor cores 202A-202N are heterogeneous in terms of microarchitecture, where one or more cores having a relatively higher power consumption couple with one or more power cores having a lower power consumption. Additionally, processor 200 can be implemented on one or more chips or as an SoC integrated circuit having the illustrated components, in addition to other components.

Figure 3:
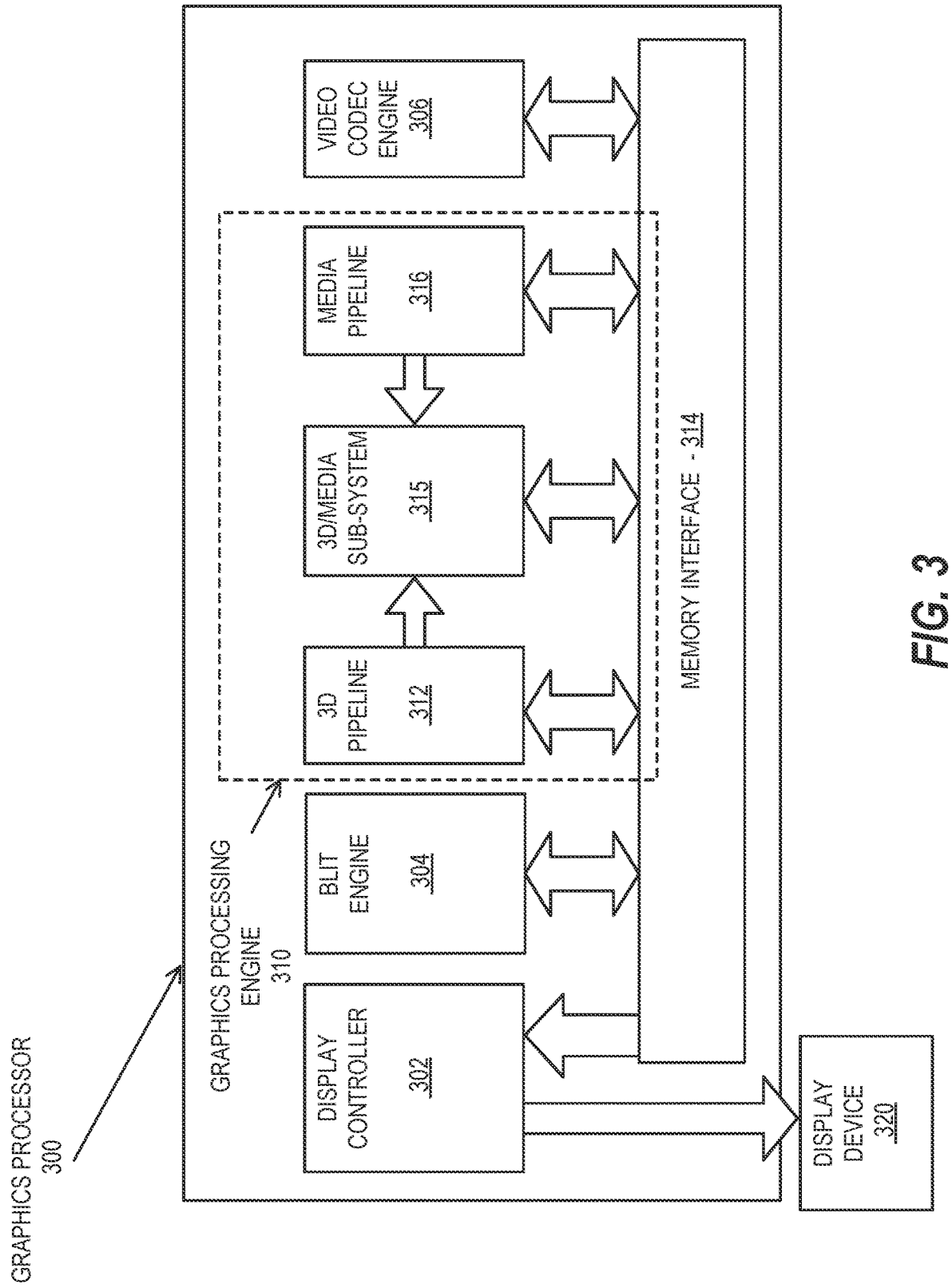
FIG. 3 is a block diagram of a graphics processor according to some embodiments.

FIG. 3 is a block diagram of a graphics processor 300, which may be a discrete graphics processing unit, or may be a graphics processor integrated with a plurality of processing cores. In some embodiments, the graphics processor communicates via a memory mapped I/O interface to registers on the graphics processor and with commands placed into the processor memory. In some embodiments, graphics processor 300 includes a memory interface 314 to access memory. Memory interface 314 can be an interface to local memory, one or more internal caches, one or more shared external caches, and/or to system memory.

In some embodiments, graphics processor 300 also includes a display controller 302 to drive display output data to a display device 320. Display controller 302 includes hardware for one or more overlay planes for the display and composition of multiple layers of video or user interface elements. The display device 320 can be an internal or external display device. In one embodiment the display device 320 is a head mounted display device, such as a virtual reality (VR) display device or an augmented reality (AR) display device. In some embodiments, graphics processor 300 includes a video codec engine 306 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, as well as the Society of Motion Picture & Television Engineers (SMPTE) 421M/VC-1, and Joint Photographic Experts Group (JPEG) formats such as JPEG, and Motion JPEG (MJPEG) formats.

In some embodiments, graphics processor 300 includes a block image transfer (BLIT) engine 304 to perform two-dimensional (2D) rasterizer operations including, for example, bit-boundary block transfers. However, in one embodiment, 2D graphics operations are performed using one or more components of graphics processing engine (GPE) 310. In some embodiments, GPE 310 is a compute engine for performing graphics operations, including three-dimensional (3D) graphics operations and media operations.

In some embodiments, GPE 310 includes a 3D pipeline 312 for performing 3D operations, such as rendering three-dimensional images and scenes using processing functions that act upon 3D primitive shapes (e.g., rectangle, triangle, etc.). The 3D pipeline 312 includes programmable and fixed function elements that perform various tasks within the element and/or spawn execution threads to a 3D/Media sub-system 315. While 3D pipeline 312 can be used to perform media operations, an embodiment of GPE 310 also includes a media pipeline 316 that is specifically used to perform media operations, such as video post-processing and image enhancement.

In some embodiments, media pipeline 316 includes fixed function or programmable logic units to perform one or more specialized media operations, such as video decode acceleration, video de-interlacing, and video encode acceleration in place of, or on behalf of video codec engine 306. In some embodiments, media pipeline 316 additionally includes a thread spawning unit to spawn threads for execution on 3D/Media sub-system 315. The spawned threads perform computations for the media operations on one or more graphics execution units included in 3D/Media sub-system 315.

In some embodiments, 3D/Media subsystem 315 includes logic for executing threads spawned by 3D pipeline 312 and media pipeline 316. In one embodiment, the pipelines send thread execution requests to 3D/Media subsystem 315, which includes thread dispatch logic for arbitrating and dispatching the various requests to available thread execution resources. The execution resources include an array of graphics execution units to process the 3D and media threads. In some embodiments, 3D/Media subsystem 315 includes one or more internal caches for thread instructions and data. In some embodiments, the subsystem also includes shared memory, including registers and addressable memory, to share data between threads and to store output data.

Graphics Processing Engine

Figure 4:
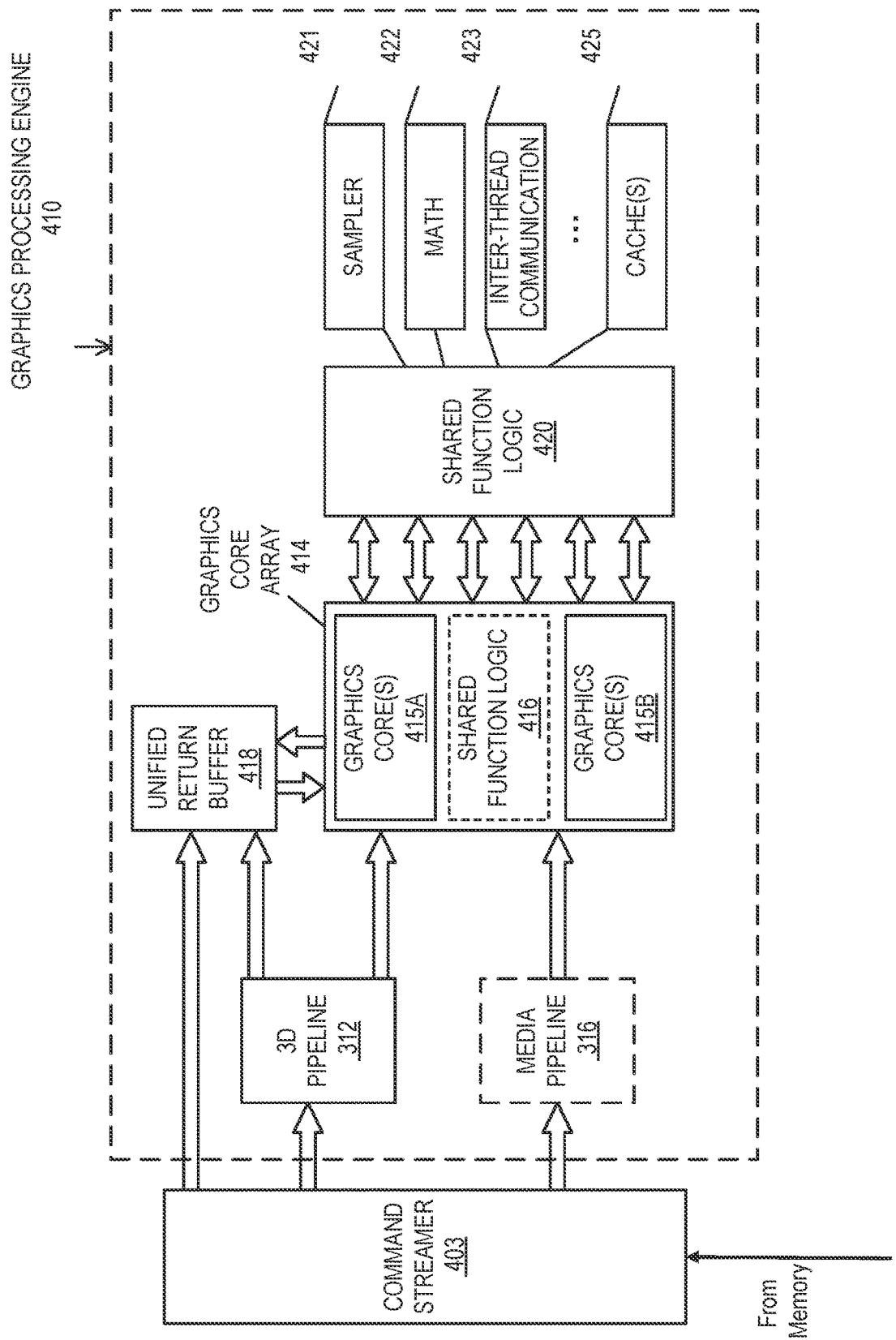
FIG. 4 is a block diagram of a graphics processing engine of a graphics processor in accordance with some embodiments.

FIG. 4 is a block diagram of a graphics processing engine 410 of a graphics processor in accordance with some embodiments. In one embodiment, the graphics processing engine (GPE) 410 is a version of the GPE 310 shown in FIG. 3. Elements of FIG. 4 having the same reference numbers (or names) as the elements of any other figure herein can operate or function in any manner similar to that described elsewhere herein, but are not limited to such. For example, the 3D pipeline 312 and media pipeline 316 of FIG. 3 are illustrated. The media pipeline 316 is optional in some embodiments of the GPE 410 and may not be explicitly included within the GPE 410. For example and in at least one embodiment, a separate media and/or image processor is coupled to the GPE 410.

In some embodiments, GPE 410 couples with or includes a command streamer 403, which provides a command stream to the 3D pipeline 312 and/or media pipelines 316. In some embodiments, command streamer 403 is coupled with memory, which can be system memory, or one or more of internal cache memory and shared cache memory. In some embodiments, command streamer 403 receives commands from the memory and sends the commands to 3D pipeline 312 and/or media pipeline 316. The commands are directives fetched from a ring buffer, which stores commands for the 3D pipeline 312 and media pipeline 316. In one embodiment, the ring buffer can additionally include batch command buffers storing batches of multiple commands. The commands for the 3D pipeline 312 can also include references to data stored in memory, such as but not limited to vertex and geometry data for the 3D pipeline 312 and/or image data and memory objects for the media pipeline 316. The 3D pipeline 312 and media pipeline 316 process the commands and data by performing operations via logic within the respective pipelines or by dispatching one or more execution threads to a graphics core array 414. In one embodiment the graphics core array 414 include one or more blocks of graphics cores (e.g., graphics core(s) 415A, graphics core(s) 415B), each block including one or more graphics cores. Each graphics core includes a set of graphics execution resources that includes general-purpose and graphics specific execution logic to perform graphics and compute operations, as well as fixed function texture processing and/or machine learning and artificial intelligence acceleration logic.

In various embodiments the 3D pipeline 312 includes fixed function and programmable logic to process one or more shader programs, such as vertex shaders, geometry shaders, pixel shaders, fragment shaders, compute shaders, or other shader programs, by processing the instructions and dispatching execution threads to the graphics core array 414. The graphics core array 414 provides a unified block of execution resources for use in processing these shader programs. Multi-purpose execution logic (e.g., execution units) within the graphics core(s) 415A-414B of the graphic core array 414 includes support for various 3D API shader languages and can execute multiple simultaneous execution threads associated with multiple shaders.

In some embodiments the graphics core array 414 also includes execution logic to perform media functions, such as video and/or image processing. In one embodiment, the execution units additionally include general-purpose logic that is programmable to perform parallel general-purpose computational operations, in addition to graphics processing operations. The general-purpose logic can perform processing operations in parallel or in conjunction with general-purpose logic within the processor core(s) 107 of FIG. 1 or core 202A-202N as in FIG. 2.

Output data generated by threads executing on the graphics core array 414 can output data to memory in a unified return buffer (URB) 418. The URB 418 can store data for multiple threads. In some embodiments the URB 418 may be used to send data between different threads executing on the graphics core array 414. In some embodiments the URB 418 may additionally be used for synchronization between threads on the graphics core array and fixed function logic within the shared function logic 420.

In some embodiments, graphics core array 414 is scalable, such that the array includes a variable number of graphics cores, each having a variable number of execution units based on the target power and performance level of GPE 410. In one embodiment the execution resources are dynamically scalable, such that execution resources may be enabled or disabled as needed.

The graphics core array 414 couples with shared function logic 420 that includes multiple resources that are shared between the graphics cores in the graphics core array. The shared functions within the shared function logic 420 are hardware logic units that provide specialized supplemental functionality to the graphics core array 414. In various embodiments, shared function logic 420 includes but is not limited to sampler 421, math 422, and inter-thread communication (ITC) 423 logic. Additionally, some embodiments implement one or more cache(s) 425 within the shared function logic 420.

A shared function is implemented where the demand for a given specialized function is insufficient for inclusion within the graphics core array 414. Instead a single instantiation of that specialized function is implemented as a stand-alone entity in the shared function logic 420 and shared among the execution resources within the graphics core array 414. The precise set of functions that are shared between the graphics core array 414 and included within the graphics core array 414 varies across embodiments. In some embodiments, specific shared functions within the shared function logic 420 that are used extensively by the graphics core array 414 may be included within shared function logic 416 within the graphics core array 414. In various embodiments, the shared function logic 416 within the graphics core array 414 can include some or all logic within the shared function logic 420. In one embodiment, all logic elements within the shared function logic 420 may be duplicated within the shared function logic 416 of the graphics core array 414. In one embodiment the shared function logic 420 is excluded in favor of the shared function logic 416 within the graphics core array 414.

Figure 5:
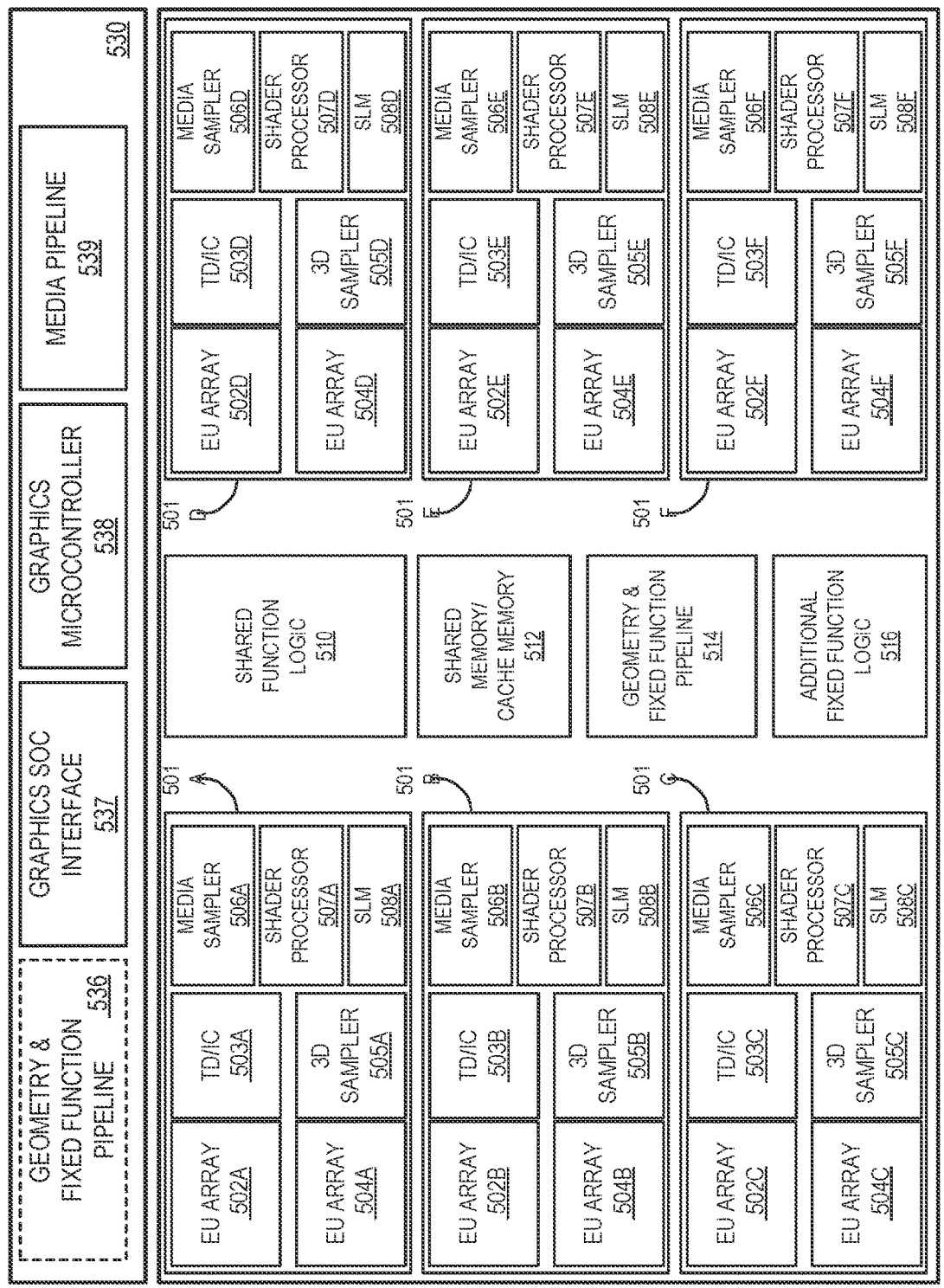
FIG. 5 is a block diagram of hardware logic of a graphics processor core, according to some embodiments.

FIG. 5 is a block diagram of hardware logic of a graphics processor core 500, according to some embodiments described herein. Elements of FIG. 5 having the same reference numbers (or names) as the elements of any other figure herein can operate or function in any manner similar to that described elsewhere herein, but are not limited to such. The illustrated graphics processor core 500, in some embodiments, is included within the graphics core array 414 of FIG. 4. The graphics processor core 500, sometimes referred to as a core slice, can be one or multiple graphics cores within a modular graphics processor. The graphics processor core 500 is exemplary of one graphics core slice, and a graphics processor as described herein may include multiple graphics core slices based on target power and performance envelopes. Each graphics core 500 can include a fixed function block 530 coupled with multiple sub-cores 501A-501F, also referred to as sub-slices, that include modular blocks of general-purpose and fixed function logic.

In some embodiments the fixed function block 530 includes a geometry/fixed function pipeline 536 that can be shared by all sub-cores in the graphics processor 500, for example, in lower performance and/or lower power graphics processor implementations. In various embodiments, the geometry/fixed function pipeline 536 includes a 3D fixed function pipeline (e.g., 3D pipeline 312 as in FIG. 3 and FIG. 4) a video front-end unit, a thread spawner and thread dispatcher, and a unified return buffer manager, which manages unified return buffers, such as the unified return buffer 418 of FIG. 4.

In one embodiment the fixed function block 530 also includes a graphics SoC interface 537, a graphics microcontroller 538, and a media pipeline 539. The graphics SoC interface 537 provides an interface between the graphics core 500 and other processor cores within a system on a chip integrated circuit. The graphics microcontroller 538 is a programmable sub-processor that is configurable to manage various functions of the graphics processor 500, including thread dispatch, scheduling, and pre-emption. The media pipeline 539 (e.g., media pipeline 316 of FIG. 3 and FIG. 4) includes logic to facilitate the decoding, encoding, pre-processing, and/or post-processing of multimedia data, including image and video data. The media pipeline 539 implement media operations via requests to compute or sampling logic within the sub-cores 501-501F.

In one embodiment the SoC interface 537 enables the graphics core 500 to communicate with general-purpose application processor cores (e.g., CPUs) and/or other components within an SoC, including memory hierarchy elements such as a shared last level cache memory, the system RAM, and/or embedded on-chip or on-package DRAM. The SoC interface 537 can also enable communication with fixed function devices within the SoC, such as camera imaging pipelines, and enables the use of and/or implements global memory atomics that may be shared between the graphics core 500 and CPUs within the SoC. The SoC interface 537 can also implement power management controls for the graphics core 500 and enable an interface between a clock domain of the graphic core 500 and other clock domains within the SoC. In one embodiment the SoC interface 537 enables receipt of command buffers from a command streamer and global thread dispatcher that are configured to provide commands and instructions to each of one or more graphics cores within a graphics processor. The commands and instructions can be dispatched to the media pipeline 539, when media operations are to be performed, or a geometry and fixed function pipeline (e.g., geometry and fixed function pipeline 536, geometry and fixed function pipeline 514) when graphics processing operations are to be performed.

The graphics microcontroller 538 can be configured to perform various scheduling and management tasks for the graphics core 500. In one embodiment the graphics microcontroller 538 can perform graphics and/or compute workload scheduling on the various graphics parallel engines within execution unit (EU) arrays 502A-502F, 504A-504F within the sub-cores 501A-501F. In this scheduling model, host software executing on a CPU core of an SoC including the graphics core 500 can submit workloads one of multiple graphic processor doorbells, which invokes a scheduling operation on the appropriate graphics engine. Scheduling operations include determining which workload to run next, submitting a workload to a command streamer, pre-empting existing workloads running on an engine, monitoring progress of a workload, and notifying host software when a workload is complete. In one embodiment the graphics microcontroller 538 can also facilitate low-power or idle states for the graphics core 500, providing the graphics core 500 with the ability to save and restore registers within the graphics core 500 across low-power state transitions independently from the operating system and/or graphics driver software on the system.

The graphics core 500 may have greater than or fewer than the illustrated sub-cores 501A-501F, up to N modular sub-cores. For each set of N sub-cores, the graphics core 500 can also include shared function logic 510, shared and/or cache memory 512, a geometry/fixed function pipeline 514, as well as additional fixed function logic 516 to accelerate various graphics and compute processing operations. The shared function logic 510 can include logic units associated with the shared function logic 420 of FIG. 4 (e.g., sampler, math, and/or inter-thread communication logic) that can be shared by each N sub-cores within the graphics core 500. The shared and/or cache memory 512 can be a last-level cache for the set of N sub-cores 501A-501F within the graphics core 500, and can also serve as shared memory that is accessible by multiple sub-cores. The geometry/fixed function pipeline 514 can be included instead of the geometry/fixed function pipeline 536 within the fixed function block 530 and can include the same or similar logic units.

In one embodiment the graphics core 500 includes additional fixed function logic 516 that can include various fixed function acceleration logic for use by the graphics core 500. In one embodiment the additional fixed function logic 516 includes an additional geometry pipeline for use in position only shading. In position-only shading, two geometry pipelines exist, the full geometry pipeline within the geometry/fixed function pipeline 516, 536, and a cull pipeline, which is an additional geometry pipeline which may be included within the additional fixed function logic 516. In one embodiment the cull pipeline is a trimmed down version of the full geometry pipeline. The full pipeline and the cull pipeline can execute different instances of the same application, each instance having a separate context. Position only shading can hide long cull runs of discarded triangles, enabling shading to be completed earlier in some instances. For example and in one embodiment the cull pipeline logic within the additional fixed function logic 516 can execute position shaders in parallel with the main application and generally generates critical results faster than the full pipeline, as the cull pipeline fetches and shades only the position attribute of the vertices, without performing rasterization and rendering of the pixels to the frame buffer. The cull pipeline can use the generated critical results to compute visibility information for all the triangles without regard to whether those triangles are culled. The full pipeline (which in this instance may be referred to as a replay pipeline) can consume the visibility information to skip the culled triangles to shade only the visible triangles that are finally passed to the rasterization phase.

In one embodiment the additional fixed function logic 516 can also include machine-learning acceleration logic, such as fixed function matrix multiplication logic, for implementations including optimizations for machine learning training or inferencing.

Within each graphics sub-core 501A-501F includes a set of execution resources that may be used to perform graphics, media, and compute operations in response to requests by graphics pipeline, media pipeline, or shader programs. The graphics sub-cores 501A-501F include multiple EU arrays 502A-502F, 504A-504F, thread dispatch and inter-thread communication (TD/IC) logic 503A-503F, a 3D (e.g., texture) sampler 505A-505F, a media sampler 506A-506F, a shader processor 507A-507F, and shared local memory (SLM) 508A-508F. The EU arrays 502A-502F, 504A-504F each include multiple execution units, which are general-purpose graphics processing units capable of performing floating-point and integer/fixed-point logic operations in service of a graphics, media, or compute shader operation, including graphics, media, or compute shader programs. The TD/IC logic 503A-503F performs local thread dispatch and thread control operations for the execution units within a sub-core and facilitate communication between threads executing on the execution units of the sub-core. The 3D sampler 505A-505F can read texture or other 3D graphics related data into memory. The 3D sampler can read texture data differently based on a configured sample state and the texture format associated with a given texture. The media sampler 506A-506F can perform similar read operations based on the type and format associated with media data. In one embodiment, each graphics sub-core 501A-501F can alternately include a unified 3D and media sampler. Threads executing on the execution units within each of the sub-cores 501A-501F can make use of shared local memory 508A-508F within each sub-core, to enable threads executing within a thread group to execute using a common pool of on-chip memory.

Execution Units

Figure 6A:
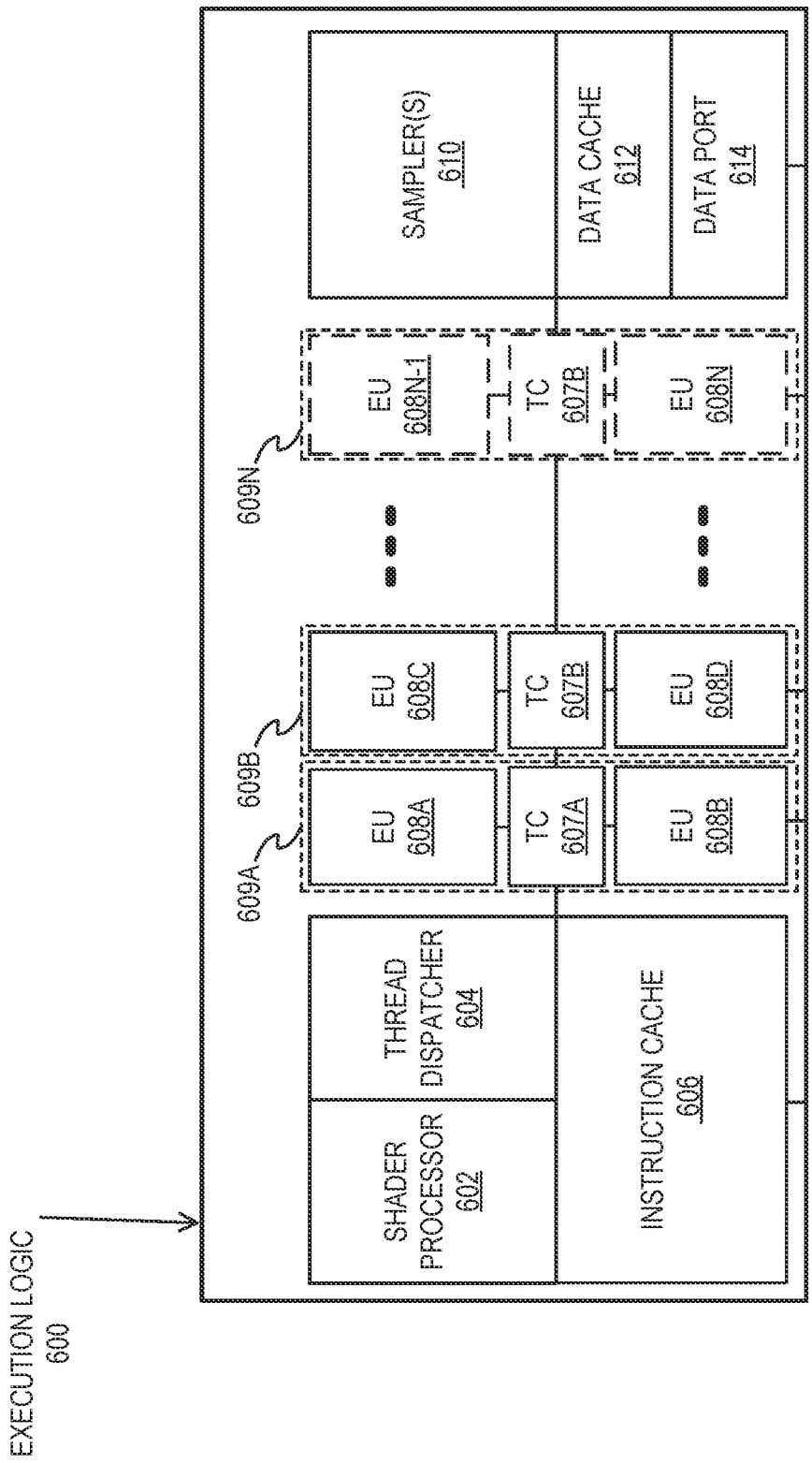
FIGS. 6A-6B illustrate thread execution logic including an array of processing elements employed in a graphics processor core according to some embodiments.
Figure 6B:
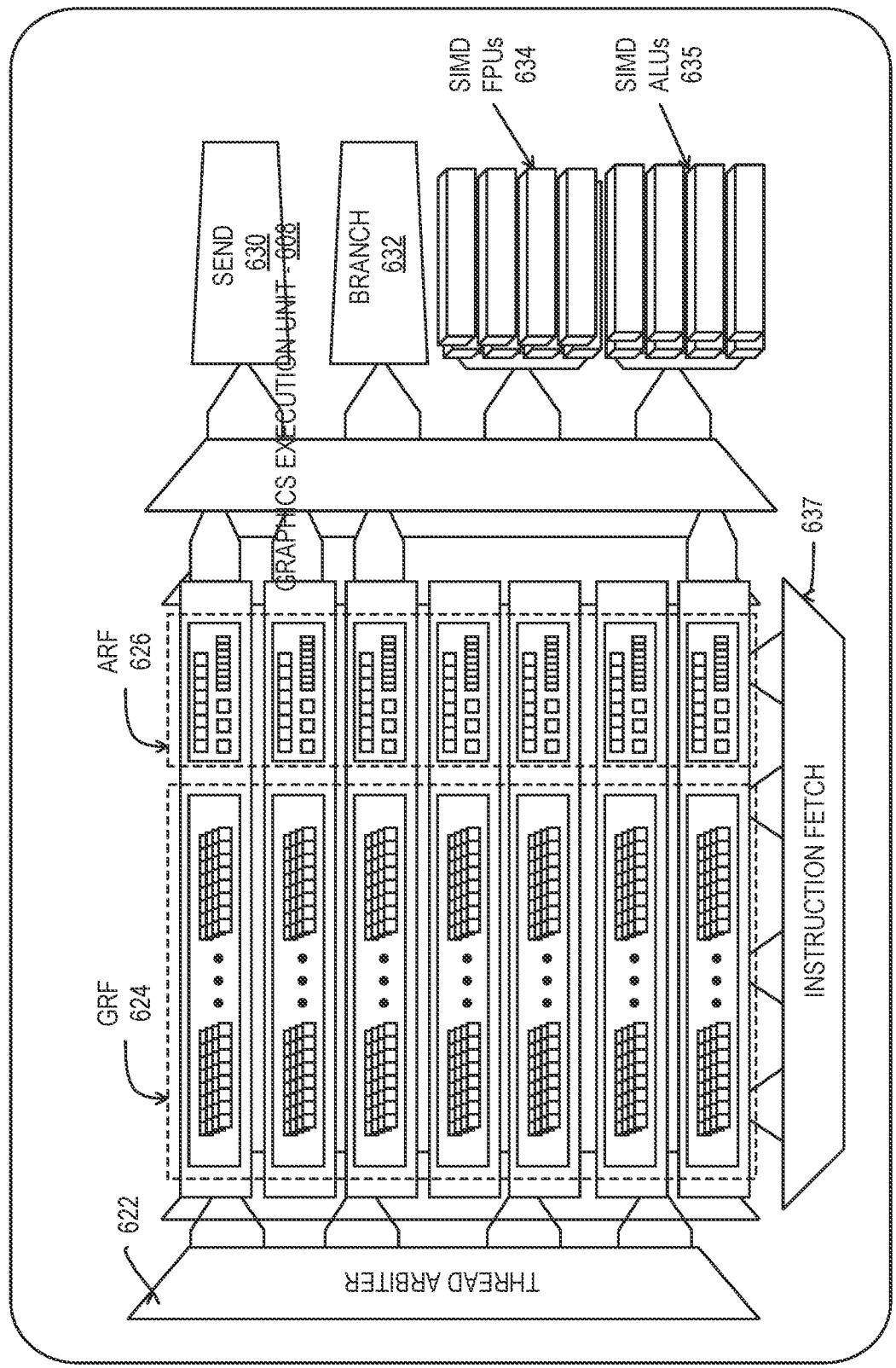

FIGS. 6A-6B illustrate thread execution logic 600 including an array of processing elements employed in a graphics processor core according to embodiments described herein. Elements of FIGS. 6A-6B having the same reference numbers (or names) as the elements of any other figure herein can operate or function in any manner similar to that described elsewhere herein, but are not limited to such. FIG. 6A illustrates an overview of thread execution logic 600, which can include a variant of the hardware logic illustrated with each sub-core 501A-501F of FIG. 5. FIG. 6B illustrates exemplary internal details of an execution unit.

As illustrated in FIG. 6A, in some embodiments thread execution logic 600 includes a shader processor 602, a thread dispatcher 604, instruction cache 606, a scalable execution unit array including a plurality of execution units 608A-608N, a sampler 610, a data cache 612, and a data port 614. In one embodiment the scalable execution unit array can dynamically scale by enabling or disabling one or more execution units (e.g., any of execution unit 608A, 608B, 608C, 608D, through 608N-1 and 608N) based on the computational requirements of a workload. In one embodiment the included components are interconnected via an interconnect fabric that links to each of the components. In some embodiments, thread execution logic 600 includes one or more connections to memory, such as system memory or cache memory, through one or more of instruction cache 606, data port 614, sampler 610, and execution units 608A-608N. In some embodiments, each execution unit (e.g. 608A) is a stand-alone programmable general-purpose computational unit that is capable of executing multiple simultaneous hardware threads while processing multiple data elements in parallel for each thread. In various embodiments, the array of execution units 608A-608N is scalable to include any number individual execution units.

In some embodiments, the execution units 608A-608N are primarily used to execute shader programs. A shader processor 602 can process the various shader programs and dispatch execution threads associated with the shader programs via a thread dispatcher 604. In one embodiment the thread dispatcher includes logic to arbitrate thread initiation requests from the graphics and media pipelines and instantiate the requested threads on one or more execution unit in the execution units 608A-608N. For example, a geometry pipeline can dispatch vertex, tessellation, or geometry shaders to the thread execution logic for processing. In some embodiments, thread dispatcher 604 can also process runtime thread spawning requests from the executing shader programs.

In some embodiments, the execution units 608A-608N support an instruction set that includes native support for many standard 3D graphics shader instructions, such that shader programs from graphics libraries (e.g., Direct 3D and OpenGL) are executed with a minimal translation. The execution units support vertex and geometry processing (e.g., vertex programs, geometry programs, vertex shaders), pixel processing (e.g., pixel shaders, fragment shaders) and general-purpose processing (e.g., compute and media shaders). Each of the execution units 608A-608N is capable of multi-issue single instruction multiple data (SIMD) execution and multi-threaded operation enables an efficient execution environment in the face of higher latency memory accesses. Each hardware thread within each execution unit has a dedicated high-bandwidth register file and associated independent thread-state. Execution is multi-issue per clock to pipelines capable of integer, single and double precision floating point operations, SIMD branch capability, logical operations, transcendental operations, and other miscellaneous operations. While waiting for data from memory or one of the shared functions, dependency logic within the execution units 608A-608N causes a waiting thread to sleep until the requested data has been returned. While the waiting thread is sleeping, hardware resources may be devoted to processing other threads. For example, during a delay associated with a vertex shader operation, an execution unit can perform operations for a pixel shader, fragment shader, or another type of shader program, including a different vertex shader.

Each execution unit in execution units 608A-608N operates on arrays of data elements. The number of data elements is the "execution size," or the number of channels for the instruction. An execution channel is a logical unit of execution for data element access, masking, and flow control within instructions. The number of channels may be independent of the number of physical Arithmetic Logic Units (ALUs) or Floating-Point Units (FPUs) for a particular graphics processor. In some embodiments, execution units 608A-608N support integer and floating-point data types.

The execution unit instruction set includes SIMD instructions. The various data elements can be stored as a packed data type in a register and the execution unit will process the various elements based on the data size of the elements. For example, when operating on a 256-bit wide vector, the 256 bits of the vector are stored in a register and the execution unit operates on the vector as four separate 64-bit packed data elements (Quad-Word (QW) size data elements), eight separate 32-bit packed data elements (Double Word (DW) size data elements), sixteen separate 16-bit packed data elements (Word (W) size data elements), or thirty-two separate 8-bit data elements (byte (B) size data elements). However, different vector widths and register sizes are possible.

In one embodiment one or more execution units can be combined into a fused execution unit 609A-609N having thread control logic (607A-607N) that is common to the fused EUs. Multiple EUs can be fused into an EU group. Each EU in the fused EU group can be configured to execute a separate SIMD hardware thread. The number of EUs in a fused EU group can vary according to embodiments. Additionally, various SIMD widths can be performed per-EU, including but not limited to SIMD8, SIMD16, and SIMD32. Each fused graphics execution unit 609A-609N includes at least two execution units. For example, fused execution unit 609A includes a first EU 608A, second EU 608B, and thread control logic 607A that is common to the first EU 608A and the second EU 608B. The thread control logic 607A controls threads executed on the fused graphics execution unit 609A, allowing each EU within the fused execution units 609A-609N to execute using a common instruction pointer register.

One or more internal instruction caches (e.g., 606) are included in the thread execution logic 600 to cache thread instructions for the execution units. In some embodiments, one or more data caches (e.g., 612) are included to cache thread data during thread execution. In some embodiments, a sampler 610 is included to provide texture sampling for 3D operations and media sampling for media operations. In some embodiments, sampler 610 includes specialized texture or media sampling functionality to process texture or media data during the sampling process before providing the sampled data to an execution unit.

During execution, the graphics and media pipelines send thread initiation requests to thread execution logic 600 via thread spawning and dispatch logic. Once a group of geometric objects has been processed and rasterized into pixel data, pixel processor logic (e.g., pixel shader logic, fragment shader logic, etc.) within the shader processor 602 is invoked to further compute output information and cause results to be written to output surfaces (e.g., color buffers, depth buffers, stencil buffers, etc.). In some embodiments, a pixel shader or fragment shader calculates the values of the various vertex attributes that are to be interpolated across the rasterized object. In some embodiments, pixel processor logic within the shader processor 602 then executes an application programming interface (API)-supplied pixel or fragment shader program. To execute the shader program, the shader processor 602 dispatches threads to an execution unit (e.g., 608A) via thread dispatcher 604. In some embodiments, shader processor 602 uses texture sampling logic in the sampler 610 to access texture data in texture maps stored in memory. Arithmetic operations on the texture data and the input geometry data compute pixel color data for each geometric fragment, or discards one or more pixels from further processing.

In some embodiments, the data port 614 provides a memory access mechanism for the thread execution logic 600 to output processed data to memory for further processing on a graphics processor output pipeline. In some embodiments, the data port 614 includes or couples to one or more cache memories (e.g., data cache 612) to cache data for memory access via the data port.

As illustrated in FIG. 6B, a graphics execution unit 608 can include an instruction fetch unit 637, a general register file array (GRF) 624, an architectural register file array (ARF) 626, a thread arbiter 622, a send unit 630, a branch unit 632, a set of SIMD floating point units (FPUs) 634, and in one embodiment a set of dedicated integer SIMD ALUs 635. The GRF 624 and ARF 626 includes the set of general register files and architecture register files associated with each simultaneous hardware thread that may be active in the graphics execution unit 608. In one embodiment, per thread architectural state is maintained in the ARF 626, while data used during thread execution is stored in the GRF 624. The execution state of each thread, including the instruction pointers for each thread, can be held in thread-specific registers in the ARF 626.

In one embodiment the graphics execution unit 608 has an architecture that is a combination of Simultaneous Multi-Threading (SMT) and fine-grained Interleaved Multi-Threading (IMT). The architecture has a modular configuration that can be fine-tuned at design time based on a target number of simultaneous threads and number of registers per execution unit, where execution unit resources are divided across logic used to execute multiple simultaneous threads.

In one embodiment, the graphics execution unit 608 can co-issue multiple instructions, which may each be different instructions. The thread arbiter 622 of the graphics execution unit thread 608 can dispatch the instructions to one of the send unit 630, branch unit 642, or SIMD FPU(s) 634 for execution. Each execution thread can access 128 general-purpose registers within the GRF 624, where each register can store 32 bytes, accessible as a SIMD 8-element vector of 32-bit data elements. In one embodiment, each execution unit thread has access to 4 Kbytes within the GRF 624, although embodiments are not so limited, and greater or fewer register resources may be provided in other embodiments. In one embodiment up to seven threads can execute simultaneously, although the number of threads per execution unit can also vary according to embodiments. In an embodiment in which seven threads may access 4 Kbytes, the GRF 624 can store a total of 28 Kbytes. Flexible addressing modes can permit registers to be addressed together to build effectively wider registers or to represent strided rectangular block data structures.

In one embodiment, memory operations, sampler operations, and other longer-latency system communications are dispatched via "send" instructions that are executed by the message passing send unit 630. In one embodiment, branch instructions are dispatched to a dedicated branch unit 632 to facilitate SIMD divergence and eventual convergence.

In one embodiment the graphics execution unit 608 includes one or more SIMD floating point units (FPU(s)) 634 to perform floating-point operations. In one embodiment, the FPU(s) 634 also support integer computation. In one embodiment the FPU(s) 634 can SIMD execute up to M number of 32-bit floating-point (or integer) operations, or SIMD execute up to 2M 16-bit integer or 16-bit floating-point operations. In one embodiment, at least one of the FPU(s) provides extended math capability to support high-throughput transcendental math functions and double precision 64-bit floating-point. In some embodiments, a set of 8-bit integer SIMD ALUs 635 are also present, and may be specifically optimized to perform operations associated with machine learning computations.

In one embodiment, arrays of multiple instances of the graphics execution unit 608 can be instantiated in a graphics sub-core grouping (e.g., a sub-slice). For scalability, product architects can choose the exact number of execution units per sub-core grouping. In one embodiment the execution unit 608 can execute instructions across a plurality of execution channels. In a further embodiment, each thread executed on the graphics execution unit 608 is executed on a different channel.

FIG. 7 is a block diagram illustrating graphics processor instruction formats 700 according to some embodiments. In one or more embodiment, the graphics processor execution units support an instruction set having instructions in multiple formats. The solid lined boxes illustrate the components that are generally included in an execution unit instruction, while the dashed lines include components that are optional or that are only included in a sub-set of the instructions. In some embodiments, instruction format 700 described and illustrated are macro-instructions, in that they are instructions supplied to the execution unit, as opposed to micro-operations resulting from instruction decode once the instruction is processed.

In some embodiments, the graphics processor execution units natively support instructions in a 128-bit instruction format 710. A 64-bit compacted instruction format 730 is available for some instructions based on the selected instruction, instruction options, and number of operands. The native 128-bit instruction format 710 provides access to all instruction options, while some options and operations are restricted in the 64-bit format 730. The native instructions available in the 64-bit format 730 vary by embodiment. In some embodiments, the instruction is compacted in part using a set of index values in an index field 713. The execution unit hardware references a set of compaction tables based on the index values and uses the compaction table outputs to reconstruct a native instruction in the 128-bit instruction format 710.

For each format, instruction opcode 712 defines the operation that the execution unit is to perform. The execution units execute each instruction in parallel across the multiple data elements of each operand. For example, in response to an add instruction the execution unit performs a simultaneous add operation across each color channel representing a texture element or picture element. By default, the execution unit performs each instruction across all data channels of the operands. In some embodiments, instruction control field 714 enables control over certain execution options, such as channels selection (e.g., predication) and data channel order (e.g., swizzle). For instructions in the 128-bit instruction format 710 an exec-size field 716 limits the number of data channels that will be executed in parallel. In some embodiments, exec-size field 716 is not available for use in the 64-bit compact instruction format 730.

Some execution unit instructions have up to three operands including two source operands, src0 720, src1 722, and one destination 718. In some embodiments, the execution units support dual destination instructions, where one of the destinations is implied. Data manipulation instructions can have a third source operand (e.g., SRC2 724), where the instruction opcode 712 determines the number of source operands. An instruction's last source operand can be an immediate (e.g., hard-coded) value passed with the instruction.

In some embodiments, the 128-bit instruction format 710 includes an access/address mode field 726 specifying, for example, whether direct register addressing mode or indirect register addressing mode is used. When direct register addressing mode is used, the register address of one or more operands is directly provided by bits in the instruction.

In some embodiments, the 128-bit instruction format 710 includes an access/address mode field 726, which specifies an address mode and/or an access mode for the instruction. In one embodiment the access mode is used to define a data access alignment for the instruction. Some embodiments support access modes including a 16-byte aligned access mode and a 1-byte aligned access mode, where the byte alignment of the access mode determines the access alignment of the instruction operands. For example, when in a first mode, the instruction may use byte-aligned addressing for source and destination operands and when in a second mode, the instruction may use 16-byte-aligned addressing for all source and destination operands.

In one embodiment, the address mode portion of the access/address mode field 726 determines whether the instruction is to use direct or indirect addressing. When direct register addressing mode is used bits in the instruction directly provide the register address of one or more operands. When indirect register addressing mode is used, the register address of one or more operands may be computed based on an address register value and an address immediate field in the instruction.

In some embodiments instructions are grouped based on opcode 712 bit-fields to simplify Opcode decode 740. For an 8-bit opcode, bits 4, 5, and 6 allow the execution unit to determine the type of opcode. The precise opcode grouping shown is merely an example. In some embodiments, a move and logic opcode group 742 includes data movement and logic instructions (e.g., move (mov), compare (cmp)). In some embodiments, move and logic group 742 shares the five most significant bits (MSB), where move (mov) instructions are in the form of 0000xxxxb and logic instructions are in the form of 0001xxxxb. A flow control instruction group 744 (e.g., call, jump (jmp)) includes instructions in the form of 0010xxxxb (e.g., 0x20). A miscellaneous instruction group 746 includes a mix of instructions, including synchronization instructions (e.g., wait, send) in the form of 0011xxxxb (e.g., 0x30). A parallel math instruction group 748 includes component-wise arithmetic instructions (e.g., add, multiply (mul)) in the form of 0100xxxxb (e.g., 0x40). The parallel math group 748 performs the arithmetic operations in parallel across data channels. The vector math group 750 includes arithmetic instructions (e.g., dp4) in the form of 0101xxxxb (e.g., 0x50). The vector math group performs arithmetic such as dot product calculations on vector operands.

Graphics Pipeline

Figure 8:
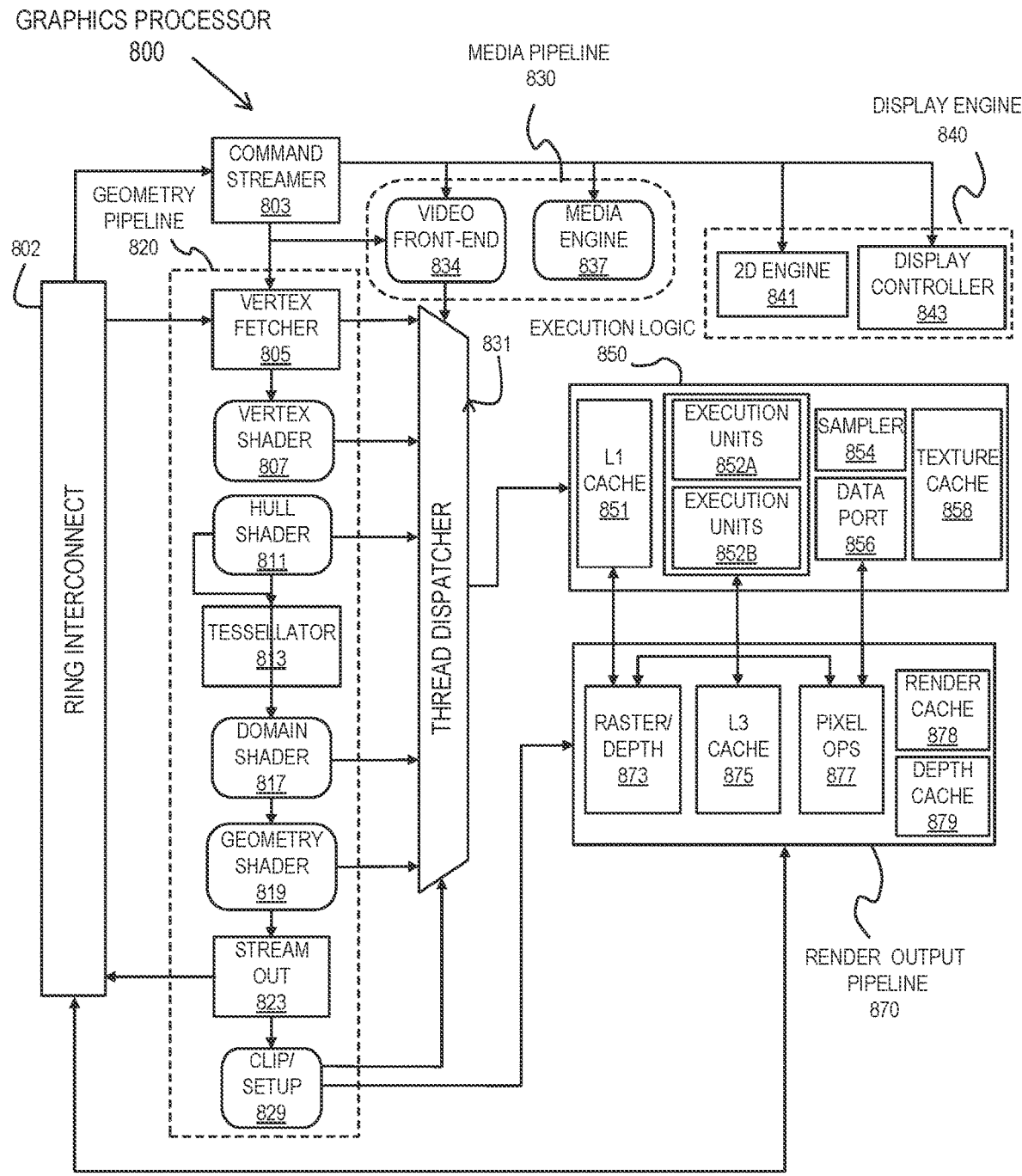
FIG. 8 is a block diagram of another embodiment of a graphics processor.

FIG. 8 is a block diagram of another embodiment of a graphics processor 800. Elements of FIG. 8 having the same reference numbers (or names) as the elements of any other figure herein can operate or function in any manner similar to that described elsewhere herein, but are not limited to such.

In some embodiments, graphics processor 800 includes a geometry pipeline 820, a media pipeline 830, a display engine 840, thread execution logic 850, and a render output pipeline 870. In some embodiments, graphics processor 800 is a graphics processor within a multi-core processing system that includes one or more general-purpose processing cores. The graphics processor is controlled by register writes to one or more control registers (not shown) or via commands issued to graphics processor 800 via a ring interconnect 802. In some embodiments, ring interconnect 802 couples graphics processor 800 to other processing components, such as other graphics processors or general-purpose processors. Commands from ring interconnect 802 are interpreted by a command streamer 803, which supplies instructions to individual components of the geometry pipeline 820 or the media pipeline 830.

In some embodiments, command streamer 803 directs the operation of a vertex fetcher 805 that reads vertex data from memory and executes vertex-processing commands provided by command streamer 803. In some embodiments, vertex fetcher 805 provides vertex data to a vertex shader 807, which performs coordinate space transformation and lighting operations to each vertex. In some embodiments, vertex fetcher 805 and vertex shader 807 execute vertex-processing instructions by dispatching execution threads to execution units 852A-852B via a thread dispatcher 831.

In some embodiments, execution units 852A-852B are an array of vector processors having an instruction set for performing graphics and media operations. In some embodiments, execution units 852A-852B have an attached L1 cache 851 that is specific for each array or shared between the arrays. The cache can be configured as a data cache, an instruction cache, or a single cache that is partitioned to contain data and instructions in different partitions.

In some embodiments, geometry pipeline 820 includes tessellation components to perform hardware-accelerated tessellation of 3D objects. In some embodiments, a programmable hull shader 811 configures the tessellation operations. A programmable domain shader 817 provides back-end evaluation of tessellation output. A tessellator 813 operates at the direction of hull shader 811 and contains special purpose logic to generate a set of detailed geometric objects based on a coarse geometric model that is provided as input to geometry pipeline 820. In some embodiments, if tessellation is not used, tessellation components (e.g., hull shader 811, tessellator 813, and domain shader 817) can be bypassed.

In some embodiments, complete geometric objects can be processed by a geometry shader 819 via one or more threads dispatched to execution units 852A-852B, or can proceed directly to the clipper 829. In some embodiments, the geometry shader operates on entire geometric objects, rather than vertices or patches of vertices as in previous stages of the graphics pipeline. If the tessellation is disabled, the geometry shader 819 receives input from the vertex shader 807. In some embodiments, geometry shader 819 is programmable by a geometry shader program to perform geometry tessellation if the tessellation units are disabled.

Before rasterization, a clipper 829 processes vertex data. The clipper 829 may be a fixed function clipper or a programmable clipper having clipping and geometry shader functions. In some embodiments, a rasterizer and depth test component 873 in the render output pipeline 870 dispatches pixel shaders to convert the geometric objects into per pixel representations. In some embodiments, pixel shader logic is included in thread execution logic 850. In some embodiments, an application can bypass the rasterizer and depth test component 873 and access un-rasterized vertex data via a stream out unit 823.

The graphics processor 800 has an interconnect bus, interconnect fabric, or some other interconnect mechanism that allows data and message passing amongst the major components of the processor. In some embodiments, execution units 852A-852B and associated logic units (e.g., L1 cache 851, sampler 854, texture cache 858, etc.) interconnect via a data port 856 to perform memory access and communicate with render output pipeline components of the processor. In some embodiments, sampler 854, caches 851, 858 and execution units 852A-852B each have separate memory access paths. In one embodiment the texture cache 858 can also be configured as a sampler cache.

In some embodiments, render output pipeline 870 contains a rasterizer and depth test component 873 that converts vertex-based objects into an associated pixel-based representation. In some embodiments, the rasterizer logic includes a windower/masker unit to perform fixed function triangle and line rasterization. An associated render cache 878 and depth cache 879 are also available in some embodiments. A pixel operations component 877 performs pixel-based operations on the data, though in some instances, pixel operations associated with 2D operations (e.g. bit block image transfers with blending) are performed by the 2D engine 841, or substituted at display time by the display controller 843 using overlay display planes. In some embodiments, a shared L3 cache 875 is available to all graphics components, allowing the sharing of data without the use of main system memory.

In some embodiments, graphics processor media pipeline 830 includes a media engine 837 and a video front-end 834. In some embodiments, video front-end 834 receives pipeline commands from the command streamer 803. In some embodiments, media pipeline 830 includes a separate command streamer. In some embodiments, video front-end 834 processes media commands before sending the command to the media engine 837. In some embodiments, media engine 837 includes thread spawning functionality to spawn threads for dispatch to thread execution logic 850 via thread dispatcher 831.

In some embodiments, graphics processor 800 includes a display engine 840. In some embodiments, display engine 840 is external to processor 800 and couples with the graphics processor via the ring interconnect 802, or some other interconnect bus or fabric. In some embodiments, display engine 840 includes a 2D engine 841 and a display controller 843. In some embodiments, display engine 840 contains special purpose logic capable of operating independently of the 3D pipeline. In some embodiments, display controller 843 couples with a display device (not shown), which may be a system integrated display device, as in a laptop computer, or an external display device attached via a display device connector.

In some embodiments, the geometry pipeline 820 and media pipeline 830 are configurable to perform operations based on multiple graphics and media programming interfaces and are not specific to any one application programming interface (API). In some embodiments, driver software for the graphics processor translates API calls that are specific to a particular graphics or media library into commands that can be processed by the graphics processor. In some embodiments, support is provided for the Open Graphics Library (OpenGL), Open Computing Language (OpenCL), and/or Vulkan graphics and compute API, all from the Khronos Group. In some embodiments, support may also be provided for the Direct3D library from the Microsoft Corporation. In some embodiments, a combination of these libraries may be supported. Support may also be provided for the Open Source Computer Vision Library (OpenCV). A future API with a compatible 3D pipeline would also be supported if a mapping can be made from the pipeline of the future API to the pipeline of the graphics processor.

Graphics Pipeline Programming

Figure 9:
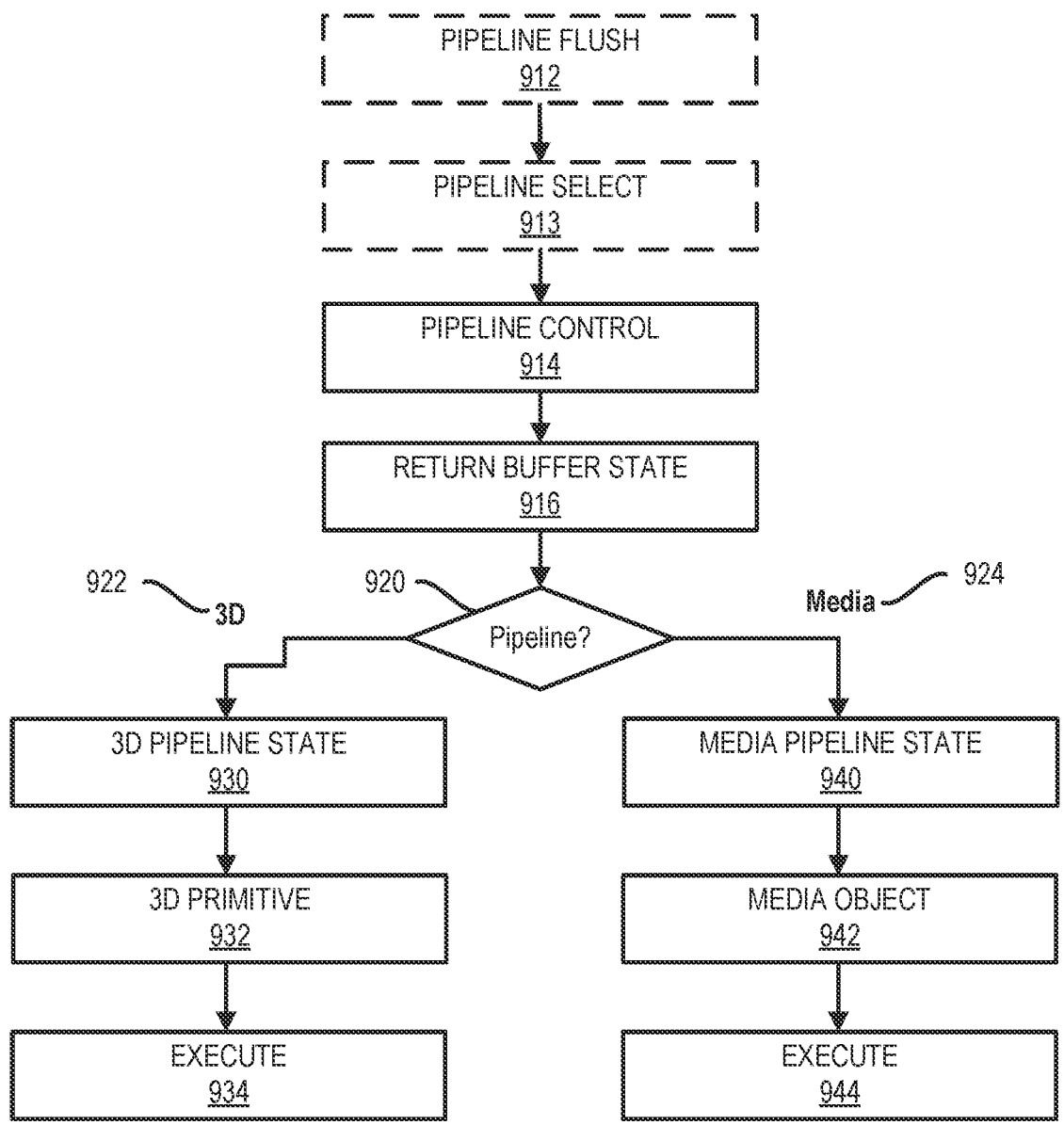
FIG. 9A is a block diagram illustrating a graphics processor command format according to some embodiments.
FIG. 9B is a block diagram illustrating a graphics processor command sequence according to an embodiment.

FIG. 9A is a block diagram illustrating a graphics processor command format 900 according to some embodiments. FIG. 9B is a block diagram illustrating a graphics processor command sequence 910 according to an embodiment. The solid lined boxes in FIG. 9A illustrate the components that are generally included in a graphics command while the dashed lines include components that are optional or that are only included in a sub-set of the graphics commands. The exemplary graphics processor command format 900 of FIG. 9A includes data fields to identify a client 902, a command operation code (opcode) 904, and data 906 for the command. A sub-opcode 905 and a command size 908 are also included in some commands.

In some embodiments, client 902 specifies the client unit of the graphics device that processes the command data. In some embodiments, a graphics processor command parser examines the client field of each command to condition the further processing of the command and route the command data to the appropriate client unit. In some embodiments, the graphics processor client units include a memory interface unit, a render unit, a 2D unit, a 3D unit, and a media unit. Each client unit has a corresponding processing pipeline that processes the commands. Once the command is received by the client unit, the client unit reads the opcode 904 and, if present, sub-opcode 905 to determine the operation to perform. The client unit performs the command using information in data field 906. For some commands an explicit command size 908 is expected to specify the size of the command. In some embodiments, the command parser automatically determines the size of at least some of the commands based on the command opcode. In some embodiments commands are aligned via multiples of a double word.

The flow diagram in FIG. 9B illustrates an exemplary graphics processor command sequence 910. In some embodiments, software or firmware of a data processing system that features an embodiment of a graphics processor uses a version of the command sequence shown to set up, execute, and terminate a set of graphics operations. A sample command sequence is shown and described for purposes of example only as embodiments are not limited to these specific commands or to this command sequence. Moreover, the commands may be issued as batch of commands in a command sequence, such that the graphics processor will process the sequence of commands in at least partially concurrence.

In some embodiments, the graphics processor command sequence 910 may begin with a pipeline flush command 912 to cause any active graphics pipeline to complete the currently pending commands for the pipeline. In some embodiments, the 3D pipeline 922 and the media pipeline 924 do not operate concurrently. The pipeline flush is performed to cause the active graphics pipeline to complete any pending commands. In response to a pipeline flush, the command parser for the graphics processor will pause command processing until the active drawing engines complete pending operations and the relevant read caches are invalidated. Optionally, any data in the render cache that is marked 'dirty' can be flushed to memory. In some embodiments, pipeline flush command 912 can be used for pipeline synchronization or before placing the graphics processor into a low power state.

In some embodiments, a pipeline select command 913 is used when a command sequence requires the graphics processor to explicitly switch between pipelines. In some embodiments, a pipeline select command 913 is required only once within an execution context before issuing pipeline commands unless the context is to issue commands for both pipelines. In some embodiments, a pipeline flush command 912 is required immediately before a pipeline switch via the pipeline select command 913.

In some embodiments, a pipeline control command 914 configures a graphics pipeline for operation and is used to program the 3D pipeline 922 and the media pipeline 924. In some embodiments, pipeline control command 914 configures the pipeline state for the active pipeline. In one embodiment, the pipeline control command 914 is used for pipeline synchronization and to clear data from one or more cache memories within the active pipeline before processing a batch of commands.

In some embodiments, return buffer state commands 916 are used to configure a set of return buffers for the respective pipelines to write data. Some pipeline operations require the allocation, selection, or configuration of one or more return buffers into which the operations write intermediate data during processing. In some embodiments, the graphics processor also uses one or more return buffers to store output data and to perform cross thread communication. In some embodiments, the return buffer state 916 includes selecting the size and number of return buffers to use for a set of pipeline operations.

The remaining commands in the command sequence differ based on the active pipeline for operations. Based on a pipeline determination 920, the command sequence is tailored to the 3D pipeline 922 beginning with the 3D pipeline state 930 or the media pipeline 924 beginning at the media pipeline state 940.

The commands to configure the 3D pipeline state 930 include 3D state setting commands for vertex buffer state, vertex element state, constant color state, depth buffer state, and other state variables that are to be configured before 3D primitive commands are processed. The values of these commands are determined at least in part based on the particular 3D API in use. In some embodiments, 3D pipeline state 930 commands are also able to selectively disable or bypass certain pipeline elements if those elements will not be used.

In some embodiments, 3D primitive 932 command is used to submit 3D primitives to be processed by the 3D pipeline. Commands and associated parameters that are passed to the graphics processor via the 3D primitive 932 command are forwarded to the vertex fetch function in the graphics pipeline. The vertex fetch function uses the 3D primitive 932 command data to generate vertex data structures. The vertex data structures are stored in one or more return buffers. In some embodiments, 3D primitive 932 command is used to perform vertex operations on 3D primitives via vertex shaders. To process vertex shaders, 3D pipeline 922 dispatches shader execution threads to graphics processor execution units.

In some embodiments, 3D pipeline 922 is triggered via an execute 934 command or event. In some embodiments, a register write triggers command execution. In some embodiments execution is triggered via a 'go' or 'kick' command in the command sequence. In one embodiment, command execution is triggered using a pipeline synchronization command to flush the command sequence through the graphics pipeline. The 3D pipeline will perform geometry processing for the 3D primitives. Once operations are complete, the resulting geometric objects are rasterized and the pixel engine colors the resulting pixels. Additional commands to control pixel shading and pixel back end operations may also be included for those operations.

In some embodiments, the graphics processor command sequence 910 follows the media pipeline 924 path when performing media operations. In general, the specific use and manner of programming for the media pipeline 924 depends on the media or compute operations to be performed. Specific media decode operations may be offloaded to the media pipeline during media decode. In some embodiments, the media pipeline can also be bypassed and media decode can be performed in whole or in part using resources provided by one or more general-purpose processing cores. In one embodiment, the media pipeline also includes elements for general-purpose graphics processor unit (GPGPU) operations, where the graphics processor is used to perform SIMD vector operations using computational shader programs that are not explicitly related to the rendering of graphics primitives.

In some embodiments, media pipeline 924 is configured in a similar manner as the 3D pipeline 922. A set of commands to configure the media pipeline state 940 are dispatched or placed into a command queue before the media object commands 942. In some embodiments, commands for the media pipeline state 940 include data to configure the media pipeline elements that will be used to process the media objects. This includes data to configure the video decode and video encode logic within the media pipeline, such as encode or decode format. In some embodiments, commands for the media pipeline state 940 also support the use of one or more pointers to "indirect" state elements that contain a batch of state settings.

In some embodiments, media object commands 942 supply pointers to media objects for processing by the media pipeline. The media objects include memory buffers containing video data to be processed. In some embodiments, all media pipeline states must be valid before issuing a media object command 942. Once the pipeline state is configured and media object commands 942 are queued, the media pipeline 924 is triggered via an execute command 944 or an equivalent execute event (e.g., register write). Output from media pipeline 924 may then be post processed by operations provided by the 3D pipeline 922 or the media pipeline 924. In some embodiments, GPGPU operations are configured and executed in a similar manner as media operations.

Graphics Software Architecture

Figure 10:
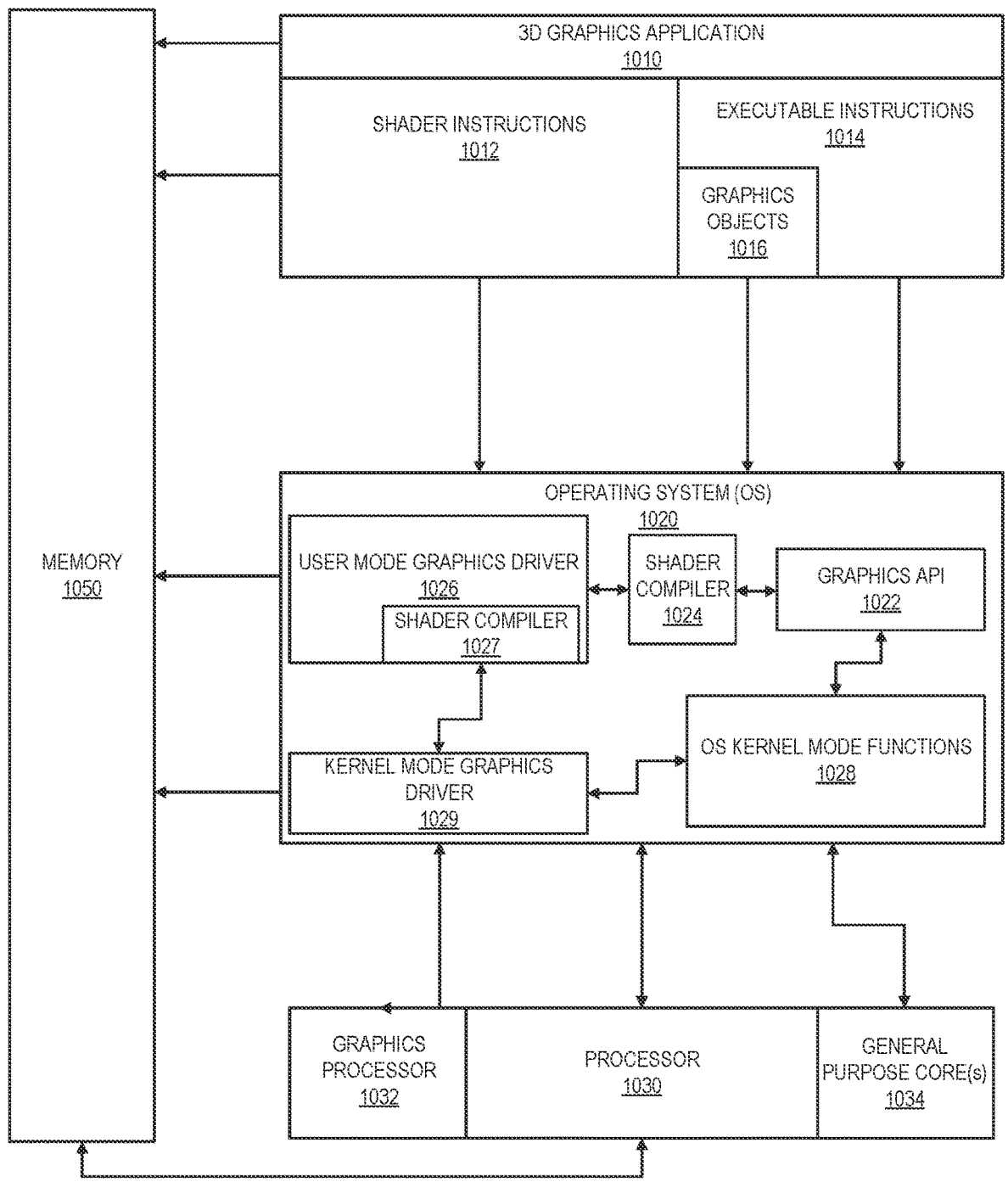
FIG. 10 illustrates exemplary graphics software architecture for a data processing system according to some embodiments.

FIG. 10 illustrates exemplary graphics software architecture for a data processing system 1000 according to some embodiments. In some embodiments, software architecture includes a 3D graphics application 1010, an operating system 1020, and at least one processor 1030. In some embodiments, processor 1030 includes a graphics processor 1032 and one or more general-purpose processor core(s) 1034. The graphics application 1010 and operating system 1020 each execute in the system memory 1050 of the data processing system.

In some embodiments, 3D graphics application 1010 contains one or more shader programs including shader instructions 1012. The shader language instructions may be in a high-level shader language, such as the High Level Shader Language (HLSL) or the OpenGL Shader Language (GLSL). The application also includes executable instructions 1014 in a machine language suitable for execution by the general-purpose processor core 1034. The application also includes graphics objects 1016 defined by vertex data.

In some embodiments, operating system 1020 is a Microsoft® Windows® operating system from the Microsoft Corporation, a proprietary UNIX-like operating system, or an open source UNIX-like operating system using a variant of the Linux kernel. The operating system 1020 can support a graphics API 1022 such as the Direct3D API, the OpenGL API, or the Vulkan API. When the Direct3D API is in use, the operating system 1020 uses a front-end shader compiler 1024 to compile any shader instructions 1012 in HLSL into a lower-level shader language. The compilation may be a just-in-time (JIT) compilation or the application can perform shader pre-compilation. In some embodiments, high-level shaders are compiled into low-level shaders during the compilation of the 3D graphics application 1010. In some embodiments, the shader instructions 1012 are provided in an intermediate form, such as a version of the Standard Portable Intermediate Representation (SPIR) used by the Vulkan API.

In some embodiments, user mode graphics driver 1026 contains a back-end shader compiler 1027 to convert the shader instructions 1012 into a hardware specific representation. When the OpenGL API is in use, shader instructions 1012 in the GLSL high-level language are passed to a user mode graphics driver 1026 for compilation. In some embodiments, user mode graphics driver 1026 uses operating system kernel mode functions 1028 to communicate with a kernel mode graphics driver 1029. In some embodiments, kernel mode graphics driver 1029 communicates with graphics processor 1032 to dispatch commands and instructions.

IP Core Implementations

One or more aspects of at least one embodiment may be implemented by representative code stored on a machine-readable medium which represents and/or defines logic within an integrated circuit such as a processor. For example, the machine-readable medium may include instructions which represent various logic within the processor. When read by a machine, the instructions may cause the machine to fabricate the logic to perform the techniques described herein. Such representations, known as "IP cores," are reusable units of logic for an integrated circuit that may be stored on a tangible, machine-readable medium as a hardware model that describes the structure of the integrated circuit. The hardware model may be supplied to various customers or manufacturing facilities, which load the hardware model on fabrication machines that manufacture the integrated circuit. The integrated circuit may be fabricated such that the circuit performs operations described in association with any of the embodiments described herein.

Figure 11A:
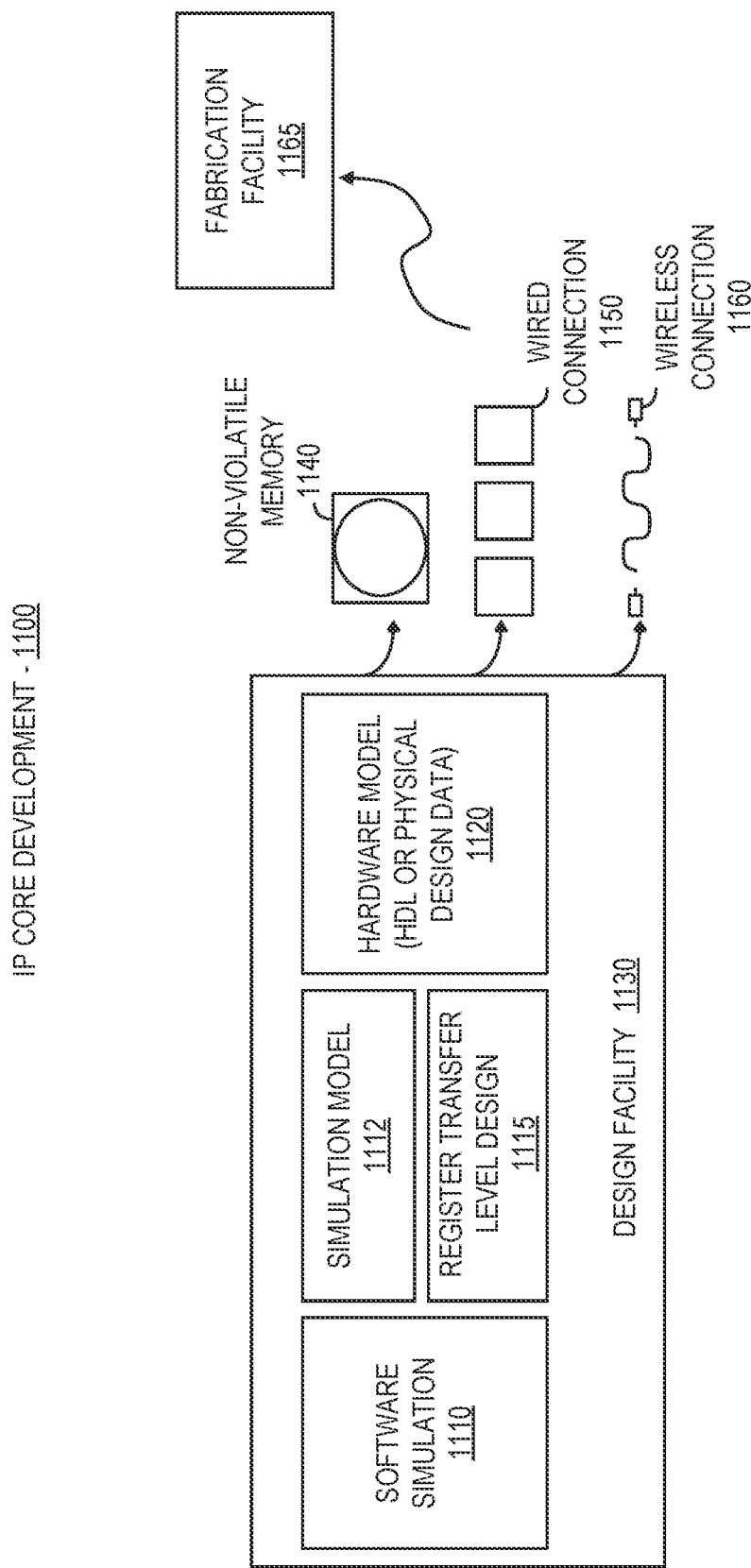
FIG. 11A is a block diagram illustrating an IP core development system that may be used to manufacture an integrated circuit to perform operations according to an embodiment.

FIG. 11A is a block diagram illustrating an IP core development system 1100 that may be used to manufacture an integrated circuit to perform operations according to an embodiment. The IP core development system 1100 may be used to generate modular, re-usable designs that can be incorporated into a larger design or used to construct an entire integrated circuit (e.g., an SOC integrated circuit). A design facility 1130 can generate a software simulation 1110 of an IP core design in a high-level programming language (e.g., C/C++). The software simulation 1110 can be used to design, test, and verify the behavior of the IP core using a simulation model 1112. The simulation model 1112 may include functional, behavioral, and/or timing simulations. A register transfer level (RTL) design 1115 can then be created or synthesized from the simulation model 1112. The RTL design 1115 is an abstraction of the behavior of the integrated circuit that models the flow of digital signals between hardware registers, including the associated logic performed using the modeled digital signals. In addition to an RTL design 1115, lower-level designs at the logic level or transistor level may also be created, designed, or synthesized. Thus, the particular details of the initial design and simulation may vary.

The RTL design 1115 or equivalent may be further synthesized by the design facility into a hardware model 1120, which may be in a hardware description language (HDL), or some other representation of physical design data. The HDL may be further simulated or tested to verify the IP core design. The IP core design can be stored for delivery to a 3rd party fabrication facility 1165 using non-volatile memory 1140 (e.g., hard disk, flash memory, or any non-volatile storage medium). Alternatively, the IP core design may be transmitted (e.g., via the Internet) over a wired connection 1150 or wireless connection 1160. The fabrication facility 1165 may then fabricate an integrated circuit that is based at least in part on the IP core design. The fabricated integrated circuit can be configured to perform operations in accordance with at least one embodiment described herein.

Figure 11B:
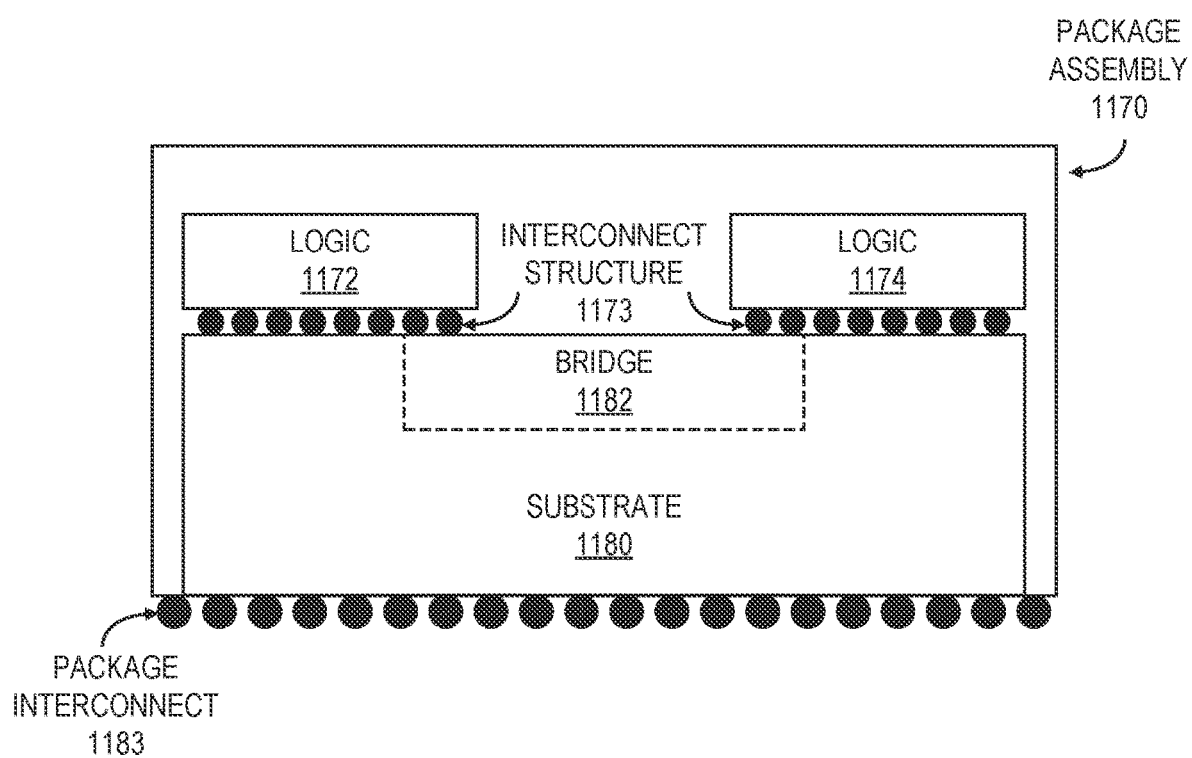
FIG. 11B illustrates a cross-section side view of an integrated circuit package assembly according to some embodiments.

FIG. 11B illustrates a cross-section side view of an integrated circuit package assembly 1170, according to some embodiments described herein. The integrated circuit package assembly 1170 illustrates an implementation of one or more processor or accelerator devices as described herein. The package assembly 1170 includes multiple units of hardware logic 1172, 1174 connected to a substrate 1180. The logic 1172, 1174 may be implemented at least partly in configurable logic or fixed-functionality logic hardware, and can include one or more portions of any of the processor core(s), graphics processor(s), or other accelerator devices described herein. Each unit of logic 1172, 1174 can be implemented within a semiconductor die and coupled with the substrate 1180 via an interconnect structure 1173. The interconnect structure 1173 may be configured to route electrical signals between the logic 1172, 1174 and the substrate 1180, and can include interconnects such as, but not limited to bumps or pillars. In some embodiments, the interconnect structure 1173 may be configured to route electrical signals such as, for example, input/output (I/O) signals and/or power or ground signals associated with the operation of the logic 1172, 1174. In some embodiments, the substrate 1180 is an epoxy-based laminate substrate. The package assembly 1170 may include other suitable types of substrates in other embodiments. The package assembly 1170 can be connected to other electrical devices via a package interconnect 1183. The package interconnect 1183 may be coupled to a surface of the substrate 1180 to route electrical signals to other electrical devices, such as a motherboard, other chipset, or multi-chip module.

In some embodiments, the units of logic 1172, 1174 are electrically coupled with a bridge 1182 that is configured to route electrical signals between the logic 1172, 1174. The bridge 1182 may be a dense interconnect structure that provides a route for electrical signals. The bridge 1182 may include a bridge substrate composed of glass or a suitable semiconductor material. Electrical routing features can be formed on the bridge substrate to provide a chip-to-chip connection between the logic 1172, 1174.

Although two units of logic 1172, 1174 and a bridge 1182 are illustrated, embodiments described herein may include more or fewer logic units on one or more dies. The one or more dies may be connected by zero or more bridges, as the bridge 1182 may be excluded when the logic is included on a single die. Alternatively, multiple dies or units of logic can be connected by one or more bridges. Additionally, multiple logic units, dies, and bridges can be connected together in other possible configurations, including three-dimensional configurations.

Exemplary System on a Chip Integrated Circuit

Figure 12:
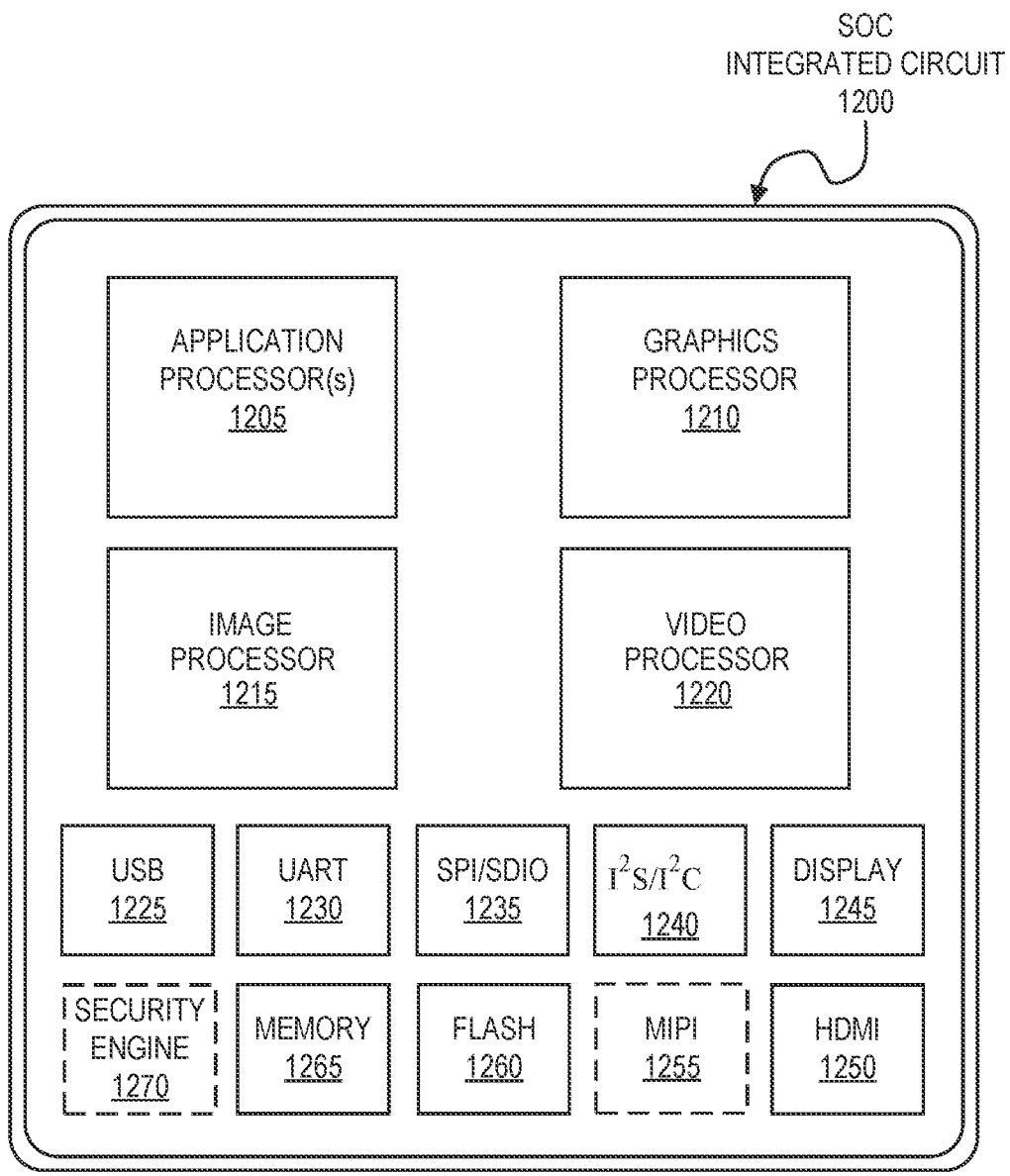
FIG. 12 is a block diagram illustrating an exemplary system on a chip integrated circuit that may be fabricated using one or more IP cores, according to an embodiment.

FIGS. 12-14 illustrate exemplary integrated circuits and associated graphics processors that may be fabricated using one or more IP cores, according to various embodiments described herein. In addition to what is illustrated, other logic and circuits may be included, including additional graphics processors/cores, peripheral interface controllers, or general-purpose processor cores.

FIG. 12 is a block diagram illustrating an exemplary system on a chip integrated circuit 1200 that may be fabricated using one or more IP cores, according to an embodiment. Exemplary integrated circuit 1200 includes one or more application processor(s) 1205 (e.g., CPUs), at least one graphics processor 1210, and may additionally include an image processor 1215 and/or a video processor 1220, any of which may be a modular IP core from the same or multiple different design facilities. Integrated circuit 1200 includes peripheral or bus logic including a USB controller 1225, UART controller 1230, an SPI/SDIO controller 1235, and an I2S/I2C controller 1240. Additionally, the integrated circuit can include a display device 1245 coupled to one or more of a high-definition multimedia interface (HDMI) controller 1250 and a mobile industry processor interface (MIPI) display interface 1255. Storage may be provided by a flash memory subsystem 1260 including flash memory and a flash memory controller. Memory interface may be provided via a memory controller 1265 for access to SDRAM or SRAM memory devices. Some integrated circuits additionally include an embedded security engine 1270.

Figure 13A:
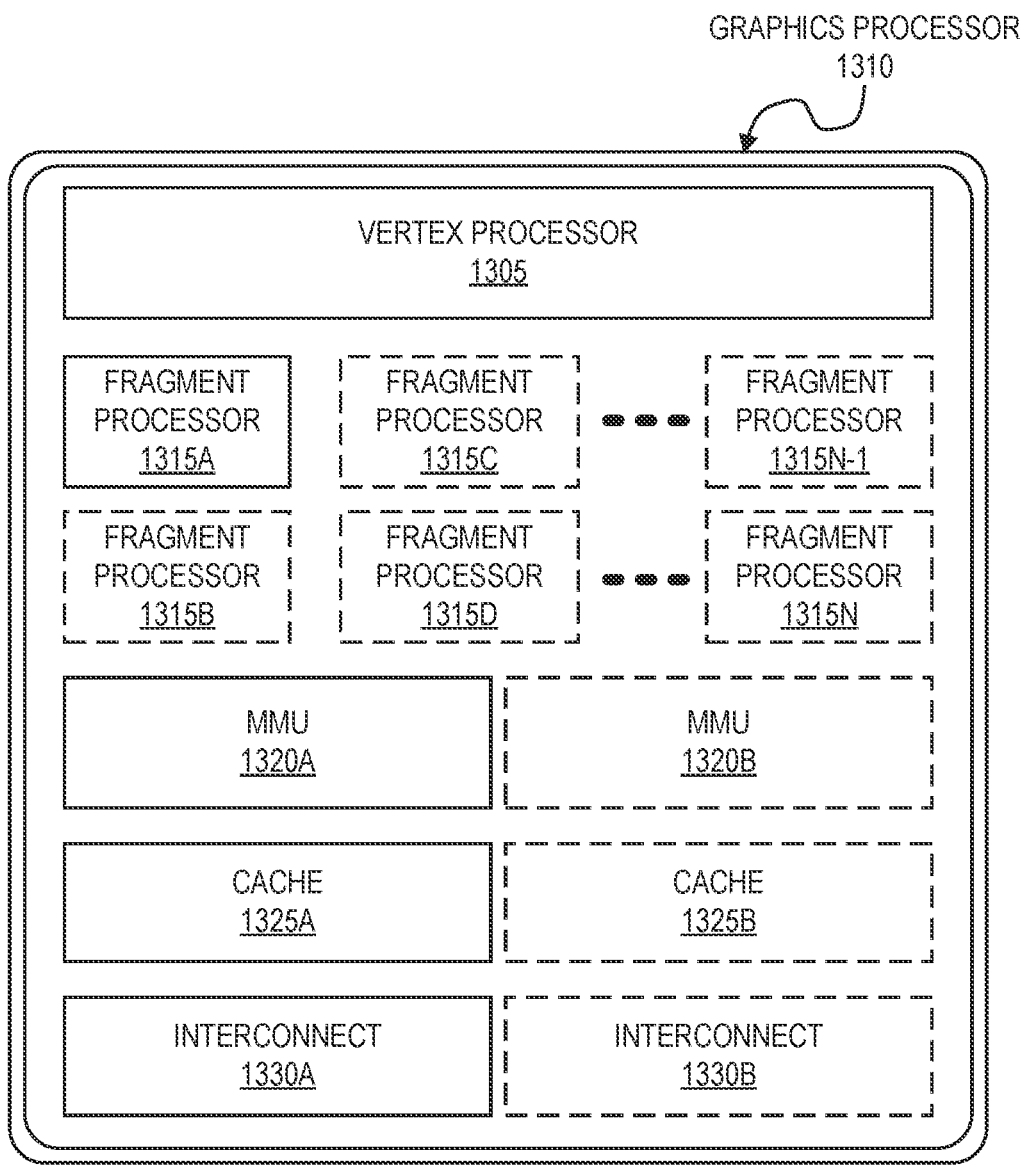
FIG. 13A illustrates an exemplary graphics processor of a system on a chip integrated circuit that may be fabricated using one or more IP cores, according to an embodiment.
Figure 13B:
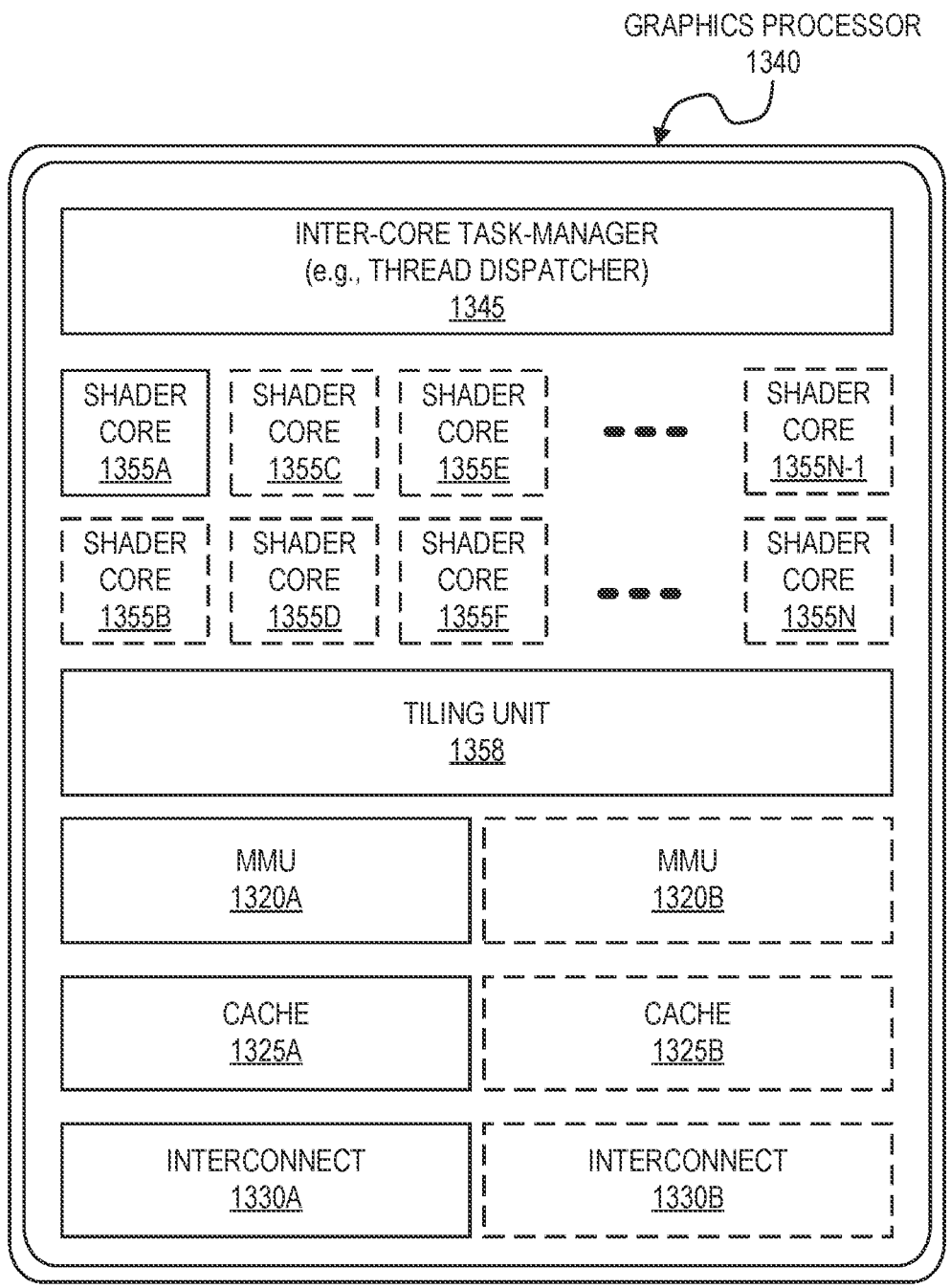
FIG. 13B illustrates an additional exemplary graphics processor of a system on a chip integrated circuit that may be fabricated using one or more IP cores, according to an embodiment.

FIGS. 13A-13B are block diagrams illustrating exemplary graphics processors for use within an SoC, according to embodiments described herein. FIG. 13A illustrates an exemplary graphics processor 1310 of a system on a chip integrated circuit that may be fabricated using one or more IP cores, according to an embodiment. FIG. 13B illustrates an additional exemplary graphics processor 1340 of a system on a chip integrated circuit that may be fabricated using one or more IP cores, according to an embodiment. Graphics processor 1310 of FIG. 13A is an example of a low power graphics processor core. Graphics processor 1340 of FIG. 13B is an example of a higher performance graphics processor core. Each of the graphics processors 1310, 1340 can be variants of the graphics processor 1210 of FIG. 12.

As shown in FIG. 13A, graphics processor 1310 includes a vertex processor 1305 and one or more fragment processor(s) 1315A-1315N (e.g., 1315A, 1315B, 1315C, 1315D, through 1315N-1, and 1315N). Graphics processor 1310 can execute different shader programs via separate logic, such that the vertex processor 1305 is optimized to execute operations for vertex shader programs, while the one or more fragment processor(s) 1315A-1315N execute fragment (e.g., pixel) shading operations for fragment or pixel shader programs. The vertex processor 1305 performs the vertex processing stage of the 3D graphics pipeline and generates primitives and vertex data. The fragment processor(s) 1315A-1315N use the primitive and vertex data generated by the vertex processor 1305 to produce a framebuffer that is displayed on a display device. In one embodiment, the fragment processor(s) 1315A-1315N are optimized to execute fragment shader programs as provided for in the OpenGL API, which may be used to perform similar operations as a pixel shader program as provided for in the Direct 3D API.

Graphics processor 1310 additionally includes one or more memory management units (MMUs) 1320A-1320B, cache(s) 1325A-1325B, and circuit interconnect(s) 1330A-1330B. The one or more MMU(s) 1320A-1320B provide for virtual to physical address mapping for the graphics processor 1310, including for the vertex processor 1305 and/or fragment processor(s) 1315A-1315N, which may reference vertex or image/texture data stored in memory, in addition to vertex or image/texture data stored in the one or more cache(s) 1325A-1325B. In one embodiment the one or more MMU(s) 1320A-1320B may be synchronized with other MMUs within the system, including one or more MMUs associated with the one or more application processor(s) 1205, image processor 1215, and/or video processor 1220 of FIG. 12, such that each processor 1205-1220 can participate in a shared or unified virtual memory system. The one or more circuit interconnect(s) 1330A-1330B enable graphics processor 1310 to interface with other IP cores within the SoC, either via an internal bus of the SoC or via a direct connection, according to embodiments.

As shown FIG. 13B, graphics processor 1340 includes the one or more MMU(s) 1320A-1320B, caches 1325A-1325B, and circuit interconnects 1330A-1330B of the graphics processor 1310 of FIG. 13A. Graphics processor 1340 includes one or more shader core(s) 1355A-1355N (e.g., 1455A, 1355B, 1355C, 1355D, 1355E, 1355F, through 1355N-1, and 1355N), which provides for a unified shader core architecture in which a single core or type or core can execute all types of programmable shader code, including shader program code to implement vertex shaders, fragment shaders, and/or compute shaders. The exact number of shader cores present can vary among embodiments and implementations. Additionally, graphics processor 1340 includes an inter-core task manager 1345, which acts as a thread dispatcher to dispatch execution threads to one or more shader cores 1355A-1355N and a tiling unit 1358 to accelerate tiling operations for tile-based rendering, in which rendering operations for a scene are subdivided in image space, for example to exploit local spatial coherence within a scene or to optimize use of internal caches.

Figure 14A:
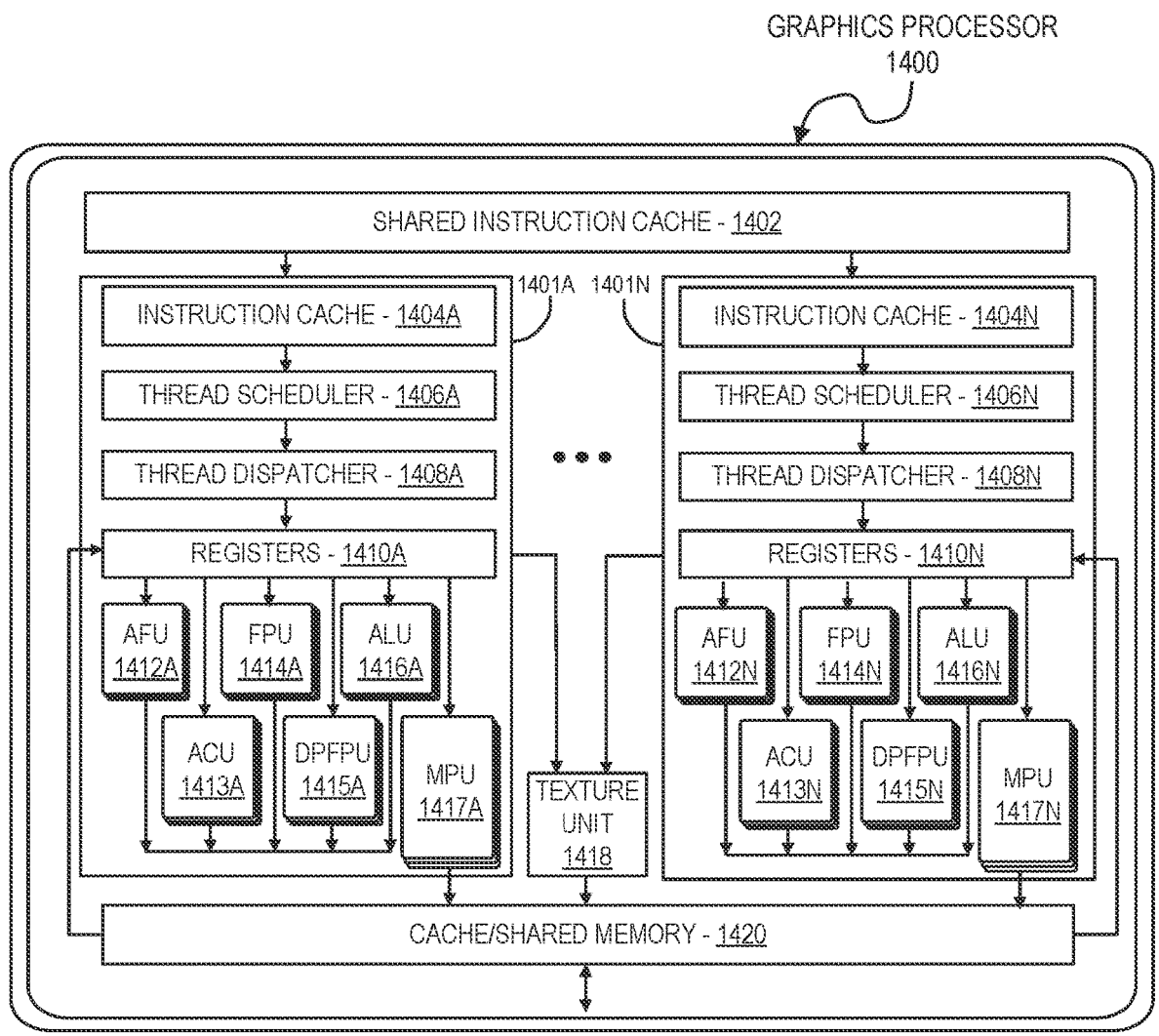
FIG. 14A illustrates a graphics core that may be included within a graphics processor according to some embodiments.
Figure 14B:
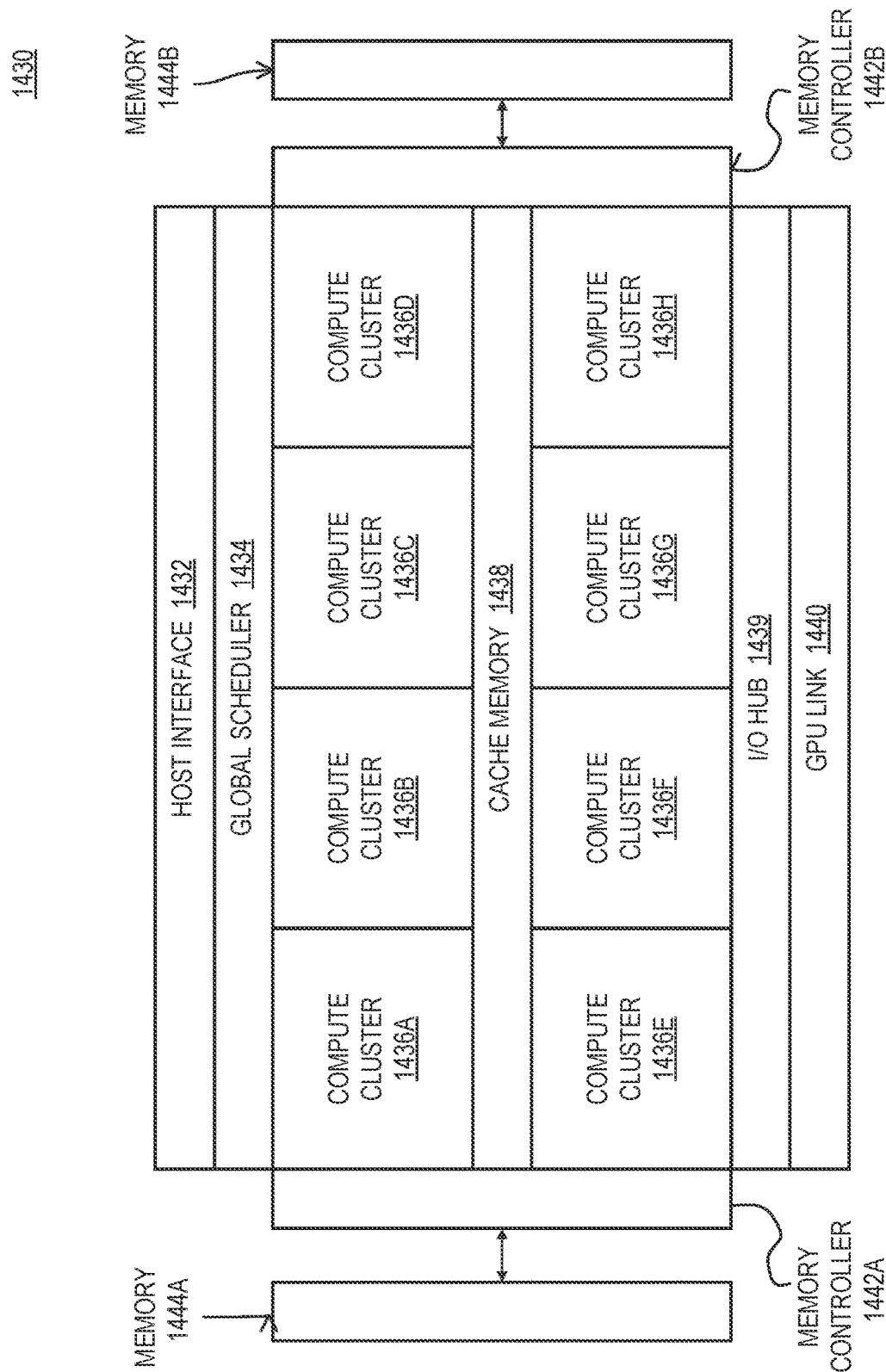
FIG. 14B illustrates a highly-parallel general-purpose graphics processing unit suitable for deployment on a multi-chip module according to some embodiments.

FIGS. 14A-14B illustrate additional exemplary graphics processor logic according to embodiments described herein. FIG. 14A illustrates a graphics core 1400 that may be included within the graphics processor 1210 of FIG. 12, and may be a unified shader core 1355A-1355N as in FIG. 13B. FIG. 14B illustrates a highly-parallel general-purpose graphics processing unit 1430 suitable for deployment on a multi-chip module.

As shown in FIG. 14A, the graphics core 1400 includes a shared instruction cache 1402, a texture unit 1418, and a cache/shared memory 1420 that are common to the execution resources within the graphics core 1400. The graphics core 1400 can include multiple slices 1401A-1401N or partition for each core, and a graphics processor can include multiple instances of the graphics core 1400. The slices 1401A-1401N can include support logic including a local instruction cache 1404A-1404N, a thread scheduler 1406A-1406N, a thread dispatcher 1408A-1408N, and a set of registers 1410A. To perform logic operations, the slices 1401A-1401N can include a set of additional function units (AFUs 1412A-1412N), floating-point units (FPU 1414A-1414N), integer arithmetic logic units (ALUs 1416-1416N), address computational units (ACU 1413A-1413N), double-precision floating-point units (DPFPU 1415A-1415N), and matrix processing units (MPU 1417A-1417N).

Some of the computational units operate at a specific precision. For example, the FPUs 1414A-1414N can perform single-precision (32-bit) and half-precision (16-bit) floating point operations, while the DPFPUs 1415A-1415N perform double precision (64-bit) floating point operations. The ALUs 1416A-1416N can perform variable precision integer operations at 8-bit, 16-bit, and 32-bit precision, and can be configured for mixed precision operations. The MPUs 1417A-1417N can also be configured for mixed precision matrix operations, including half-precision floating point and 8-bit integer operations. The MPUs 1417-1417N can perform a variety of matrix operations to accelerate machine learning application frameworks, including enabling support for accelerated general matrix to matrix multiplication (GEMM). The AFUs 1412A-1412N can perform additional logic operations not supported by the floating-point or integer units, including trigonometric operations (e.g., Sine, Cosine, etc.).

As shown in FIG. 14B, a general-purpose processing unit (GPGPU) 1430 can be configured to enable highly-parallel compute operations to be performed by an array of graphics processing units. Additionally, the GPGPU 1430 can be linked directly to other instances of the GPGPU to create a multi-GPU cluster to improve training speed for particularly deep neural networks. The GPGPU 1430 includes a host interface 1432 to enable a connection with a host processor. In one embodiment the host interface 1432 is a PCI Express interface. However, the host interface can also be a vendor specific communications interface or communications fabric. The GPGPU 1430 receives commands from the host processor and uses a global scheduler 1434 to distribute execution threads associated with those commands to a set of compute clusters 1436A-1436H. The compute clusters 1436A-1436H share a cache memory 1438. The cache memory 1438 can serve as a higher-level cache for cache memories within the compute clusters 1436A-1436H.

The GPGPU 1430 includes memory 1434A-1434B coupled with the compute clusters 1436A-1436H via a set of memory controllers 1442A-1442B. In various embodiments, the memory 1434A-1434B can include various types of memory devices including dynamic random-access memory (DRAM) or graphics random access memory, such as synchronous graphics random access memory (SGRAM), including graphics double data rate (GDDR) memory.

In one embodiment the compute clusters 1436A-1436H each include a set of graphics cores, such as the graphics core 1400 of FIG. 14A, which can include multiple types of integer and floating-point logic units that can perform computational operations at a range of precisions including suited for machine learning computations. For example and in one embodiment at least a subset of the floating-point units in each of the compute clusters 1436A-1436H can be configured to perform 16-bit or 32-bit floating point operations, while a different subset of the floating-point units can be configured to perform 64-bit floating point operations.

Multiple instances of the GPGPU 1430 can be configured to operate as a compute cluster. The communication mechanism used by the compute cluster for synchronization and data exchange varies across embodiments. In one embodiment the multiple instances of the GPGPU 1430 communicate over the host interface 1432. In one embodiment the GPGPU 1430 includes an I/O hub 1439 that couples the GPGPU 1430 with a GPU link 1440 that enables a direct connection to other instances of the GPGPU. In one embodiment the GPU link 1440 is coupled to a dedicated GPU-to-GPU bridge that enables communication and synchronization between multiple instances of the GPGPU 1430. In one embodiment the GPU link 1440 couples with a high-speed interconnect to transmit and receive data to other GPGPUs or parallel processors. In one embodiment the multiple instances of the GPGPU 1430 are located in separate data processing systems and communicate via a network device that is accessible via the host interface 1432. In one embodiment the GPU link 1440 can be configured to enable a connection to a host processor in addition to or as an alternative to the host interface 1432.

While the illustrated configuration of the GPGPU 1430 can be configured to train neural networks, one embodiment provides alternate configuration of the GPGPU 1430 that can be configured for deployment within a high performance or low power inferencing platform. In an inferencing configuration the GPGPU 1430 includes fewer of the compute clusters 1436A-1436H relative to the training configuration. Additionally, the memory technology associated with the memory 1434A-1434B may differ between inferencing and training configurations, with higher bandwidth memory technologies devoted to training configurations. In one embodiment the inferencing configuration of the GPGPU 1430 can support inferencing specific instructions. For example, an inferencing configuration can provide support for one or more 8-bit integer dot product instructions, which are commonly used during inferencing operations for deployed neural networks.

Machine Learning Overview

A machine learning algorithm is an algorithm that can learn based on a set of data. Embodiments of machine learning algorithms can be designed to model high-level abstractions within a data set. For example, image recognition algorithms can be used to determine which of several categories to which a given input belong; regression algorithms can output a numerical value given an input; and pattern recognition algorithms can be used to generate translated text or perform text to speech and/or speech recognition.

An exemplary type of machine learning algorithm is a neural network. There are many types of neural networks; a simple type of neural network is a feedforward network. A feedforward network may be implemented as an acyclic graph in which the nodes are arranged in layers. Typically, a feedforward network topology includes an input layer and an output layer that are separated by at least one hidden layer. The hidden layer transforms input received by the input layer into a representation that is useful for generating output in the output layer. The network nodes are fully connected via edges to the nodes in adjacent layers, but there are no edges between nodes within each layer. Data received at the nodes of an input layer of a feedforward network are propagated (i.e., "fed forward") to the nodes of the output layer via an activation function that calculates the states of the nodes of each successive layer in the network based on coefficients ("weights") respectively associated with each of the edges connecting the layers. Depending on the specific model being represented by the algorithm being executed, the output from the neural network algorithm can take various forms.

Before a machine learning algorithm can be used to model a particular problem, the algorithm is trained using a training data set. Training a neural network involves selecting a network topology, using a set of training data representing a problem being modeled by the network, and adjusting the weights until the network model performs with a minimal error for all instances of the training data set. For example, during a supervised learning training process for a neural network, the output produced by the network in response to the input representing an instance in a training data set is compared to the "correct" labeled output for that instance, an error signal representing the difference between the output and the labeled output is calculated, and the weights associated with the connections are adjusted to minimize that error as the error signal is backward propagated through the layers of the network. The network is considered "trained" when the errors for each of the outputs generated from the instances of the training data set are minimized.

The accuracy of a machine learning algorithm can be affected significantly by the quality of the data set used to train the algorithm. The training process can be computationally intensive and may require a significant amount of time on a conventional general-purpose processor. Accordingly, parallel processing hardware is used to train many types of machine learning algorithms. This is particularly useful for optimizing the training of neural networks, as the computations performed in adjusting the coefficients in neural networks lend themselves naturally to parallel implementations. Specifically, many machine learning algorithms and software applications have been adapted to make use of the parallel processing hardware within general-purpose graphics processing devices.

Figure 15:
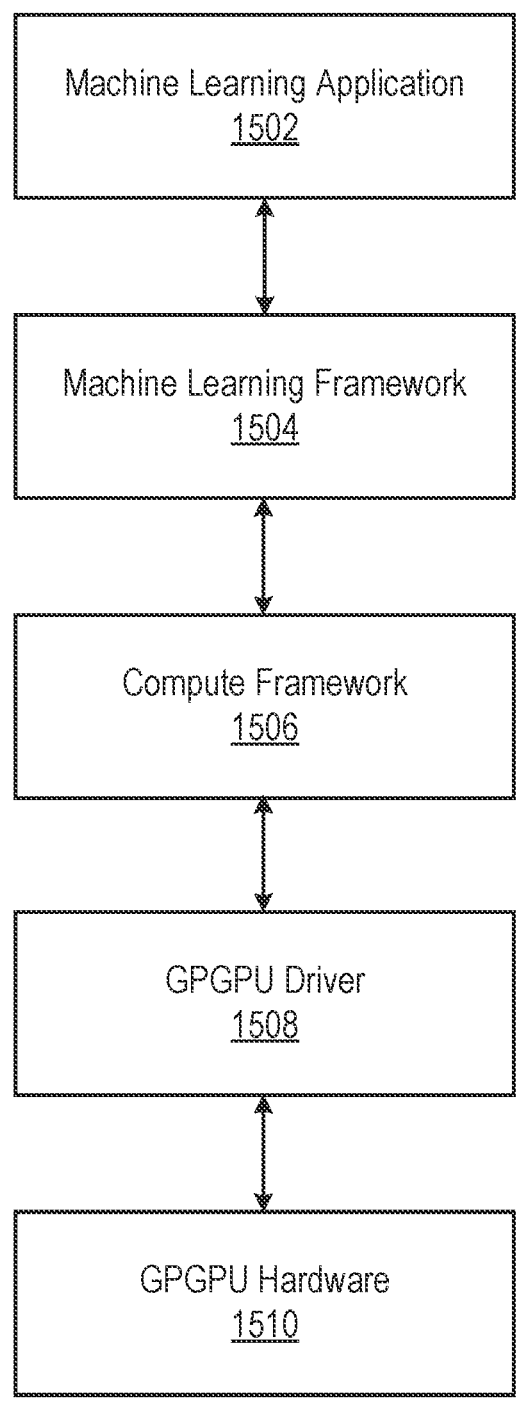
FIG. 15 illustrates a machine learning software stack, according to an embodiment.

FIG. 15 is a generalized diagram of a machine learning software stack 1500. A machine learning application 1502 can be configured to train a neural network using a training dataset or to use a trained deep neural network to implement machine intelligence. The machine learning application 1502 can include training and inference functionality for a neural network and/or specialized software that can be used to train a neural network before deployment. The machine learning application 1502 can implement any type of machine intelligence including but not limited to image recognition, mapping and localization, autonomous navigation, speech synthesis, medical imaging, or language translation.

Hardware acceleration for the machine learning application 1502 can be enabled via a machine learning framework 1504. The machine learning framework 1504 can provide a library of machine learning primitives. Machine learning primitives are basic operations that are commonly performed by machine learning algorithms. Without the machine learning framework 1504, developers of machine learning algorithms would be required to create and optimize the main computational logic associated with the machine learning algorithm, then re-optimize the computational logic as new parallel processors are developed. Instead, the machine learning application can be configured to perform the necessary computations using the primitives provided by the machine learning framework 1504. Exemplary primitives include tensor convolutions, activation functions, and pooling, which are computational operations that are performed while training a convolutional neural network (CNN). The machine learning framework 1504 can also provide primitives to implement basic linear algebra subprograms performed by many machine-learning algorithms, such as matrix and vector operations.

The machine learning framework 1504 can process input data received from the machine learning application 1502 and generate the appropriate input to a compute framework 1506. The compute framework 1506 can abstract the underlying instructions provided to the GPGPU driver 1508 to enable the machine learning framework 1504 to take advantage of hardware acceleration via the GPGPU hardware 1510 without requiring the machine learning framework 1504 to have intimate knowledge of the architecture of the GPGPU hardware 1510. Additionally, the compute framework 1506 can enable hardware acceleration for the machine learning framework 1504 across a variety of types and generations of the GPGPU hardware 1510.

Machine Learning Neural Network Implementations

The computing architecture provided by embodiments described herein can be configured to perform the types of parallel processing that is particularly suited for training and deploying neural networks for machine learning. A neural network can be generalized as a network of functions having a graph relationship. As is known in the art, there are a variety of types of neural network implementations used in machine learning. One exemplary type of neural network is the feedforward network, as previously described.

A second exemplary type of neural network is the Convolutional Neural Network (CNN). A CNN is a specialized feedforward neural network for processing data having a known, grid-like topology, such as image data. Accordingly, CNNs are commonly used for compute vision and image recognition applications, but they also may be used for other types of pattern recognition such as speech and language processing. The nodes in the CNN input layer are organized into a set of "filters" (feature detectors inspired by the receptive fields found in the retina), and the output of each set of filters is propagated to nodes in successive layers of the network. The computations for a CNN include applying the convolution mathematical operation to each filter to produce the output of that filter. Convolution is a specialized kind of mathematical operation performed by two functions to produce a third function that is a modified version of one of the two original functions. In convolutional network terminology, the first function to the convolution can be referred to as the input, while the second function can be referred to as the convolution kernel. The output may be referred to as the feature map. For example, the input to a convolution layer can be a multidimensional array of data that defines the various color components of an input image. The convolution kernel can be a multidimensional array of parameters, where the parameters are adapted by the training process for the neural network.

Recurrent neural networks (RNNs) are a family of feedforward neural networks that include feedback connections between layers. RNNs enable modeling of sequential data by sharing parameter data across different parts of the neural network. The architecture for a RNN includes cycles. The cycles represent the influence of a present value of a variable on its own value at a future time, as at least a portion of the output data from the RNN is used as feedback for processing subsequent input in a sequence. This feature makes RNNs particularly useful for language processing due to the variable nature in which language data can be composed.

The figures described below present exemplary feedforward, CNN, and RNN networks, as well as describe a general process for respectively training and deploying each of those types of networks. It will be understood that these descriptions are exemplary and non-limiting as to any specific embodiment described herein and the concepts illustrated can be applied generally to deep neural networks and machine learning techniques in general.

The exemplary neural networks described above can be used to perform deep learning. Deep learning is machine learning using deep neural networks. The deep neural networks used in deep learning are artificial neural networks composed of multiple hidden layers, as opposed to shallow neural networks that include only a single hidden layer. Deeper neural networks are generally more computationally intensive to train. However, the additional hidden layers of the network enable multistep pattern recognition that results in reduced output error relative to shallow machine learning techniques.

Deep neural networks used in deep learning typically include a front-end network to perform feature recognition coupled to a back-end network which represents a mathematical model that can perform operations (e.g., object classification, speech recognition, etc.) based on the feature representation provided to the model. Deep learning enables machine learning to be performed without requiring hand crafted feature engineering to be performed for the model. Instead, deep neural networks can learn features based on statistical structure or correlation within the input data. The learned features can be provided to a mathematical model that can map detected features to an output. The mathematical model used by the network is generally specialized for the specific task to be performed, and different models will be used to perform different task.

Once the neural network is structured, a learning model can be applied to the network to train the network to perform specific tasks. The learning model describes how to adjust the weights within the model to reduce the output error of the network. Backpropagation of errors is a common method used to train neural networks. An input vector is presented to the network for processing. The output of the network is compared to the desired output using a loss function and an error value is calculated for each of the neurons in the output layer. The error values are then propagated backwards until each neuron has an associated error value which roughly represents its contribution to the original output. The network can then learn from those errors using an algorithm, such as the stochastic gradient descent algorithm, to update the weights of the of the neural network.

Figure 16A:
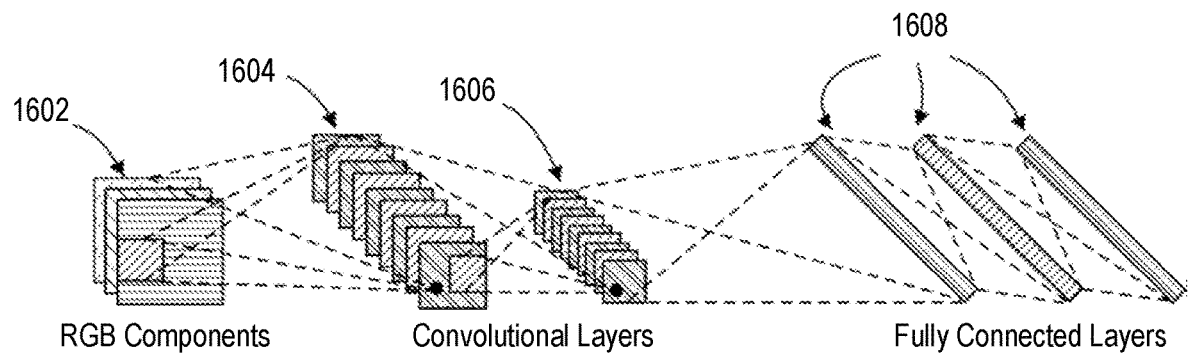
FIGS. 16A-16B illustrate layers of exemplary deep neural networks.
Figure 16B:
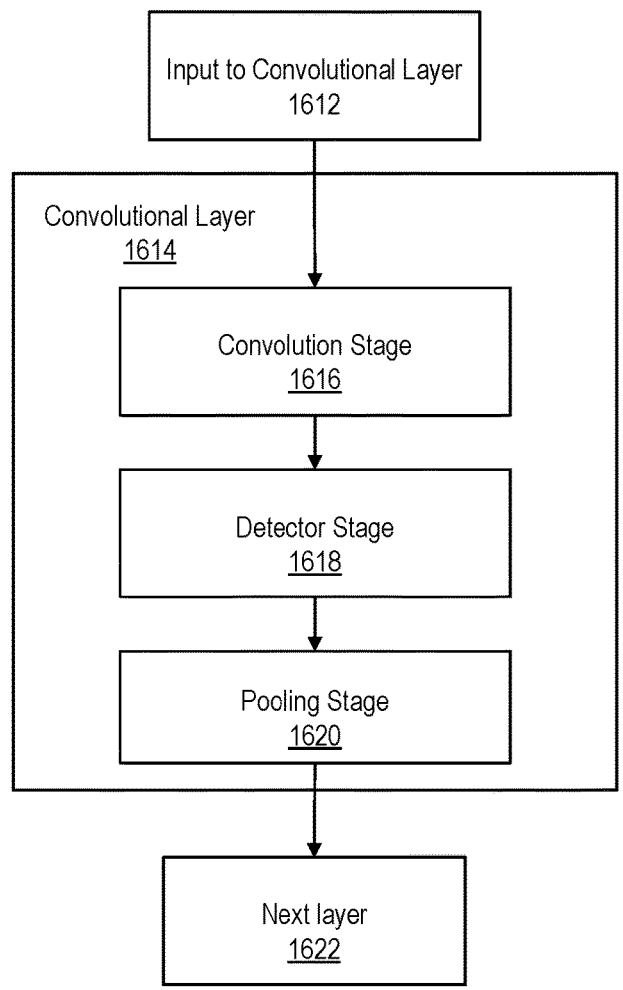

FIGS. 16A-16B illustrate an exemplary convolutional neural network. FIG. 16A illustrates various layers within a CNN. As shown in FIG. 16A, an exemplary CNN used to model image processing can receive input 1602 describing the red, green, and blue (RGB) components of an input image. The input 1602 can be processed by multiple convolutional layers (e.g., first convolutional layer 1604, second convolutional layer 1606). The output from the multiple convolutional layers may optionally be processed by a set of fully connected layers 1608. Neurons in a fully connected layer have full connections to all activations in the previous layer, as previously described for a feedforward network. The output from the fully connected layers 1608 can be used to generate an output result from the network. The activations within the fully connected layers 1608 can be computed using matrix multiplication instead of convolution. Not all CNN implementations make use of fully connected layers 1608. For example, in some implementations the second convolutional layer 1606 can generate output for the CNN.

The convolutional layers are sparsely connected, which differs from traditional neural network configuration found in the fully connected layers 1608. Traditional neural network layers are fully connected, such that every output unit interacts with every input unit. However, the convolutional layers are sparsely connected because the output of the convolution of a field is input (instead of the respective state value of each of the nodes in the field) to the nodes of the subsequent layer, as illustrated. The kernels associated with the convolutional layers perform convolution operations, the output of which is sent to the next layer. The dimensionality reduction performed within the convolutional layers is one aspect that enables the CNN to scale to process large images.

FIG. 16B illustrates exemplary computation stages within a convolutional layer of a CNN. Input to a convolutional layer 1612 of a CNN can be processed in three stages of a convolutional layer 1614. The three stages can include a convolution stage 1616, a detector stage 1618, and a pooling stage 1620. The convolution layer 1614 can then output data to a successive convolutional layer. The final convolutional layer of the network can generate output feature map data or provide input to a fully connected layer, for example, to generate a classification value for the input to the CNN.

In the convolution stage 1616 performs several convolutions in parallel to produce a set of linear activations. The convolution stage 1616 can include an affine transformation, which is any transformation that can be specified as a linear transformation plus a translation. Affine transformations include rotations, translations, scaling, and combinations of these transformations. The convolution stage computes the output of functions (e.g., neurons) that are connected to specific regions in the input, which can be determined as the local region associated with the neuron. The neurons compute a dot product between the weights of the neurons and the region in the local input to which the neurons are connected. The output from the convolution stage 1616 defines a set of linear activations that are processed by successive stages of the convolutional layer 1614.

The linear activations can be processed by a detector stage 1618. In the detector stage 1618, each linear activation is processed by a non-linear activation function. The non-linear activation function increases the nonlinear properties of the overall network without affecting the receptive fields of the convolution layer. Several types of non-linear activation functions may be used. One particular type is the rectified linear unit (ReLU), which uses an activation function defined as $f(x)=\max(0,x)$, such that the activation is thresholded at zero.

The pooling stage 1620 uses a pooling function that replaces the output of the second convolutional layer 1606 with a summary statistic of the nearby outputs. The pooling function can be used to introduce translation invariance into the neural network, such that small translations to the input do not change the pooled outputs. Invariance to local translation can be useful in scenarios where the presence of a feature in the input data is more important than the precise location of the feature. Various types of pooling functions can be used during the pooling stage 1620, including max pooling, average pooling, and l2-norm pooling. Additionally, some CNN implementations do not include a pooling stage. Instead, such implementations substitute and additional convolution stage having an increased stride relative to previous convolution stages.

The output from the convolutional layer 1614 can then be processed by the next layer 1622. The next layer 1622 can be an additional convolutional layer or one of the fully connected layers 1608. For example, the first convolutional layer 1604 of FIG. 16A can output to the second convolutional layer 1606, while the second convolutional layer can output to a first layer of the fully connected layers 1608.

Figure 17:
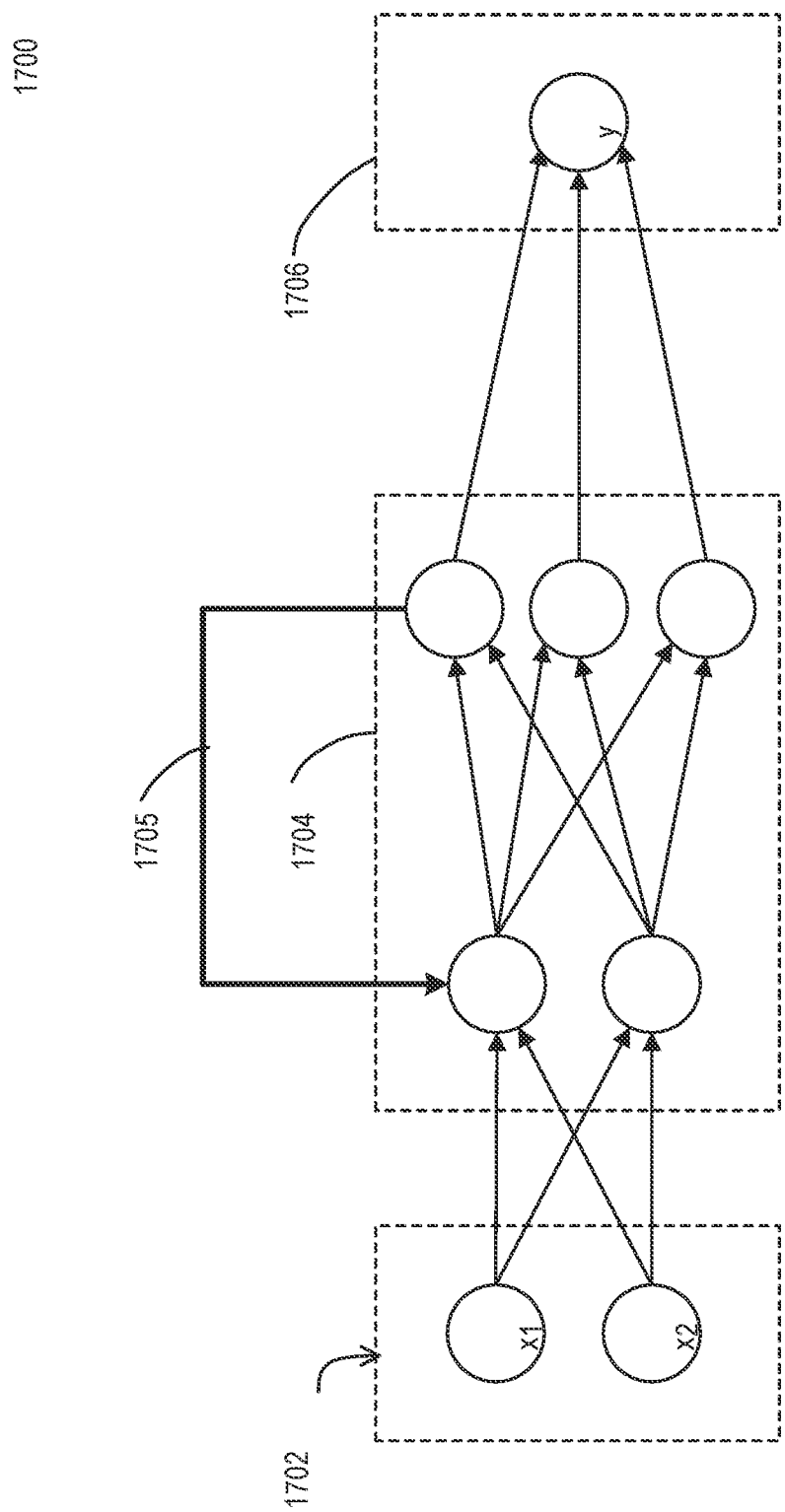
FIG. 17 illustrates an exemplary recurrent neural network.

FIG. 17 illustrates an exemplary recurrent neural network. In a recurrent neural network (RNN), the previous state of the network influences the output of the current state of the network. RNNs can be built in a variety of ways using a variety of functions. The use of RNNs generally revolves around using mathematical models to predict the future based on a prior sequence of inputs. For example, an RNN may be used to perform statistical language modeling to predict an upcoming word given a previous sequence of words. The illustrated RNN 1700 can be described as having an input layer 1702 that receives an input vector, hidden layers 1704 to implement a recurrent function, a feedback mechanism 1705 to enable a 'memory' of previous states, and an output layer 1706 to output a result. The RNN 1700 operates based on time-steps. The state of the RNN at a given time step is influenced based on the previous time step via the feedback mechanism 1705. For a given time step, the state of the hidden layers 1704 is defined by the previous state and the input at the current time step. An initial input (x1) at a first time step can be processed by the hidden layer 1704. A second input (x2) can be processed by the hidden layer 1704 using state information that is determined during the processing of the initial input (x1). A given state can be computed as $s_t=f(Ux_t+Ws_{t-1})$, where U and W are parameter matrices. The function $f$ is generally a nonlinearity, such as the hyperbolic tangent function (Tanh) or a variant of the rectifier function $f(x)=\max(0,x)$. However, the specific mathematical function used in the hidden layers 1704 can vary depending on the specific implementation details of the RNN 1700.

In addition to the basic CNN and RNN networks described, variations on those networks may be enabled. One example RNN variant is the long short-term memory (LSTM) RNN. LSTM RNNs are capable of learning long-term dependencies that may be necessary for processing longer sequences of language. A variant on the CNN is a convolutional deep belief network, which has a structure similar to a CNN and is trained in a manner similar to a deep belief network. A deep belief network (DBN) is a generative neural network that is composed of multiple layers of stochastic (random) variables. DBNs can be trained layer-by-layer using greedy unsupervised learning. The learned weights of the DBN can then be used to provide pre-train neural networks by determining an optimal initial set of weights for the neural network.

Figure 18:
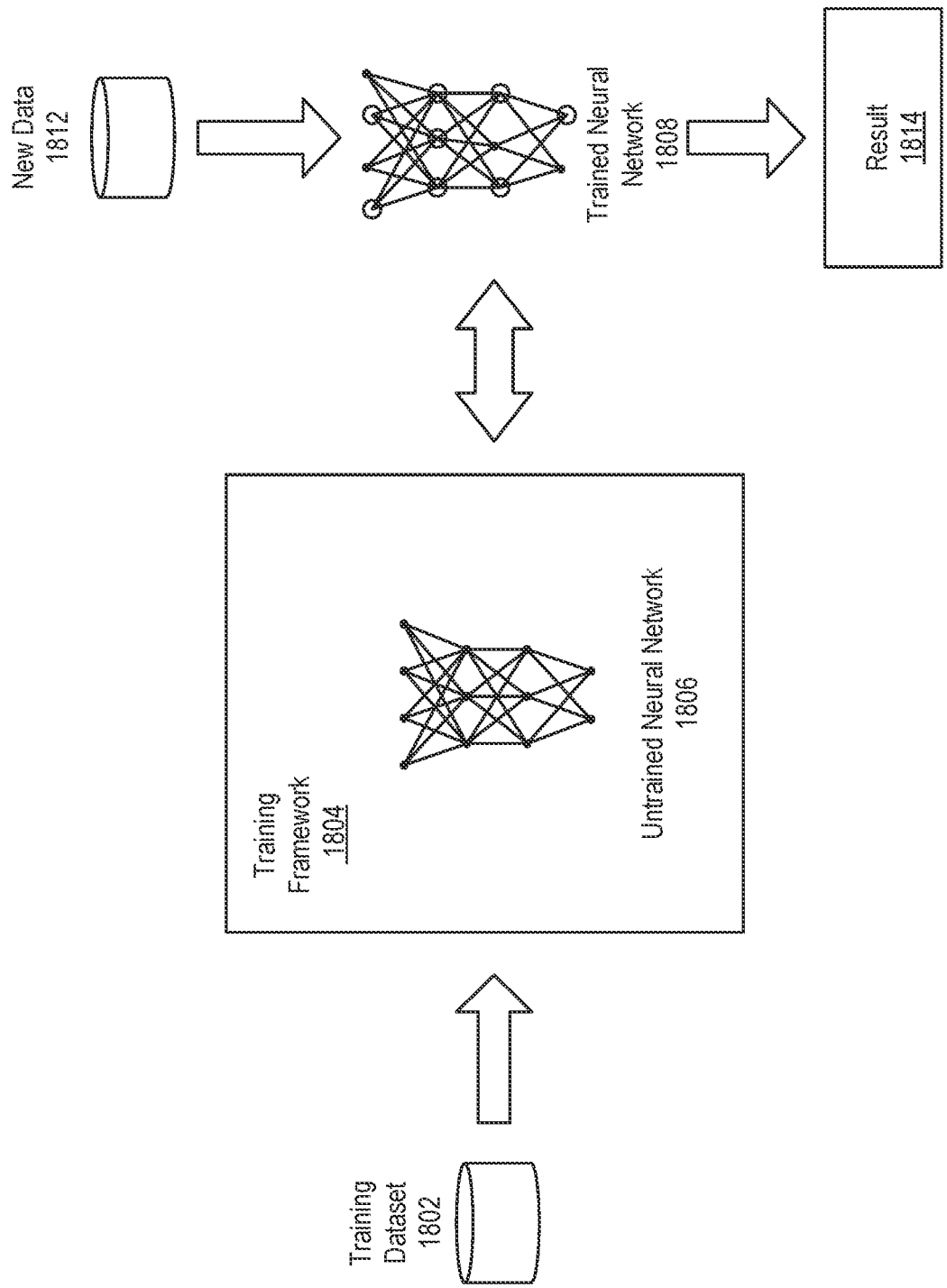
FIG. 18 illustrates training and deployment of a deep neural network.

FIG. 18 illustrates training and deployment of a deep neural network. Once a given network has been structured for a task the neural network is trained using a training dataset 1802. Various training frameworks have been developed to enable hardware acceleration of the training process. For example, the machine learning framework 1504 of FIG.

15 may be configured as a training framework 1804. The training framework 1804 can hook into an untrained neural network 1806 and enable the untrained neural net to be trained using the parallel processing resources described herein to generate a trained neural network 1808. To start the training process the initial weights may be chosen randomly or by pre-training using a deep belief network. The training cycle then be performed in either a supervised or unsupervised manner.

Supervised learning is a learning method in which training is performed as a mediated operation, such as when the training dataset 1802 includes input paired with the desired output for the input, or where the training dataset includes input having known output and the output of the neural network is manually graded. The network processes the inputs and compares the resulting outputs against a set of expected or desired outputs. Errors are then propagated back through the system. The training framework 1804 can adjust to adjust the weights that control the untrained neural network 1806. The training framework 1804 can provide tools to monitor how well the untrained neural network 1806 is converging towards a model suitable to generating correct answers based on known input data. The training process occurs repeatedly as the weights of the network are adjusted to refine the output generated by the neural network. The training process can continue until the neural network reaches a statistically desired accuracy associated with a trained neural network 1808. The trained neural network 1808 can then be deployed to implement any number of machine learning operations.

Unsupervised learning is a learning method in which the network attempts to train itself using unlabeled data. Thus, for unsupervised learning the training dataset 1802 will include input data without any associated output data. The untrained neural network 1806 can learn groupings within the unlabeled input and can determine how individual inputs are related to the overall dataset. Unsupervised training can be used to generate a self-organizing map, which is a type of trained neural network 1807 capable of performing operations useful in reducing the dimensionality of data. Unsupervised training can also be used to perform anomaly detection, which allows the identification of data points in an input dataset that deviate from the normal patterns of the data.

Variations on supervised and unsupervised training may also be employed. Semi-supervised learning is a technique in which in the training dataset 1802 includes a mix of labeled and unlabeled data of the same distribution. Incremental learning is a variant of supervised learning in which input data is continuously used to further train the model. Incremental learning enables the trained neural network 1808 to adapt to the new data 1812 without forgetting the knowledge instilled within the network during initial training.

Whether supervised or unsupervised, the training process for particularly deep neural networks may be too computationally intensive for a single compute node. Instead of using a single compute node, a distributed network of computational nodes can be used to accelerate the training process.

Figure 19:
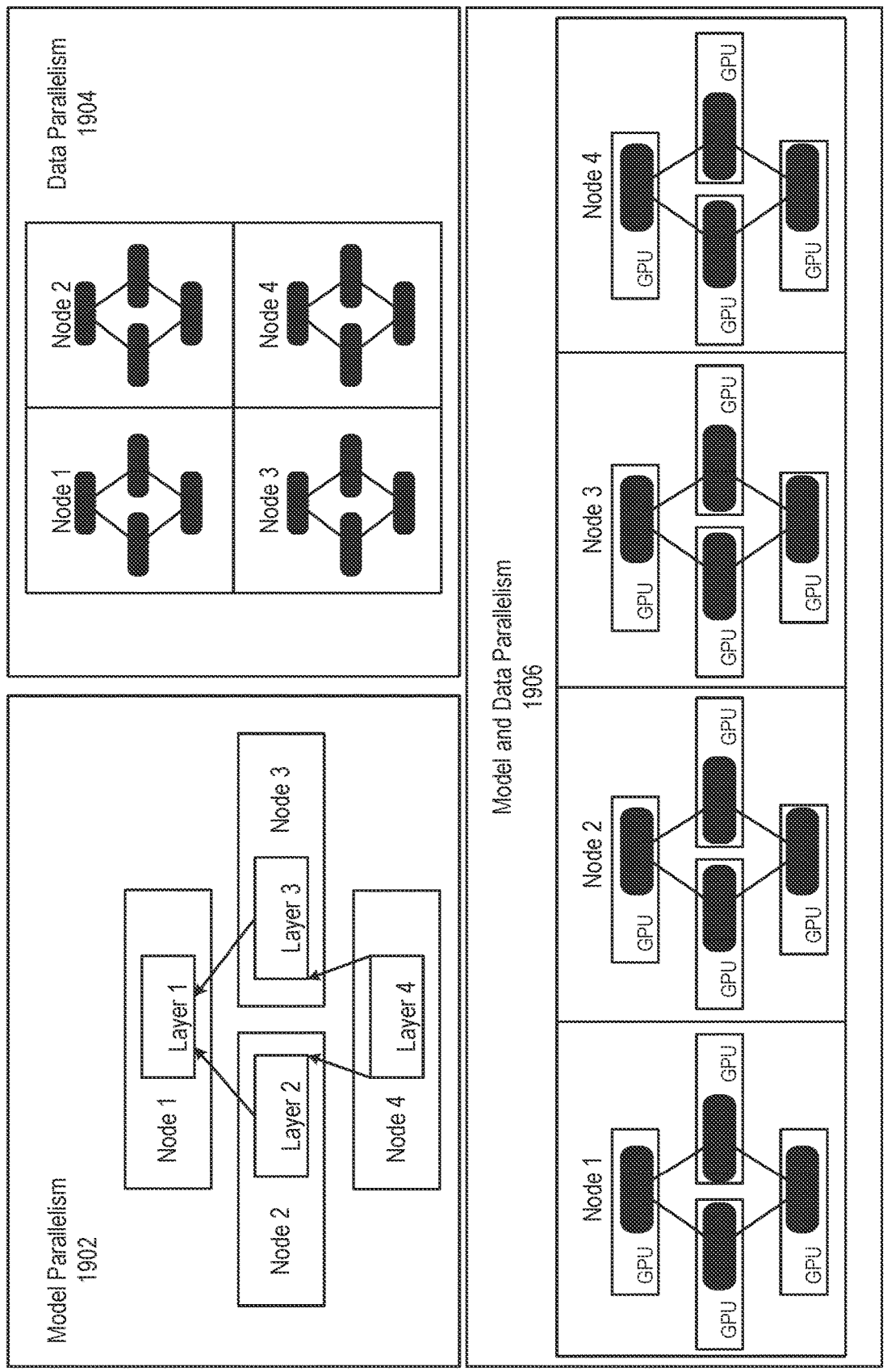
FIG. 19 is a block diagram illustrating distributed learning.

FIG. 19 is a block diagram illustrating distributed learning. Distributed learning is a training model that uses multiple distributed computing nodes to perform supervised or unsupervised training of a neural network. The distributed computational nodes can each include one or more host processors and one or more of the general-purpose processing nodes. As illustrated, distributed learning can be performed model parallelism 1902, data parallelism 1904, or a combination of model and data parallelism 1904.

In model parallelism 1902, different computational nodes in a distributed system can perform training computations for different parts of a single network. For example, each layer of a neural network can be trained by a different processing node of the distributed system. The benefits of model parallelism include the ability to scale to particularly large models. Splitting the computations associated with different layers of the neural network enables the training of very large neural networks in which the weights of all layers would not fit into the memory of a single computational node. In some instances, model parallelism can be particularly useful in performing unsupervised training of large neural networks.

In data parallelism 1904, the different nodes of the distributed network have a complete instance of the model and each node receives a different portion of the data. The results from the different nodes are then combined. While different approaches to data parallelism are possible, data parallel training approaches all require a technique of combining results and synchronizing the model parameters between each node. Exemplary approaches to combining data include parameter averaging and update based data parallelism. Parameter averaging trains each node on a subset of the training data and sets the global parameters (e.g., weights, biases) to the average of the parameters from each node. Parameter averaging uses a central parameter server that maintains the parameter data. Update based data parallelism is similar to parameter averaging except that instead of transferring parameters from the nodes to the parameter server, the updates to the model are transferred. Additionally, update based data parallelism can be performed in a decentralized manner, where the updates are compressed and transferred between nodes.

Combined model and data parallelism 1906 can be implemented, for example, in a distributed system in which each computational node includes multiple GPUs. Each node can have a complete instance of the model with separate GPUs within each node are used to train different portions of the model.

Distributed training has increased overhead relative to training on a single machine. However, the parallel processors and GPGPUs described herein can each implement various techniques to reduce the overhead of distributed training, including techniques to enable high bandwidth GPU-to-GPU data transfer and accelerated remote data synchronization.

Exemplary Machine Learning Applications

Machine learning can be applied to solve a variety of technological problems, including but not limited to computer vision, autonomous driving and navigation, speech recognition, and language processing. Computer vision has traditionally been one of the most active research areas for machine learning applications. Applications of computer vision range from reproducing human visual abilities, such as recognizing faces, to creating new categories of visual abilities. For example, computer vision applications can be configured to recognize sound waves from the vibrations induced in objects visible in a video. Parallel processor accelerated machine learning enables computer vision applications to be trained using significantly larger training dataset than previously feasible and enables inferencing systems to be deployed using low power parallel processors.

Parallel processor accelerated machine learning has autonomous driving applications including lane and road sign recognition, obstacle avoidance, navigation, and driving control. Accelerated machine learning techniques can be used to train driving models based on datasets that define the appropriate responses to specific training input. The parallel processors described herein can enable rapid training of the increasingly complex neural networks used for autonomous driving solutions and enables the deployment of low power inferencing processors in a mobile platform suitable for integration into autonomous vehicles.

Parallel processor accelerated deep neural networks have enabled machine learning approaches to automatic speech recognition (ASR). ASR includes the creation of a function that computes the most probable linguistic sequence given an input acoustic sequence. Accelerated machine learning using deep neural networks have enabled the replacement of the hidden Markov models (HMMs) and Gaussian mixture models (GMMs) previously used for ASR.

Parallel processor accelerated machine learning can also be used to accelerate natural language processing. Automatic learning procedures can make use of statistical inference algorithms to produce models that are robust to erroneous or unfamiliar input. Exemplary natural language processor applications include automatic machine translation between human languages.

The parallel processing platforms used for machine learning can be divided into training platforms and deployment platforms. Training platforms are generally highly parallel and include optimizations to accelerate multi-GPU single node training and multi-node, multi-GPU training, while deployed machine learning (e.g., inferencing) platforms generally include lower power parallel processors suitable for use in products such as cameras, autonomous robots, and autonomous vehicles.

Compression for Sparse Data Structures Utilizing Mode Search Approximation

In some embodiments, a system includes compression for sparse data structures utilizing mode search approximation. The sparse data compression (which may also be referred to herein as machine learning (ML) compression) improves memory bandwidth of workloads including machine learning, allowing for increased power efficiency and performance.

In some embodiments, machine learning compression (a first compression operation) may be complementary to a second compression operation, such as delta compression, and the machine learning compression operation may operate together with (in parallel with) the second compression operation. A compressed vector may be taken from whichever of the compression operations is successful in generating a compressed output vector. In some embodiments, there may be a preference for use of the output of the machine learning compression operation if both compression operations are successful.

Figure 20A:
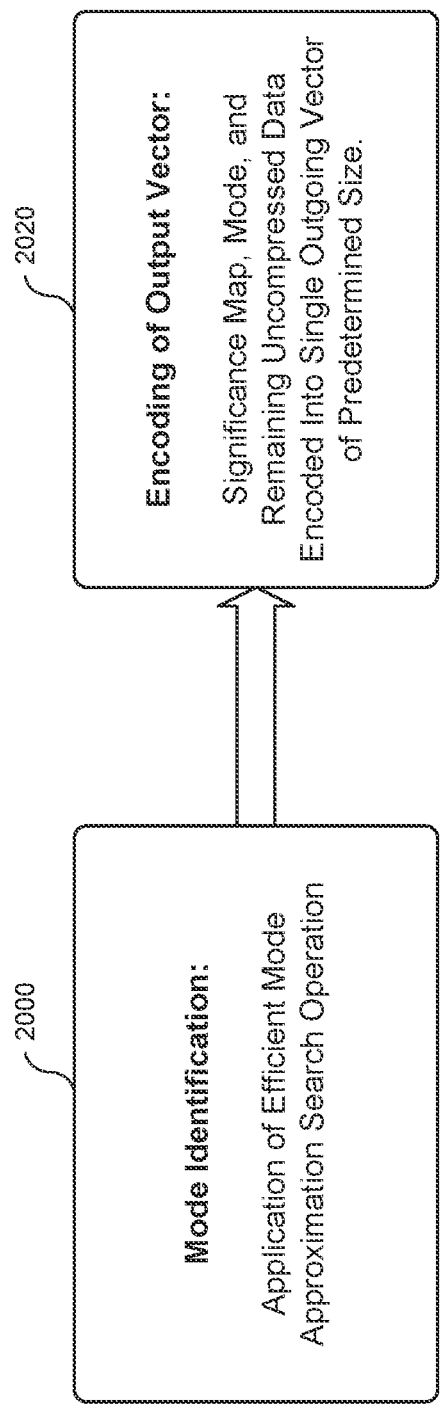
FIG. 20A is an illustration of compression for sparse data structures according to some embodiments.

FIG. 20A is an illustration of compression for sparse data structures according to some embodiments. In some embodiments, a compression operation for sparse data structures (machine learning compression) includes two main parts:

(1) Mode Identification 2000—Identification of a mode (most repeated value) in the incoming data, wherein the identification of the mode utilizes a highly efficient approximation operation to provide for rapid computation of the mode 2000.

(2) Encoding of Output Vector 2010—Encoding of a significance map, the identified mode value, and remaining uncompressed data (which may also be referred to herein as incompressible data) into a single outgoing vector of predetermined size.

In some embodiments, incoming data is processed identify a mode in such data. In an example, an incoming uncompressed data vector is 128b in size. With each data point being one byte in size, a brute force method to find the mode would require looking at 128 values sequentially and counting all the unique occurrences. This would require excessive processing time in a system, and thus is not a practical operation.

In some embodiments, in order to implement a compression process as fixed function hardware, an approximation is applied in identification of the mode. In some embodiments, an approximation algorithm is to efficiently select an approximation of the mode in an operation that examines less than all of the input data, provides a comparison of less than all of the examined data, or both. In some embodiments, an apparatus, system, or process is to construct a ternary tree where at each node there is a 3-way compare (a ternary comparison) that selects a repeating value between 3 inputs, or, if none exists, one of the inputs is returned, with the choice of the non-repeated value to be returned not being critical. In some embodiments, each of these node input values is a portion of a data value, such as a value that is only 2 bits in length, with these values being referred to as bit slices of the original 8-bit data points.

In some embodiments, an algorithm for an approximated mode search may be as follows:

```
char find_eq(char a, char b, char c)
{
    if(a==b)
        return a;
    else if(b==c)
        return b;
    else
        return c;
}
```

In some embodiments, because the operation includes a ternary tree, a compromise is applied to choose a subset of the data points for search, such as selecting only 81 input data points out of 128 for search. In this manner the result is a balanced tree and with only 4 comparison levels. In some embodiments, each of the subset of input values (81 input values) is separated into four 2-bit slices. There are four parallel ternary trees that compare these bit slices, each tree eventually producing the 2-bit output value that is most repeating. The four outputs are concatenated into a final 8-bit mode that approximates the most repeating value in the original 128 data points. In some embodiments, the 81 inputs to the mode finding algorithm are arranged in a manner, such as being evenly spread across the 128 data points, to provide a best quality approximation for the mode search.

If the three inputs to each node are a/b/c and are denoted with 0~26 for each top level compare node, then input data to node mapping function can be defined as:

$ai$=data[$i$]

$bi$=data[$i$+42]

$ci$=data[$i$+84]

$i\varepsilon$[0,26]

In some embodiments, upon the mode being identified, a significance map, identified mode, and remaining uncompressed data are encoded in a vector, and the vector is outputted. In an example in which there are 128 values (a 128 byte uncompressed data structure), a 128-bit significance map is constructed, with one bit per input value. When the input value is equal to the mode, the bit for the respective data value is set. In some embodiments, data values that are not equal to the mode are concatenated into a single uncompressed data vector in the order in which they occur. Stated in another way, the repeating values are removed from the original data vector structure, but the original order of the data values is preserved. Upon completion of the compression operation, the three components, the components being the mode significance map, the mode value, and the uncompressed data, are combined into a compressed output vector.

In some embodiments, the compression may be determined to be successful when the significance map, identified mode value, and uncompressed data all fit in the desired output block size. Thus, in one example, in order to achieve 2:1 compression with 128 8-bit input values, it is necessary that there be at least 81 repeating values in the original data values. That is because the 128-bit significance map (8 bytes) and mode (1 byte) consume 17 bytes, leaving 47 bytes to store uncompressed data (for a total of 17+47=64 bytes).

Figure 20B:
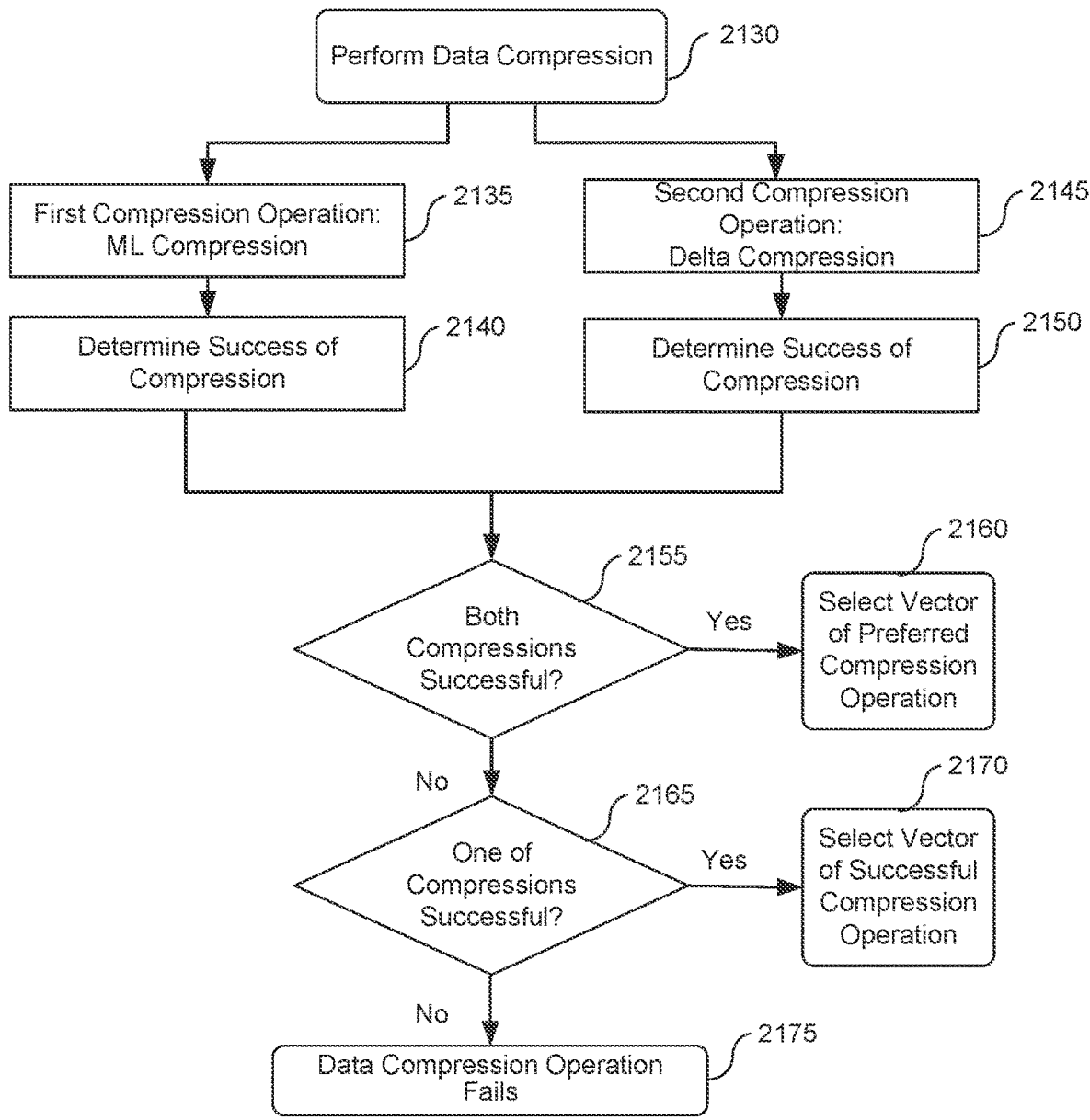
FIG. 20B is a flowchart to illustrate a process for selection of a compressed output vector according to some embodiments.

FIG. 20B is a flowchart to illustrate a process for selection of a compressed output vector according to some embodiments. In some embodiments, performance of a data compression operation 2030 may provide for parallel operation of at least two compression operations, wherein a first compression operation 2035 may be a process for machine learning compression (machine learning compression), such as is implemented in FIG. 21, and a second compression operation 2145 such as delta compression.

In some embodiments, determinations may be made whether the first compression operation is successful 2140 and whether the second compression operation is successful 2150, wherein a compressed output vector is generated if the compression is successful. In some embodiments, a special compression control surface (CCS) may be attached to each main surface that is compressed, the CCS including an encoding (such as a 4-bit encoding in one implementation) that is stored for every 128 bytes of main surface. The encoding is to indicate which of the compression operations, if any, is successful.

In some embodiments, a determination is made whether both of the compression operations are successful 2155, wherein the determination may be made according to the CCS encoding. If so, one of compression output vectors is selected. In some embodiments, a particular compression operation is preferred, such as the machine learning compression, and the compression output vector of the preferred compression operation is selected 2160. If not, then if one of the compression operations is successful 2155, the compression output vector of the successful compression operation is selected 2170. If neither of the compression operation is successful, then the overall data compression operation fails 2175.

Figure 21:
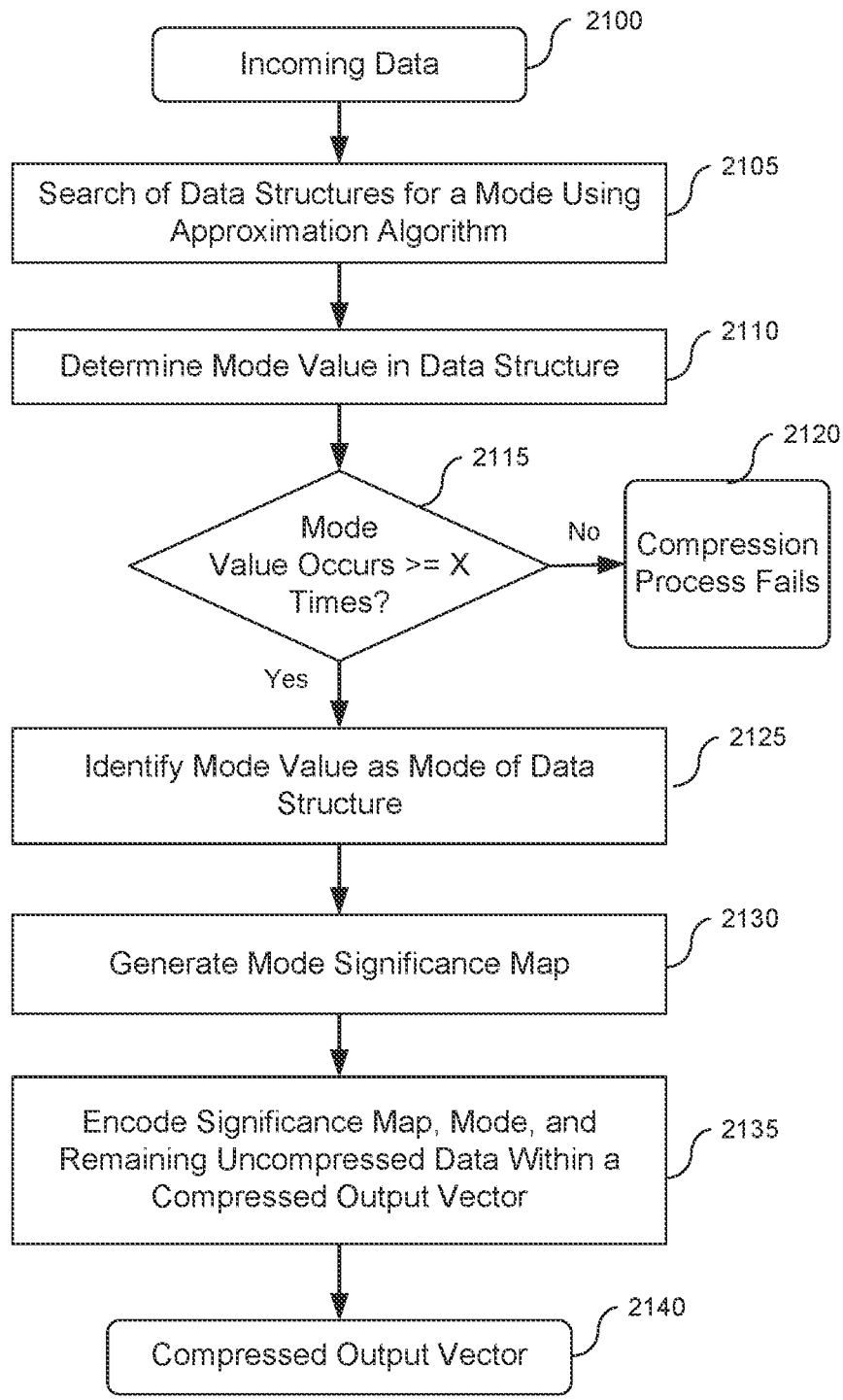
FIG. 21 is a flowchart to illustrate a process for compression of sparse data structures according to some embodiments.

FIG. 21 is a flowchart to illustrate a process for compression of sparse data structures according to some embodiments. In some embodiments, a process for compression includes receipt of incoming data 2100, wherein the incoming data includes sparse data structures, including, but not limited to, machine learning data. In some embodiments, the compression operation may be implemented in parallel with one or more other compression operations, such as is illustrated in FIG. 20B. A search of each of the received data structures is performed to determine a mode value, the mode value being the most repeated value in the data structure, with the search being perform using an approximation algorithm 2105. The approximation algorithm may include, but is not limited to, the ternary search algorithm illustrated in FIGS. 23 and 24.

In some embodiments, upon the mode value being determine in a data structure through operation the approximation algorithm 2110, there is a determination whether a number of occurrences of the mode value in the data structure is greater than equal to a threshold value X 2115, X being the minimum number of times that a mode must occur in order for the compression operation to be successful. If not, then the compression process fails 2120, and the process would continue as required without the completion of the data compression (such as providing the uncompressed data structure, or other action). Otherwise, the mode value is identified as the mode for the data structure 2125.

In some embodiments, a mode significant map is generated 2130, the mode significant map identifying the locations within the data structure where the mode is located. In some embodiments, each bit of the significant map identifies a location, and, if a bit is set, this indicates that the mode is present in this location. If a bit of the significance map is not set, this indicates that other data that remains uncompressed is present at that location. The significance map, the identified mode, and the remaining uncompressed data (wherein the remaining uncompressed data may be the remaining data concatenated together as a string) are encoded within a compressed output vector 2135, the vector having a particular size, and the compressed output vector 2140 is provided for transmission, processing, or storage.

Figure 22:
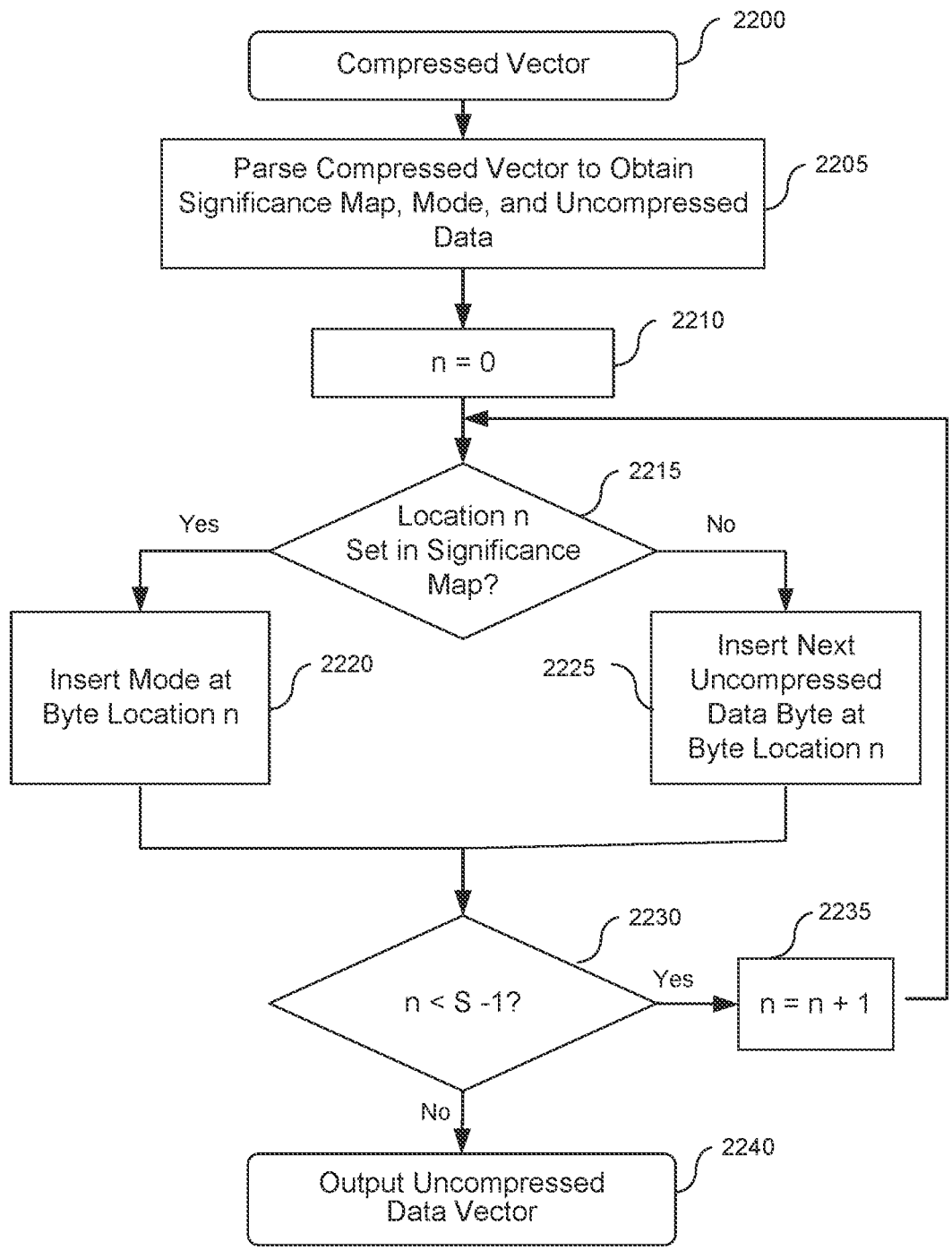
FIG. 22 is a flowchart to illustrate a process for decompression of sparse data structures according to some embodiments.

FIG. 22 is a flowchart to illustrate a process for decompression of sparse data structures according to some embodiments. In some embodiments, in order to decompress data contained in a compressed vector 2200, such as a 64-byte compressed vector that has been compressed such as illustrated in FIG. 21, an apparatus, system, or process is to parse the compressed vector to obtain a significance map, a mode, and uncompressed data. The significance map is to identify locations for the mode in an uncompressed data vector, such as a 128-byte vector in an example. In some embodiments, each bit of the significance map that is set indicates that the mode is present at the respective byte location in the original vector, and each bit that is not set indicates that a byte of uncompressed data is present at the respective byte location in the original vector.

In some embodiments, the original uncompressed data vector is generated by using each bit of the significance map to determine whether the mode or a byte of uncompressed data is to be placed into the data vector. This is illustrated in FIG. 22 as setting a counter n as zero initially 2210, and determining whether bit location n in the significant map is set 2215. If so, then the mode is inserted at byte location n in a data vector 2220; and, if not, then a next uncompressed data byte from the compressed vector is inserted at byte n in the data vector.

In some embodiments, there is then a determination whether the final bit of the significance map has been read, shown as a determination whether n is less than the number of bits minus 1 (S being the number of bits, which may be 128 in an example) 2230. If so, then n is incremented 2235 and the next location is evaluated 2215. If not, then the decompression process is complete, and uncompressed data vector is output 2240.

Figure 23:
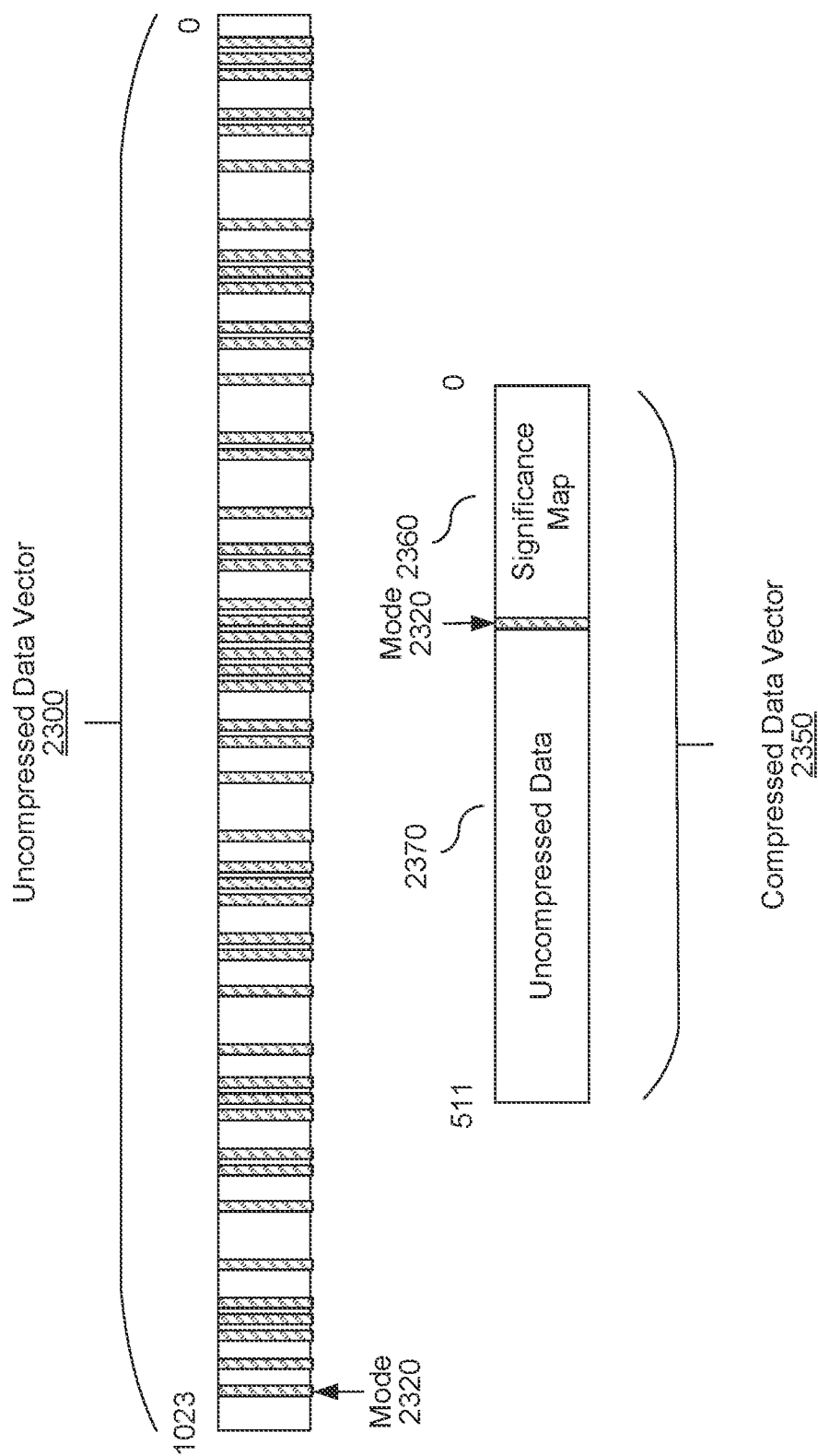
FIG. 23 is an illustration of an uncompressed data vector and a resulting compressed data vector according to some embodiments.

FIG. 23 is an illustration of an uncompressed data vector and a resulting compressed data vector according to some embodiments. As shown in FIG. 23, an uncompressed data vector 2300 is a vector of a certain size, which is 128-bytes in this example, bytes 0 through 127. It may be assumed that the data vector 2300 includes a certain repeating mode 2320. While for simplicity of illustration the total number of occurrences is shown as fewer, for compression the number of occurrences is required to be a certain number for the compressed data to fit within the compressed output vector, where the number is 81 in this illustrated example.

Also illustrated in FIG. 23 is the resulting compressed data vector 2350, such as a data vector generated by the process illustrated in FIG. 21. The compressed data vector 2350 is a certain predetermined size. In the illustrated example the compressed data vector 2350 is half the size of the uncompressed data vector 2300, thus being 64 bytes. As illustrated, the compressed data vector includes a significance map 2360 (16 bytes) indicating the locations of the mode 2320 (1 byte) in the original uncompressed data vector 2300, and further includes the remaining uncompressed data, which in this example is a maximum of 47 bytes (128 bytes minus at least 81 instances of the mode) in order for the significance map 2360, mode 2310, and uncompressed data 2370 to fit within the compressed data vector 2350.

In some embodiments, an approximation algorithm utilizes a parallel search of portions of the input data, such as the data vector 2300, with the search being a ternary search of data slices. It is noted that there are several design choices that may be made in order to adapt the algorithm to a particular data type in an embodiment. The specifics described in the example described below are directed to an 8-bit data type and 128-byte data structure as shown in FIG. 23.

In some embodiments, for the approximation algorithm, a number of input nodes to the mode calculation tree is rounded down to maximum power of 3 number that fits in the total number of input values. In practice this means that the algorithm will only search a subset of input values to determine the mode within the data structure. The size and number of bit slices is dictated by the data size. It may be determined experimentally that 4 slices times 2 bit is an optimal design for 8 bits. In such operation, the small size of the bit slice enables very simple comparators translating into gate count savings.

Figure 24:
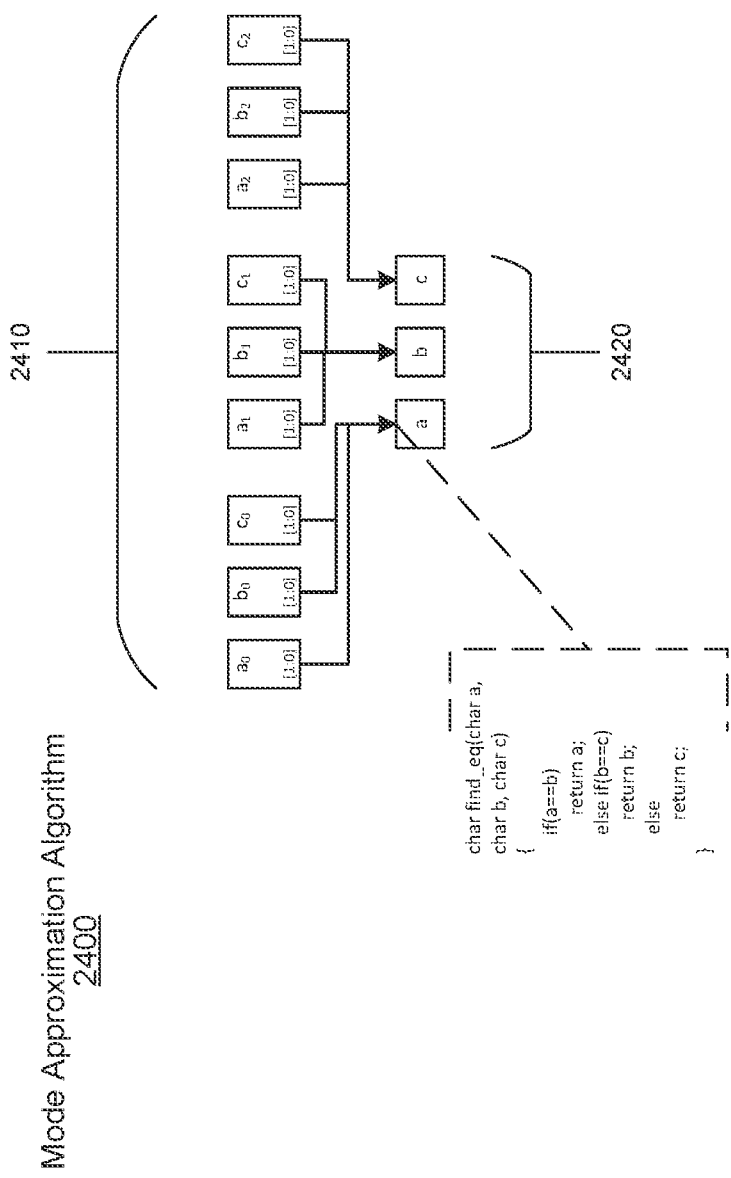
FIG. 24 is an illustration of a portion of a mode approximation algorithm according to some embodiments.
Figure 25:
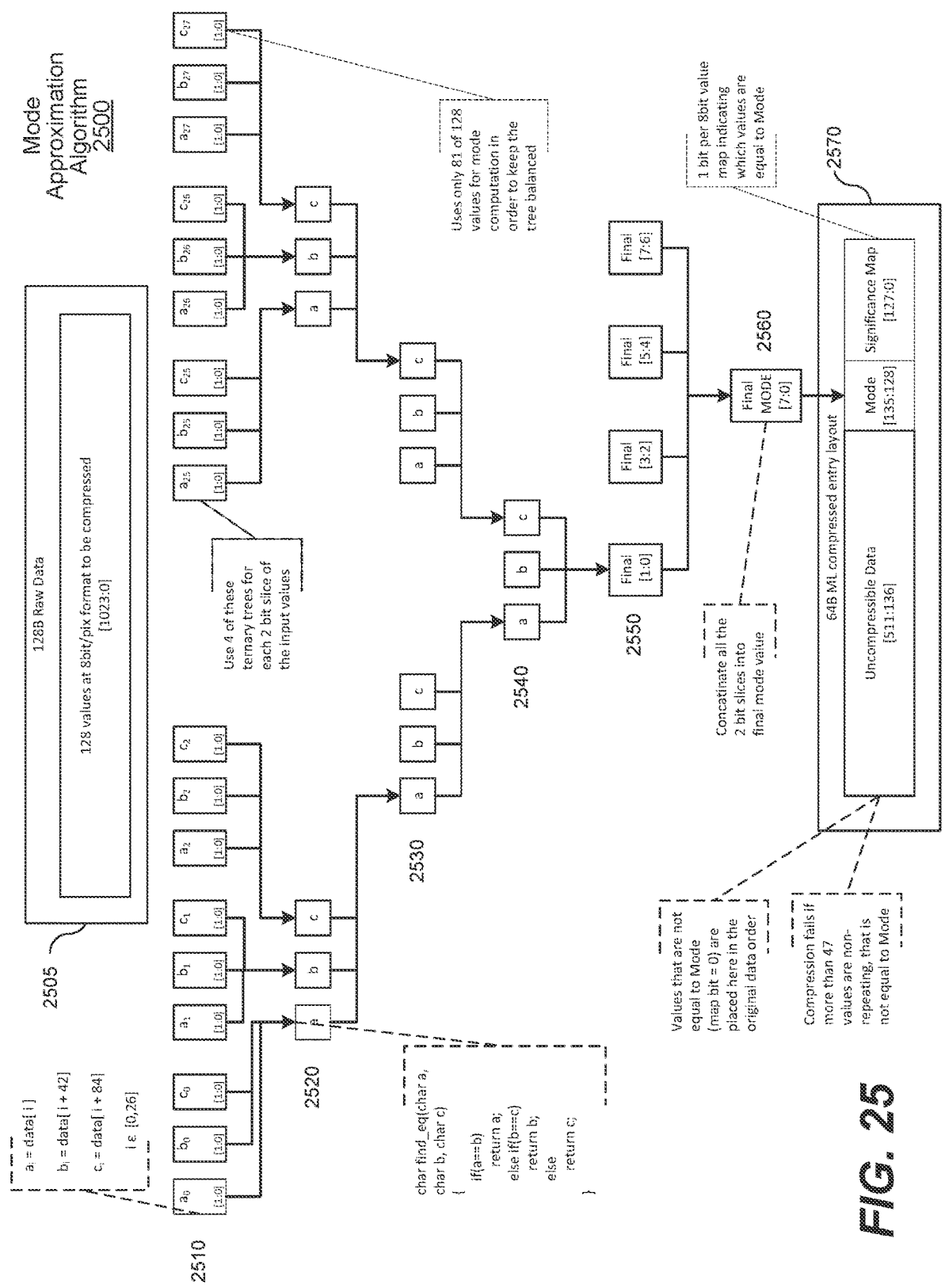
FIG. 25 is an illustration of a mode approximation algorithm according to some embodiments.

FIG. 24 is an illustration of a portion of a mode approximation algorithm according to some embodiments. FIG. 24 provides a portion of the algorithm that is illustrated in FIG. 25. In some embodiments, for the mode approximation algorithm 2400, two-bit slices of a data vector are compared in a hierarchy of ternary tree comparisons. For each comparison, three two-bit slices are compared using two comparators, a first comparator to compare a with b, and a second comparator to compare b with c. However, the choice and order of comparisons between the three slices may vary in different embodiments. As shown, the result of either comparison is returned for the next comparison if the bit slices are equal. Otherwise, one of the bit slices (c in the illustrated example) is returned.

As further illustrated in FIG. 24, the results of each of the bit slice comparisons 2410, the comparisons being a first comparison between $a_0$, $b_0$, and $c_0$, a second comparison between $a_1$, $b_1$, and $c_1$, and a third comparison between $a_2$, $b_2$, and $c_2$, are then compared in the same fashion in the next level of the process, shown as the comparison between a, b, and c 2420.

FIG. 25 is an illustration of a mode approximation algorithm according to some embodiments. In some embodiments, a mode approximation algorithm 2500 provides for approximation of a mode within a particular data input, the data input 2505 in this example being 128B of data, providing 128 values at 8 bits per pixel format to be compressed. However, embodiments are not limited to this memory structure, and the implementation of the mode approximation algorithm may vary according to the structure of the data value to be compressed.

As shown in FIG. 25, mode approximation algorithm 2500 includes a hierarchy of ternary tree comparisons. For each comparison, three two-bit slices are compared using two comparators, a first comparator to compare a with b, and a second comparator to compare b with c. As illustrated, for a data input 2505 includes 128 8-bit values, there may be four comparison levels in in the hierarchy of comparisons, these being illustrated at level 2510, level 2520, level 2530, and level 2540. FIG. 25 specifically illustrates comparisons for a first set of two bits [1,0] for each value to be compared. As shown in FIG. 24, for each comparison, three two-bit slices are compared using two comparators, such as a first comparator to compare a with b, and a second comparator to compare b with c. As shown, the result of either comparison is returned for the next comparison if the bit slices are equal. Otherwise, one of the bit slices (c in the illustrated example) is returned.

In some embodiments, a subset of the values in the input data are selected for the mode approximation algorithm 2500. In some embodiments, the number of values to be compared are selected to enable searching utilizing the comparisons available in the hierarchy of comparisons. In level 2510 there are a total of 28 sets of three 2-bit slices for comparison, which represents bit slices for 81 (27×3) of the 128 values. For efficiency of operation, including enabling parallel processing of all or part of each level of the algorithm, a reduced 81 of the 128 values are utilized for comparison. In some embodiments, the values to be selected for comparison are spread through the full set of values. In the example illustrated in FIG. 25, this is accomplished by choosing a value $a_i$ beginning at a first index i, a value $b_i$ beginning at a second index i+42, and a value $c_i$ beginning at a first index i+84. However, embodiments are not limited to these particular selections.

FIG. 25 specifically illustrates comparisons for a first set of two bits [1,0] for each value to be compared, resulting in the Final [1,0] value in the level 2550, wherein there will also be comparisons for each of the other bit slices result in Final [3,2], Final [5,4], and Final [7,6] values to be concatenated into Final Mode [7,0] 2560.

Upon generation of the Final Mode [7,0] 2560, a compressed data value 2570 is generated, which may be as illustrated in FIG. 23. As shown in FIG. 25, the compressed data value 2570 includes a significance map [127:0] with each bit in the significance map to indicate whether a corresponding 8-bit value in the input data value 2505 is equal to the identified mode; the identified mode value [135:128]; and the uncompressible data [511:135]. As indicated in FIG. 25, values that are not equal to the mode are placed in the uncompressible data in the original order, and, for the particular implementation illustrated in FIG. 25, the compression will fail if more than 47 values of the data input 2505 are not equal to the mode.

Figure 26:
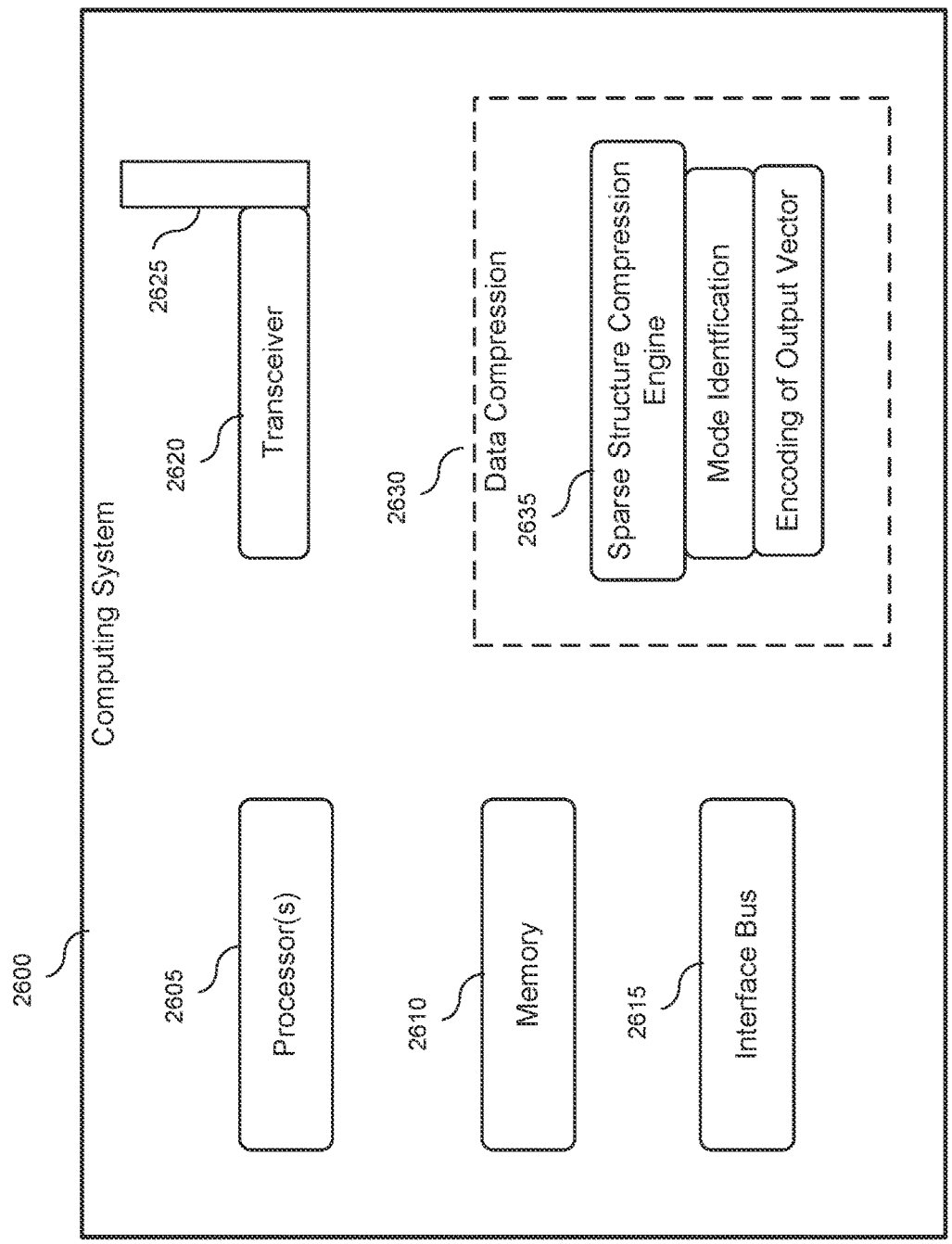
FIG. 26 is an illustration of an apparatus or system to provide for compression for sparse data structures utilizing mode search approximation, according to some embodiments.

FIG. 26 is an illustration of an apparatus or system to provide for compression for sparse data structures utilizing mode search approximation, according to some embodiments. As illustrated in FIG. 26, a computing system 2600, such as, for example, system 100 illustrated in FIG. 1, includes one or more processors 2605 for the processing of data, such as processors 102 including graphics processor(s) 108 as shown in FIG. 1. The computing system 2600 further includes memory 2610 for the storage of data and one or more elements for the transfer of data, such as interface bus 2615 and transceiver 2620. In some embodiments, the transceiver 2620 is a wireless transceiver with one or more antennas 2625 for transmission and reception of data, wherein the antennas 2625 may include a dipole antenna or other antenna structures.

In some embodiments, the computing system 2600 further includes a data compression mechanism 2630 to perform compression, including a sparse structure compression engine 2635 to provide compression of sparse data structures, the sparse data structures for compression including, but are not limited to, machine learning values. In some embodiments, the sparse structure sparse structure compression engine 2635 provides for mode identification, in which a mode (most repeated value) in the incoming data is identified, the identification of the mode utilizing a highly efficient approximation operation to provide for rapid computation of the mode, and encoding of and output vector, in such a significance map, mode, and remaining uncompressed data and mode value are encoded into a single outgoing vector of predetermined size. The sparse structure compression engine 2635 may provide compression and decompression operations as illustrated in FIGS. 20-25.

In some embodiments, an apparatus includes one or more processors including a graphics processor to process data; and a memory for storage of data, including compressed data, wherein the one or more processors are to provide for compression of a data structure, including identification of a mode in the data structure, the data structure including a plurality of values and the mode being a most repeated value in a data structure, wherein identification of the mode includes application of a mode approximation operation, and encoding of an output vector to include the identified mode, a significance map to indicate locations at which the mode is present in the data structure, and remaining uncompressed data from the data structure.

In some embodiments, the mode approximation operation includes a hierarchy of comparison levels, each comparison level of the hierarchy of comparison levels including one or more comparisons of at least a portion of two or more values of the plurality of values.

In some embodiments, each comparison level of the hierarchy of comparison levels includes one or more ternary comparisons between a first bit slice from a first value of the plurality of values, a second bit slice from a second value of the plurality of values, and a third bit slice from a third value of the plurality of values.

In some embodiments, each ternary comparison of the one or more ternary comparisons includes: comparing the first bit slice to the second bit slice and returning the first bit slice if the first bit slice and the second bit slice match; comparing the second bit slice to the third bit slice and returning the second bit slice if the second bit slice and the third bit slice match; and returning one of the first, second, and third bit slices if the first bit slice and the second bit slice do not match and the second bit slice and the third bit slice do not match.

In some embodiments, each bit slice includes two bits.

In some embodiments, the mode approximation operation includes comparison of less than all values of the plurality of values.

In some embodiments, the data structure includes 128 8-bit values, and the hierarchy of comparison levels includes 4 levels to compare 81 of the 128 values.

In some embodiments, wherein the significance map includes a plurality of bits, each bit of the plurality of bit representing a respective value of the plurality of values, and wherein a bit that is set indicates that the respective value for the bit contains the mode.

In some embodiments, the remaining uncompressed data includes each value of the plurality of values that does not contain the mode, values within the remaining uncompressed data being stored in order of the values in the data structure.

In some embodiments, the data structure is a data structure for machine learning.

In some embodiments, one or more non-transitory computer-readable storage mediums have stored thereon executable computer program instructions that, when executed by one or more processors, cause the one or more processors to perform operations including: identifying a mode in a data structure, the data structure including a plurality of values and the mode being a most repeated value in a data structure, wherein identification of the mode includes application of a mode approximation algorithm, and encoding of an output vector to include the identified mode, a significance map to indicate locations at which the mode is present in the data structure, and remaining uncompressed data from the data structure.

In some embodiments, the mode approximation algorithm includes a hierarchy of comparison levels, each comparison level including one or more comparisons of at least a portion of two or more values of the plurality of values.

In some embodiments, each comparison level of the hierarchy of comparison levels includes one or more ternary comparisons between a first bit slice from a first value of the plurality of values, a second bit slice from a second value of the plurality of values, and a third bit slice from a third value of the plurality of values.

In some embodiments, each ternary comparison of the one or more ternary comparisons includes: comparing the first bit slice to the second bit slice and returning the first bit slice if the first bit slice and the second bit slice match; comparing the second bit slice to the third bit slice and returning the second bit slice if the second bit slice and the third bit slice match; and returning one of the first, second, and third bit slices if the first bit slice and the second bit slice do not match and the second bit slice and the third bit slice do not match.

In some embodiments, each bit slice includes two bits.

In some embodiments, the mode approximation algorithm includes comparison of less than all values of the plurality of values.

In some embodiments, the significance map includes a plurality of bits, each bit of the plurality of bit representing a respective value of the plurality of values, and wherein a bit that is set indicates that the respective value for the bit contains the mode.

In some embodiments, the remaining uncompressed data includes each value of the plurality of values that does not contain the mode, values within the remaining uncompressed data being stored in order of the values in the data structure.

In some embodiments, the data structure is a data structure for machine learning.

In some embodiments, the one or more mediums include instructions for performing a second compression operation in parallel with the compression operation; and selecting an output vector from either the compression operation or the second compression operation.

In some embodiments, the one or more mediums include instructions for decompressing the encoded output vector, including: parsing the output vector to obtain the significance map, mode, and uncompressed data; and inserting either mode or a next uncompressed data value at each of a plurality of locations based on the significance map.

In some embodiments, an apparatus includes means for identifying a mode in a data structure, the data structure including a plurality of values and the mode being a most repeated value in a data structure, wherein identification of the mode includes application of a mode approximation algorithm, and means for encoding of an output vector to include the identified mode, a significance map to indicate locations at which the mode is present in the data structure, and remaining uncompressed data from the data structure.

In some embodiments, the mode approximation algorithm includes a hierarchy of comparison levels, each comparison level including one or more comparisons of at least a portion of two or more values of the plurality of values.

In some embodiments, each comparison level of the hierarchy of comparison levels includes one or more ternary comparisons between a first bit slice from a first value of the plurality of values, a second bit slice from a second value of the plurality of values, and a third bit slice from a third value of the plurality of values.

In some embodiments, each ternary comparison of the one or more ternary comparisons includes: comparing the first bit slice to the second bit slice and returning the first bit slice if the first bit slice and the second bit slice match; comparing the second bit slice to the third bit slice and returning the second bit slice if the second bit slice and the third bit slice match; and returning one of the first, second, and third bit slices if the first bit slice and the second bit slice do not match and the second bit slice and the third bit slice do not match.

In some embodiments, each bit slice includes two bits.

In some embodiments, the mode approximation algorithm includes comparison of less than all values of the plurality of values.

In some embodiments, the significance map includes a plurality of bits, each bit of the plurality of bit representing a respective value of the plurality of values, and wherein a bit that is set indicates that the respective value for the bit contains the mode.

In some embodiments, the remaining uncompressed data includes each value of the plurality of values that does not contain the mode, values within the remaining uncompressed data being stored in order of the values in the data structure.

In some embodiments, the data structure is a data structure for machine learning.

In some embodiments, the apparatus further includes means for performing a second compression operation in parallel with the compression operation; and means for selecting an output vector from either the compression operation or the second compression operation.

In some embodiments, the apparatus includes means for parsing the output vector to obtain the significance map, mode, and uncompressed data; and means for inserting either mode or a next uncompressed data value at each of a plurality of locations based on the significance map.

In some embodiments, a method includes identifying a mode in a data structure, the data structure including a plurality of values and the mode being a most repeated value in a data structure, wherein identification of the mode includes application of a mode approximation algorithm, and encoding of an output vector to include the identified mode, a significance map to indicate locations at which the mode is present in the data structure, and remaining uncompressed data from the data structure.

In some embodiments, the mode approximation algorithm includes a hierarchy of comparison levels, each comparison level including one or more comparisons of at least a portion of two or more values of the plurality of values.

In some embodiments, each comparison level of the hierarchy of comparison levels includes one or more ternary comparisons between a first bit slice from a first value of the plurality of values, a second bit slice from a second value of the plurality of values, and a third bit slice from a third value of the plurality of values.

In some embodiments, each ternary comparison of the one or more ternary comparisons includes: comparing the first bit slice to the second bit slice and returning the first bit slice if the first bit slice and the second bit slice match; comparing the second bit slice to the third bit slice and returning the second bit slice if the second bit slice and the third bit slice match; and returning one of the first, second, and third bit slices if the first bit slice and the second bit slice do not match and the second bit slice and the third bit slice do not match.

In some embodiments, each bit slice includes two bits.

In some embodiments, the mode approximation algorithm includes comparison of less than all values of the plurality of values.

In some embodiments, the significance map includes a plurality of bits, each bit of the plurality of bit representing a respective value of the plurality of values, and wherein a bit that is set indicates that the respective value for the bit contains the mode.

In some embodiments, the remaining uncompressed data includes each value of the plurality of values that does not contain the mode, values within the remaining uncompressed data being stored in order of the values in the data structure.

In some embodiments, the data structure is a data structure for machine learning.

In some embodiments, the method includes performing a second compression operation in parallel with the compression operation; and selecting an output vector from either the compression operation or the second compression operation.

In some embodiments, the method includes decompressing the encoded output vector, including: parsing the output vector to obtain the significance map, mode, and uncompressed data; and inserting either mode or a next uncompressed data value at each of a plurality of locations based on the significance map.

In some embodiments, a computing system includes one or more processors including a graphics processor to process machine learning data; a dynamic random access memory (DRAM) for storage of data; and a wireless transceiver and dipole antenna for transmission and reception of data, wherein the one or more processors are to provide for compression of a machine learning data structure, including identification of a mode in the data structure, the data structure including a plurality of values and the mode being a most repeated value in a data structure, wherein identification of the mode includes application of a mode approximation operation, and encoding of an output vector to include the identified mode, a significance map to indicate locations at which the mode is present in the data structure, and remaining uncompressed data from the data structure.

In some embodiments, the mode approximation operation includes a hierarchy of comparison levels, each comparison level of the hierarchy of comparison levels including one or more comparisons of at least a portion of two or more values of the plurality of values.

In some embodiments, each comparison level of the hierarchy of comparison levels includes one or more ternary comparisons between a first bit slice from a first value of the plurality of values, a second bit slice from a second value of the plurality of values, and a third bit slice from a third value of the plurality of values.

In some embodiments, the significance map includes a plurality of bits, each bit of the plurality of bit representing a respective value of the plurality of values, and wherein a bit that is set indicates that the respective value for the bit contains the mode.

In some embodiments, the remaining uncompressed data includes each value of the plurality of values that does not contain the mode, values within the remaining uncompressed data being stored in order of the values in the data structure.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer. In some embodiments, a non-transitory computer-readable storage medium has stored thereon data representing sequences of instructions that, when executed by a processor, cause the processor to perform certain operations.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

What is claimed is:

1. An apparatus comprising:
   one or more processors, the one or processors including a graphics processor; and
   a memory for storage of data, including one or more data structures;
   wherein the one or more processors are to process a data structure including a plurality of values, the processing of the data structure including the one or more processors to:
   perform a first compression operation on the data structure, including approximating a most repeated value in the data structure and generating a first output based at least in part on instances of the most repeated value in the data structure;
   perform a second compression operation on the data structure, including performing a delta compression operation to generate a second output; and
   determine whether either the first compression operation or the second compression operation is successful in generating a compressed output, and select either the first output or the second output as a compressed output vector for the data structure based at least in part on the determination of success in generating a compressed output.

2. The apparatus of claim 1, wherein determining whether the first compression operation is successful in generating a compressed output vector is based at least in part on a number of times the most repeated value occurs in the data structure.

3. The apparatus of claim 1, wherein the one or more processors are to perform the first compression operation and the second compression operation in parallel at least in part.

4. The apparatus of claim 1, wherein the first output includes identification of the most repeated value and identification of locations at which the most repeated value is present in the data structure.

5. The apparatus of claim 4, wherein the identification of locations includes a significance map indicating locations in the data structure.

6. The apparatus of claim 4, wherein the first output further includes identification of remaining uncompressed data from the data structure that does not contain the most repeated value.

7. The apparatus of claim 4, wherein the one or more processors are further to perform decompression of the first output, including at least:
  obtaining the most repeated value from the first output; and
  inserting the most repeated value at each of a plurality of locations of a decompressed data structure based on the identified locations of the most repeated value in the data structure.

8. The apparatus of claim 1, wherein the approximating the most repeated value includes a search that processes less than all values in the data structure.

9. The apparatus of claim 1, wherein the data structure is a sparse data structure for machine learning.

10. A method comprising:
  performing a first compression operation on a data structure, the data structure including a plurality of values, the first compression operation including approximating a most repeated value in the data structure and generating a first output based at least in part on instances of the most repeated value in the data structure;
  performing a second compression operation on the data structure, the second compression operation including performing a delta compression operation to generate a second output; and
  determining whether either the first compression operation or the second compression operation is successful in generating a compressed output, and selecting either the first output or the second output as a compressed output vector for the data structure based at least in part on the determination of success in generating a compressed output.

11. The method of claim 10, wherein determining whether the first compression operation is successful in generating a compressed output vector is based at least in part on a number of times the most repeated value occurs in the data structure.

12. The method of claim 10, wherein performing the first compression operation and the second compression operation includes performing the first compression operation and the second compression operation in parallel at least in part.

13. The method of claim 10, wherein the first output includes identification of the most repeated value and identification of locations at which the most repeated value is present in the data structure.

14. The method of claim 13, wherein the identification of locations includes a significance map indicating locations in the data structure.

15. The method of claim 13, wherein the first output further includes identification of remaining uncompressed data from the data structure that does not contain the most repeated value.

16. The method of claim 13, further comprising performing decompression of the first output, including at least:
  obtaining the most repeated value from the first output; and
  inserting the most repeated value at each of a plurality of locations of a decompressed data structure based on the identified locations of the most repeated value in the data structure.

17. One or more non-transitory computer-readable storage mediums having stored thereon executable computer program instructions that, when executed by one or more processors, cause the one or more processors to perform operations comprising:
  performing a first compression operation on a data structure, the data structure including a plurality of values, the first compression operation including approximating a most repeated value in the data structure and generating a first output based at least in part on instances of the most repeated value in the data structure;
  performing a second compression operation on the data structure, the second compression operation including performing a delta compression operation to generate a second output; and
  determining whether either the first compression operation or the second compression operation is successful in generating a compressed output, and selecting either the first output or the second output as a compressed output vector for the data structure based at least in part on the determination of success in generating a compressed output.

18. The one or more storage mediums of claim 17, wherein determining whether the first compression operation is successful in generating a compressed output vector is based at least in part on a number of times the most repeated value occurs in the data structure.

19. The one or more storage mediums of claim 17, wherein the first output includes identification of the most repeated value and identification of locations at which the most repeated value is present in the data structure.

20. The one or more storage mediums of claim 19, wherein:
  the identification of locations includes a significance map indicating locations in the data structure; and
  the first output further includes identification of remaining uncompressed data from the data structure that does not contain the most repeated value.

* * * * *